(12) United States Patent
Shimizu

(10) Patent No.: US 7,323,661 B2
(45) Date of Patent: Jan. 29, 2008

(54) HEAT TREATMENT APPARATUS USING A LAMP FOR RAPIDLY AND UNIFORMLY HEATING A WAFER

(75) Inventor: Masahiro Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 110 days.

(21) Appl. No.: 11/313,759

(22) Filed: Dec. 22, 2005

(65) Prior Publication Data

US 2006/0098963 A1    May 11, 2006

Related U.S. Application Data

(62) Division of application No. 10/085,092, filed on Mar. 1, 2002, now Pat. No. 7,075,037.

(30) Foreign Application Priority Data

| Mar. 2, 2001 | (JP) | ............................ 2001-058266 |
| Mar. 2, 2001 | (JP) | ............................ 2001-059296 |
| Mar. 14, 2001 | (JP) | ............................ 2001-071548 |
| Mar. 14, 2001 | (JP) | ............................ 2001-072317 |

(51) Int. Cl.
*F27B 5/14* (2006.01)
*A21B 2/00* (2006.01)

(52) U.S. Cl. ...................... 219/390; 292/416

(58) Field of Classification Search ................ 219/390, 219/405, 411; 118/724, 725; 392/416, 418
See application file for complete search history.

(56) References Cited

U.S. PATENT DOCUMENTS

| 2,523,033 | A | * | 9/1950 | Leighton | .................... 313/274 |
| 4,442,374 | A | * | 4/1984 | Morris et al. | ................ 313/316 |
| 6,072,160 | A | * | 6/2000 | Bahl | ........................... 219/405 |
| 6,232,580 | B1 | | 5/2001 | Sandhu | |
| 6,518,547 | B2 | * | 2/2003 | Takahashi et al. | .......... 219/390 |

* cited by examiner

*Primary Examiner*—Sang Paik
(74) *Attorney, Agent, or Firm*—Finnegan, Henderson, Farabow, Garrett & Dunner, LLP

(57) ABSTRACT

A heat treatment apparatus enables a rapid temperature rise of an object to be processed while giving an excellent economical efficiency. A heating unit heats an object to be heated by irradiating a light onto the object. A plurality of lamps are provided in a lamp house. The lamps include at least one first lamp and a plurality of second lamps each having an irradiation area smaller than that of the first lamp. The lamp house has a first lamp accommodation part at a center thereof and a second lamp accommodation part surrounding the first lamp accommodation part so that the first lamp accommodation part accommodates the first lamp and the second lamp accommodation part accommodates the second lamps.

9 Claims, 36 Drawing Sheets

HEAT TREATMENT APPARATUS USING A LAMP FOR RAPIDLY AND UNIFORMLY HEATING A WAFER

This application is a divisional application of U.S. patent application Ser. No. 10/085,092, filed on Mar. 1, 2002, now U.S. Pat. No. 7,075,037 the subject matter of which is incorporated herein by reference.

BACKGROUND OF THE INVENTION

1. Field of the Invention

The present invention generally relates to heat treatment apparatuses and more particularly to a heat treatment apparatus which performs an anneal process or a chemical vapor deposition (CVD) process by heating an object to be processed, such as a single crystalline substrate or a glass substrate, with a lamp and a quartz window used for such a heat treatment apparatus. The present invention is suitable for a rapid thermal processing (RTP: Rapid Thermal Processing) used for manufacturing semiconductor devices, such as a memory or an integrated circuit (IC). The rapid thermal processing (RTP) includes rapid thermal annealing (RTA), rapid thermal cleaning (RTC), rapid thermal chemical vapor deposition (RTCVD), rapid thermal oxidization (RTO) and rapid thermal nitriding (RTN).

2. Description of the Related Art

Generally, in order to manufacture a semiconductor integrated circuit, various kinds of heat treatment, such as a film deposition process, an anneal process, an oxidization diffusion process, a sputtering process, an etching process and a nitriding processing may be repeatedly performed on a silicon substrate such as a semiconductor wafer a plurality of times.

Since yield rate and quality of semiconductor manufacturing processes can be improved, the RTP technology to rise and drop the temperature of the wafer (object to he processed) has attracted attention. A conventional RTP apparatus generally comprises: a single-wafer chamber (process chamber) for accommodating an object to be processed (for example, a semiconductor wafer, a glass substrate for photograph masks, a glass substrate for a liquid-crystal display or a substrate for optical discs); a reflector (reflective board) arranged at the opposite side of the object to be processed with respect to a quartz window arranged in the interior of the process chamber; and a heating lamp (for example, halogen lamp) arranged at an upper part or above the quartz window, and the lamp.

The reflector is made of aluminum, and gold plating is given to a reflective part thereof. A cooling mechanism such as a cooling pipe is provided so as to prevent temperature breakage of the reflector (for example, exfoliation of gold plating due to a high temperature). The cooling mechanism is provided so as to prevent the reflector from being an obstacle of cooling the object to be processed at the time of cooling. The rapid temperature rising demanded for the RTP technology is dependent on the directivity of the optical irradiation to the object to be processed and the power density of the lamp.

The quartz window may be in the shape of a board, or can be in the form of tube which can accommodate the object to be processed. When maintaining a negative pressure environment in the process chamber by evacuating gasses in the process chamber by a vacuum pump, a thickness of the quartz window is set to, for example, about 30 to 40 mm so as to maintain the pressure difference between the internal pressure and the atmospheric pressure. The quartz window may be formed in a curved shape having a reduced thickness so as to prevent generation of a thermal stress due to temperature difference generated by a temperature rise.

A plurality of halogen lamps are arranged so as to uniformly heat the object to be processed. The reflector reflects the infrared rays irradiated from the halogen lamps toward the object to be processed. The process chamber is typically provided with a gate valve on a sidewall thereof so as to carry in and out the object to be processed. Moreover, a gas supply nozzle, which introduces a process gas used for heat treatment, is connected to the sidewall of the process chamber.

The temperature of the object to be processed affects the quality of process such as, for example, a thickness of a film in a film deposition process, etc. For this reason, it is necessary to know the correct temperature of the object to be processed. In order to attain high-speed heating and high-speed cooling, a temperature measuring device which measures the temperature of the object to be processed is provided in the process chamber. The temperature measuring device may be constituted by a thermocouple. However, since it is necessary to bring the thermocouple into contact with the object to be processed, there is a possibility that the processed body is polluted with the metal which constitutes the thermocouple. Therefore, there is proposed a payro meter as a temperature measuring device which detects an infrared intensity emitted and computes a temperature of an object to be processed from the back side thereof based on the detected infrared intensity. The payro meter computes the temperature of the object to be processed by carrying out a temperature conversion by an emissivity of the object to be processed according to the following expression:

$$E_m(T) = \epsilon E_{BB}(T) \tag{1}$$

where, $E_{BB}(T)$ expresses a radiation intensity from a black body having the temperature T; $E_m(T)$ expresses a radiation intensity measured from the object to be processed having the temperature T; $\epsilon$ expresses a rate of radiation of the object to be processed.

In operation, the object to be processed is introduced into the process chamber through the gate valve. The peripheral portion of the object to be processed is supported by a holder. At the time of heat treatment, process gases such as nitrogen gas and oxygen gas, are introduced into the process chamber through the gas supply nozzle. On the other hand, the infrared ray irradiated from the halogen lamps is absorbed by the object to be processed, thereby, rising the temperature of the object to be processed.

Recently, a demand for a rapid temperature rise of RTP has been increased so as to achieve a high-quality process of an object to be processed and improve a throughput. For example, there is a demand for increasing a temperature rising rate from 90 degrees/sec to 250 degrees/sec.

A support ring on which an object to be processed such as a silicone substrate is placed is formed of ceramics (for example, SiC) having excellent heat resistance. There is a difference in heat capacity between the support ring and the silicon substrate, which results in a difference in temperature rise. For this reason, the temperature rising rate of a periphery of the object to be processed, which periphery contact with the support ring, is smaller than that of the center of the object to be processed. Thus, there is a problem in that it is difficult to carry out a rapid and uniform temperature rise over the entire surface of the object to be processed. As measures for solving such a problem, the present inventors made a study on heating the periphery of the object to be processed by a larger power than that applied to the center of the object. Additionally, the reflector also deteriorates due to heating with a large power. However, a high-output lamp has a service life shorter than a low-output lamp. Similarly, the reflector for high-output lamps also has a service life shorter than the reflector for low-output lamps. Consequently, in order to exchange the life-expired lamps and reflectors located in the periphery of a lamp house, the whole lamp house including the lamps and reflectors located in the center of the lamp house, which are still usable, must be exchanged simultaneously, which results in uneconomical operation.

A rapid temperature rise depends on a power density of a lamp and a directivity of the optical irradiation from the lamp to an object to be processed. In the case of a single end lamp 2, which has only one electrode part 3 like the conventional lamp, an illuminant (coil 4 in the figure) of the lamp 2 is perpendicularly formed to the object to be processed, as shown in FIG. 1. Here, FIG. 1 is an illustrative cross-sectional view showing the shape of the conventional lamp. Since the coil 4 projects a light in a direction perpendicular to the axial center of the coil 4 concerned, it is impossible for the lamp 2 alone to control the directivity. Conventionally, The directivity of the lamp 2 is obtained by providing a cylindrical reflector 5 or reflective film around the lamp 2 so as to cover the lamp 2. However, the reflector 5 and the reflective film cannot reflect light 100%. Therefore, the light is absorbed or diffused to some extent, and there is a problem in that the energy of the lamp light decreases. Since the reflection takes place a plurality of times at the reflector 5 and the reflective surface, the power density of the light irradiated onto the object to be processed may become less than one half of the light at the time of projection. On the other hand, it can be considered to increase the density of power reaching the object to be processed by increasing the electric power supplied to the lamp 2. However, such an approach causes an increase in the power consumption, which is not economically preferable. Therefore, conventionally, even if the energy of the lamp light decreases, the reflector 5 or the reflective film had to be used so as to obtain a desired directivity of the lamp 2.

SUMMARY OF THE INVENTION

It is a general object of the present invention to provide an improved and useful heat treatment apparatus in which the above-mentioned problems are eliminated.

A more specific object of the present invention is to provide a heating unit, a heat treatment apparatus and a lamp used as a heat source of the heat treatment apparatus, which enable a rapid temperature rise of an object to be processed while giving an excellent economical efficiency.

Another object of the present invention is to provide a reflector-equipped lamp, which can project a light emitted by an illuminant preferably within one reflection so as to improve a directivity and power density of the projected light.

A further object of the present invention is to provide a lamp having an excellent directivity without a reflector.

In order to achieve the above-mentioned objects, there is provided according to one aspect of the present invention a heating unit for heating an object to be heated by irradiating a light onto the object, the heating unit comprising: a plurality of lamps including at least one first lamp and a plurality of second lamps each having an irradiation area smaller than that of the first lamp; and a lamp house having a first lamp accommodation part at a center thereof and a second lamp accommodation part surrounding the first lamp accommodation part so that the first lamp accommodation part accommodates the first lamp and the second lamp accommodation part accommodates the second lamps.

In the heating unit according to the above-mentioned invention, each of the second lamps generates an irradiation energy per unit length greater than an irradiation energy per unit length of the first lamp. A number of the second lamps per unit area may be greater than a number of the first lamps per unit area. The lamps may be detachably attached to the first and second lamp accommodating parts, respectively. Each of the lamps may have a reflective part that reflects a light emitted by an illuminant thereof. Each of the lamps may have a threaded part on a side surface thereof, and each of the first and second lamp accommodation parts may have a threaded part engageable with the treaded part of each of the lamps. Each of the first and second lamp accommodation parts may have a plurality of plates attached to an inner surface thereof so that the plates are located between the inner surface and each of the lamps, thereby holding each of the lamps by elastic deformation of the plates.

Additionally, there is provided according to another aspect of the present invention a heat treatment apparatus for applying a heat treatment to an object to be processed, the heat treatment apparatus comprising: a support member on which the object to be processed is placed; and a heating unit located above the support member so as to irradiate a light onto the object to be processed placed on the support member, wherein the heating unit comprising: a plurality of lamps including at least one first lamp and a plurality of second lamps each having an irradiation area smaller than that of the first lamp; and a lamp house having a first lamp accommodation part at a center thereof and a second lamp accommodation part surrounding the first lamp accommodation part so that the first lamp accommodation part accommodates the first lamp and the second lamp accommodation part accommodates the second lamps.

According to the above-mentioned invention, the first lamp having a large irradiation area is located in the center of the lamp house and the second lamps having a smaller irradiation area than the first lamp are located around the first lamp. Therefore, the central part of the object to be processed can be irradiated with a large irradiation area, and the periphery of the object to be processed can be irradiated with a small irradiation area. Moreover, the irradiation energy per unit area of the second lamps can also be raised. Thereby, the periphery of the object to be processed can be heated intensively. Moreover, such an action will become more remarkable by making the number of the first lamps per unit area greater than the number of second lamps per unit area. Furthermore, only a degraded lamp can be easily removed and replaced with a new one by making the lamps individually detachable from the lamp support part. That is, there is no need to remove the lamps that are still usable. Moreover, there is no need to replace a whole lamp support part, and only a degraded lamp can be replaced.

Moreover, the heat treatment apparatus according to the above-mentioned invention has the heating unit mentioned above, and, therefore, provides the same effects. Specifically, a narrow area of the periphery of the object to be processed, which area contacts a support ring and has a low temperature rise rate, can be efficiently irradiated by the second lamps. Moreover, the center and periphery of the object to be processed can be uniformly heated by increasing the irradiation energy of the second lamps or increasing the number of the second lamps per unit area. Furthermore, only a degraded lamp can be easily removed and replaced with a new one by making the lamps individually detachable from the lamp support part. That is, there is no need to remove the lamps that are still usable. Moreover, there is no need to replace a whole lamp support part, and only a degraded lamp can be replaced. Accordingly, a high-quality heat treatment can be applied to the object to be processed, and a high-quality object can be produced. Therefore, the maintenance-ability of the heat treatment apparatus can be improved.

Additionally, there is provided according to another aspect of the present invention a lamp applicable to a heat source for heating an object to be processed, the lamp comprising: an electrode part to which an electric power is supplied; a pair of first filaments connected to the electrode part; a second filament connected to the first filaments and having a diameter smaller than a diameter of each of the first filaments, wherein the second filament is configured and arranged to serve as a surface illuminant with respect to the object to be processed.

In the lamp according to the above-mentioned invention, the surface illuminant may be parallel to the object to be processed. The surface illuminant may have a convex shape protruding in a direction away from the object to be processed. The surface illuminant may have a polygonal shape or a circular shape when viewed from the object to be processed. The lamp according to the present invention may further comprise a shield part that reflects a light emitted by the second filament, the shield part being located on a side opposite to the object to be processed with respect to the second filament. The second filament may include a first part facing the object to be processed and a second part farther from the object to be processed than the first part, and the first part may have a work function lower than a work function of the second part. The first part may have a cover film made of a material having a work function lower than a work function of a material of the second filament. The second filament may be made of tungsten, and the cover film is made of thorium. The second filament may be made of a material selected from a group consisting of platinum, connel alloy, tungsten and nickel, and the cover film is made of a material selected from a group consisting of barium oxide, strontium oxide and calcium oxide.

Additionally, there is provided according to another aspect of the present invention a heat treatment apparatus for applying a heat treatment to an object to be processed, the heat treatment apparatus comprising: a support member on which the object to be processed is placed; and a plurality of lamps located above the support member for heating the object to be processed, each of the lamps comprising: an electrode part to which an electric power is supplied; a pair of first filaments connected to the electrode part; a second filament connected to the first filaments and having a diameter smaller than a diameter of each of the first filaments, wherein the second filament is configured and arranged to serve as a surface illuminant with respect to the object to be processed.

According to the above-mentioned invention, when an electrical power is supplied to the first and second filaments from the electrode part, an amount of heat generated per unit length of the second filament is larger than the first filament. Therefore, the second filament emits light earlier than a first filament. Moreover, since the amount of heat generated per unit length of the first filaments and the second filament differ from each other, only the second filament can emit a light. Therefore, only the second filament can be made to emit a light with a smaller electric power than a conventional lamp in which the first and second filaments are formed a wire having the same diameter.

Furthermore, the second filament serves as an illuminant having a large area by arranging the second filament in the form of a surface. When such a lamp is seen from the projection face at the time of luminescence of the lamp, the illuminant can be regarded as a surface illuminant. Moreover, the light projected from the side which faces the object to be processed is directly irradiated onto the object to be processed. Moreover, when a plurality of filament coils are provided in the lamp, the light projected from one coil overlaps with the light projected from the adjacent coils, which increases an energy projected from the lamp. With this state, the light projected from the lamp provides a sufficient directivity. Therefore, reflective means such as a reflector for obtaining a good directivity, is not needed. Such a surface illuminant can be achieved by forming the second filament by a plurality of coils arranged in parallel or in series.

Moreover, the shield part shields the light traveling in a direction opposite to the object to be processed, and contributes to convert the light into a light-emitting energy. Moreover, since the first part of the second filament tends to emit light easily, only the first part to which a thorium film having a low work function is applied emits a light when an electric power is applied to the second filament. Therefore, in the lamp according to the present invention, the supplied energy contributes only to luminescence of the first part. Therefore, 100% of the supplied energy can be used only for a light-emitting energy projected from the first part. Therefore, a light having a high energy can be irradiated onto the object to be processed.

Additionally, there is provided according to another aspect of the present invention a lamp adapted to be used as a heat source for heating an object to be heated, the lamp comprising: an illuminant generating a light; a light-emitting part having an inner surface covering the illuminant and an projection face through which the light generated by the illuminant is projected, the inner surface having a hemi-spherical shape or a circular cone shape; and a reflective part provided to the inner surface of the light-emitting part so as to reflect the light generated and emitted by the illuminant.

In the lamp according to the above-mentioned invention, the illuminant may be positioned so as to emit the light to travel in a direction perpendicular to the projection face. The lamp according to the present invention may further comprise an electrode part to which an electric power is supplied and connected to the light-emitting part, wherein the illuminant comprises a filament coil electrically connected to the electrode part and the filament coil is positioned parallel to the projection face. Additionally, the illuminant may be configured and arranged to be a surface light-source when the lamp is viewed in a direction perpendicular to the projection face. The reflective part may include a reflective film provided on the inner surface of the light-emitting part. The reflective film may be made of a plated gold film.

Additionally, there is provided according to another aspect of the present invention a heat treatment apparatus for applying a heat treatment to an object to be processed, the heat treatment apparatus comprising: a support member on which the object to be processed is placed; and a plurality of lamps located above the support member for heating the object to be processed, each of the lamps comprising: an illuminant generating a light; a light-emitting part having an inner surface covering the illuminant and an projection face through which the light generated by the illuminant is projected, the inner surface having a hemispherical shape or a circular cone shape; and a reflective part provided to the inner surface of the light-emitting part so as to reflect the light generated and emitted by the illuminant.

According to the above-mentioned invention, the lamp can efficiently project a light emitted by the illuminant with a single reflection by the reflective part, which is provided to the inner surface formed in a hemisphere or a circular cone configuration. Moreover, the configuration of the inner surface and the reflective part act to converge the light emitted by the illuminant, which improves the directivity of the lamp. Furthermore, the light emitted by the illuminant travels in a direction perpendicular to the object to be processed. That is, the light traveling toward the object to be processed is directly irradiated onto the object to be processed, and other lights travels toward the reflective part.

The configuration of the reflective part is the same as the inner surface of the light-emitting part, and the reflective part efficiently reflects the light toward the object to be processed preferably with one time reflection. Therefore, the light emitted by the illuminant can be irradiated onto the object to be processed with no reflection or one time reflection. That is, since the lamp according to the present invention has less number of times of reflection by the reflective part than the conventional lamp, the light projected through the projection face is has less energy loss and excellent in directivity.

In addition, it is possible to reduce a reflective loss by providing a high reflectance film, such as a plated gold film, on the light reflecting surface of the reflective part. Such a structure raises the projection energy of the lamp and enables power-saving of the lamp. Furthermore, the projection energy of the lamp can be raised since the illuminant of the lamp has the configuration regarded as a surface illuminant, which can be achieved by arranging a plurality of filament coils in parallel.

The heat treatment apparatus according to the above-mentioned invention has the same effect as the above-mentioned lamp, and facilitates a rapid temperature rise of the object to be processed. Therefore, since the heat treatment apparatus according to the present invention is excellent in the energy efficiency and directivity of the lamp, the irradiation efficiency can be improved and a rapid temperature rise can be attained with a low power consumption.

Additionally, there is provided according to another aspect of the present invention a lamp for heating an object to be processed, the lamp being configured and arranged to be supported and cooled by a lamp support part, the lamp comprising: a light-emitting part emitting a light so as to heat the object to be processed; and a reflector reflecting the light emitted by the light-emitting part toward the object to be processed, wherein the light-emitting part and the reflector are detachably attached to the lamp support part.

In the lamp according to the above-mentioned invention, the reflector may be configured and arranged to be attached to the lamp support part and separable from the light-emitting part. The reflector may have a hemispherical shape or a circular cone shape. The reflector may comprise an aluminum body and a reflective film formed on a surface facing the light-emitting part, the reflective film including a nickel layer and a gold layer or a nickel layer, a gold layer, a rhodium layer and a gold layer provided on the surface of the aluminum body sequentially in that order. The reflector may be configured to reflect an infrared light and a visible light.

Additionally, there is provided according to another aspect of the present invention a heat treatment apparatus for applying a heat treatment to an object to be processed, the heat treatment apparatus comprising: a support member on which the object to be processed is placed; a lamp support part located above the support member; and a lamp attached to the lamp support part for heating the object to be processed, the lamp comprising: a light-emitting part emitting a light so as to heat the object to be processed; and a reflector reflecting the light emitted by the light-emitting part toward the object to be processed, wherein the light-emitting part and the reflector are detachably attached to the lamp support part.

In the heat treatment apparatus according to the above-mentioned invention, the reflector may be configured and arranged to be attached to the lamp support part and separable from the light-emitting part. The reflector may have a hemispherical shape or a circular cone shape. The heat treatment apparatus according to the present invention may further comprise an electrode part to which an electric power is supplied and connected to the light-emitting part, wherein the lamp support part comprises: a first cooling part for cooling the reflector and the light-emitting part; and a second cooling part for cooling the electrode part. The heat treatment apparatus according to the present invention may further comprise an electrode part to which an electric power is supplied and connected to the light-emitting part, wherein the electric power supplied to the electrode part differs depending on positions corresponding to the object to be processed. The light-emitting part may have reflecting means for reflecting the light toward the object to be processed. The reflector and the reflecting means together may form a hemispheric shape of a circular cone shape.

According to the above-mentioned invention, the light-emitting part and the reflector is individually and detachably attached to the lamp support part. Thus, only the light-emitting part and the reflector that are degraded can be easily replaced. Further, there is no need to replace the entire lamp support part, which includes usable light-emitting parts and usable reflectors, when replacing a degraded light-emitting part or a degraded reflector, which provides an economic way. Moreover, since the light-emitting part and the reflector are individually replaceable, the replacement work is not complicated.

The heat treatment apparatus according to the above-mentioned invention has the lamp mentioned above, and provides the same effects. Furthermore, the heat treatment apparatus according to the present invention has the first cooling part, which cools the light-emitting part and the reflector, and the second cooling part, which cools the electrode part to which an electric power is supplied. For this reason, the light-emitting part and the reflector, and the electrode part can be individually cooled at their optimal temperatures. Therefore, degradation of the light-emitting part and the reflector, or the electrode part can be prevented effectively.

Moreover, for example, it is possible to supply a larger electric power to the electrode part connected to the light-emitting part corresponding to the periphery (part into which temperature cannot rise easily) of the object to be processed than the electrode part connected to the light-emitting part corresponding to the central part of the object to be processed. In addition, although the light-emitting part and the reflector of a high output may have a shorter service-life than the light-emitting part and the reflector of a low output, the light-emitting part and the reflector can be individually replaced by being detached from the lamp support part.

Other objects, features and advantages of the present invention will become more apparent from the following detailed description when read in conjunction with the accompanying drawings.

DETAILED DESCRIPTION OF THE PREFERRED EMBODIMENTS

First Embodiment

Figure 2:
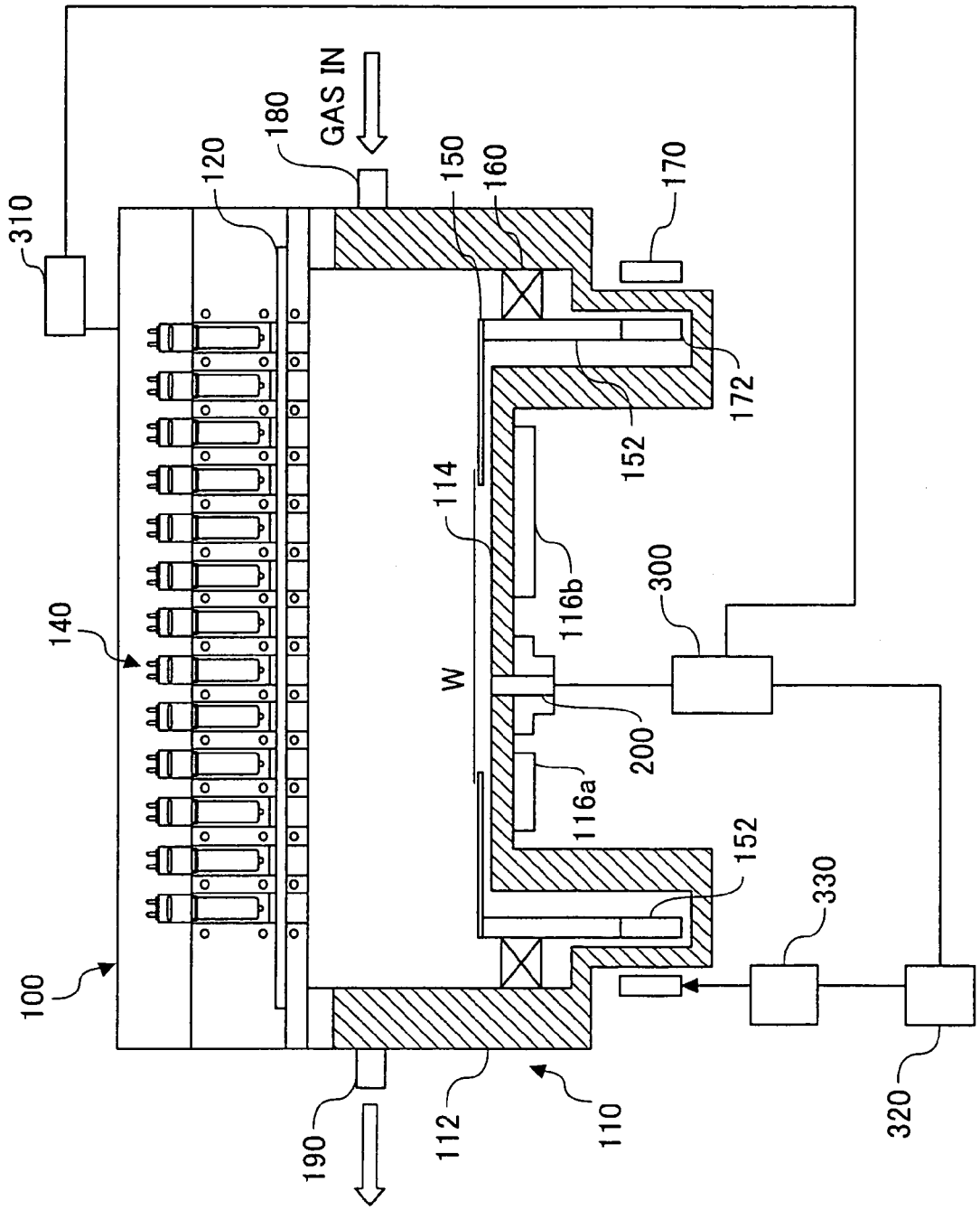
FIG. 2 is a cross-sectional view of a heat treatment apparatus according to a first embodiment of the present invention.

A description will now be given of a first embodiment of the present invention. FIG. 2 is a cross-sectional view of a heat treatment apparatus according to the first embodiment of the present invention.

As shown in FIG. 2, the heat treatment apparatus 100 generally comprises a process chamber 110, a quartz window (light-transmitting window) 120, a heating unit 140, a support ring 150, a gearing 160, a permanent magnet 170 a gas introducing part 180, an exhausting part 190, a radiation thermometer 200 and a control part 300. It should be noted that the heating unit 140 and lamps provided in the heating unit 140 are illustrated in simplified forms.

The process chamber 110 is formed of stainless steel or aluminum. The quartz window 120 is connected to a top of the process chamber 110. The sidewall of the process chamber 110 and the quartz window 12 define a process space in which an object W to be processed (semiconductor wafer: hereinafter referred to as a wafer W) is subjected to a heat treatment. The support ring 150 on which the wafer W is placed and a support part 152 connected to the support ring 150 are arranged in the process space. The process space is maintained to be a predetermined negative pressure by the exhaust part 190. The wafer W is carried in or out from the process chamber 110 through a gate valve (not shown in the figure) provided to the sidewall of the process chamber 110.

A bottom part 114 of the process chamber 110 is connected to a cooling pipes 116a and 116b (hereinafter simply referred to as cooling pipe 116) so that the bottom part 114 serves as a cooling plate. If necessary, the cooling plate 114 may be provided with a temperature control arrangement. The temperature control arrangement may comprise a control part 300, a temperature sensor and a heater. A cooling water is supplied to the temperature control arrangement from a water supply source such as a water line. A coolant such as alcohol, gurden or flon may be used instead of the cooling water. As for the temperature sensor, a known sensor such as a PTC thermister, an infrared sensor, a thermocouple, etc. may be used. The heater can be a line heater wound on the outer surface of cooling pipe 116. The temperature of the cooling water flowing through the cooling pipe 116 can be adjusted by controlling an electric current flowing through the line heater.

The quartz window 120 is attached to the process chamber in an airtight manner so as to maintain the negative pressure environment inside the process chamber 110 and transmit a heat radiation light emitted from the lamps of the heating unit 140. The window 120 is formed of transparent ceramics in the form of a cylindrical plate 121 having a diameter of about 400 mm and a thickness ranging from of 5 mm to 10 mm, for example, 5 mm. In the present embodiment, the transparent ceramics forming the plate 121 is not limited to but $Al_2O_3$.

Ceramics is a polycrystalline substance obtained by sintering a raw-material powder. Generally, the fine structure of the ceramics consists of precipitates and a pores (holes) besides crystal grains and grain boundaries. Although the ceramics is opaque fundamentally, a transparent ceramics can be made by changing the fine structure by controlling the sintering process, the raw-material powder and additives. Generally, the transparent ceramics is referred to as a translucent ceramics. Pores, precipitates, etc. hardly exist in the fine structure of the translucent ceramics which consists of grain boundaries only. Thereby, a light passing through inside the translucent ceramics has almost no loss of energy due to substances, and is capable of passing through the material without being diffused, which provides translucency. On the other hand, an optical energy absorption phenomenon according to the electron transition in a material is one of the factors that provide translucency. Materials having no cause of the absorption phenomenon within a desired wavelength area can be the object of making ceramics translucent. It should be noted that the translucent ceramics can be made by any techniques in the art, and a description thereof is omitted in the present specification.

Since a high temperature strength of the translucent ceramics is large, and the porosity of a sintered material is almost zero, the translucent ceramics has features such that a flat and smooth surface is obtained and gas is not discharged. It should be noted that the translucent ceramics suitable for the plate 121 used in the present embodiment has the following further characteristics. First, the wavelength dependency of transmission rate is equal to or greater than that of quartz. For example, quartz passes 80% to 90% of light having a wavelength of 0.3 μm to 2.5 μm. Second, the maximum bending stress ($\sigma_{MAX}$=68 MPa) exceeds that of quartz. Third, the heat conductivity is superior to the heat conductivity (1.4 to 1.9 W/mK) of quartz. Fourth, easy to manufacture.

The plate 121 is the translucent ceramics made from $Al_2O_3$ as mentioned above, and shows 80% or more of a transmission rate in the wave-length range from 3.5 to 6.0 micrometers on the plate 121 having a thickness of 5 mm. Moreover, the maximum bending stress ($\sigma_{MAX}$) of $Al_2O_3$ is 500 MPa, which is far greater than that of quartz. Therefore, the plate 121 does not need to be formed in a domal shape which curves in a direction to be separated from the process chamber 110 as in the conventional apparatus, and can have a flat-surface configuration. Although the quartz window formed in a domal shape has a problem of deteriorating a directivity of a lamp since it increases a distance between an object to be processed and the lamp, the present embodiment solves such a problem.

In a disk plate of equally distributed load (p), The maximum bending stress ($\sigma_{MAX}$) generated in a disk plate having a radius (a) and a thickness (t) can be obtained by the following equation (2) on the assumption that the circumference of periphery of the disk plate is fixed and a load (p) is equally distributed on the plate.

$$\sigma_{MAX}=3pa^2/4t^2 \tag{2}$$

In a disk plate of which circumference is fixed and which receives an equally distributed load, if a radius is the same, the maximum bending stress is in inverse proportion to the 2nd power of the thickness of the plate. Therefore, the thickness of the plate 121 according to the present embodiment which has the maximum bending stress 7.4 times that of quartz can be set about ½.7 of a quartz plate. Consequently, the plate 121 of the present embodiment can obtain the same strength by about one third of the thickness of a conventional quartz plate. For this reason, the thickness of the window 120 according to the present embodiment can be thinner than the conventional quartz window.

The thickness of the plate 121 of the present embodiment may be 5 mm to 10 mm, for example, about 5 mm, which thickness is smaller than the thickness of the conventional quartz window which is 30 mm to 40 mm. Consequently, the window 120 of the present embodiment has a smaller amount of absorption of the light from the lamp 130 (described later) than the conventional quartz window. Therefore, since irradiation efficiency to the object to be processed W from the lamp 130 can be higher than the conventional one, a high-speed temperature rise can be attained with a low power-consumption. That is, although there is a problem in that a lamp light is absorbed by the conventional quartz window and the irradiation efficiency to the object W to be processed is reduced, the present embodiment solves such a problem. Moreover, since the temperature difference (namely, thermal-stress difference) between front and back surfaces of the plate 121 is lower than that of the conventional quartz window, the window 120 is hardly destroyed. That is, although there is a problem in that a temperature difference arises between a surface of the conventional quartz window which faces a lamp and an opposite surface and the quartz window is easily destroyed due to the thermal-stress difference between the front and back surfaces during a rapid temperature rise as in a rapid thermal process (RTP), the present embodiment solves such a problem.

Furthermore, since the temperature rise of the window 120 is lower than the conventional quartz window, in a film deposition process, a deposition film and a reaction byproduct can be prevented from adhering onto the surface of the window 120. Therefore, a good temperature reproducibility is maintained and the frequency of cleaning of the process chamber 110 can be decreased. That is, although there is a problem that the temperature of the conventional quartz window rises and the frequency of cleaning of the process chamber is increased which results in a deposition film and a reaction byproduct adhering onto the surface especially during a film deposition process and being unable to maintain a good temperature reproducibility, the present embodiment solves such a problem.

Moreover, the heat conductivity of the plate 121 is 34 W/mK, and is larger than 1.4 to 1.9 W/mK which is the heat conductivity of the conventional quartz window. As compared to a quartz plate, the heat conductivity of the plate 121 is 18 to 24 times higher. Consequently, the window 120 of the present embodiment has a temperature difference smaller than that of the quartz window. Therefore, the energy from the lamp 130 reaches uniformly to the object W to be processed, which enables uniform heating of the object W to be processed. Therefore, it is possible to carry out uniform heating of the object W to be processed so as to provide a higher quality object W than conventional.

Furthermore, the plate 121 formed of the translucent ceramics is easy to process as compared with a quartz plate, thereby the plate 121 is easy to manufacture. It is also possible to arrange a cooling pipe within the plate 121 as mentioned later.

In the present embodiment, although the plate 121 is formed of $Al_2O_3$, as mentioned above, the present invention is not limited to such a material. The plate 121 can be made of any materials is the material can provide the above-mentioned action and effect. The translucent ceramics applicable to the present embodiment may be AlN, $Sc_2O_3$, MgO, $Ca_5(PO_4)_3OH$, $Si_3N_4$, PLZT-8/65/35, $Y_2O_3$, $ZrO_2$, $ThO_2$-5 mol % $Y_2O_3$, or $Y_2O_3$-10 mol % $ThO_2$.

Figure 3:
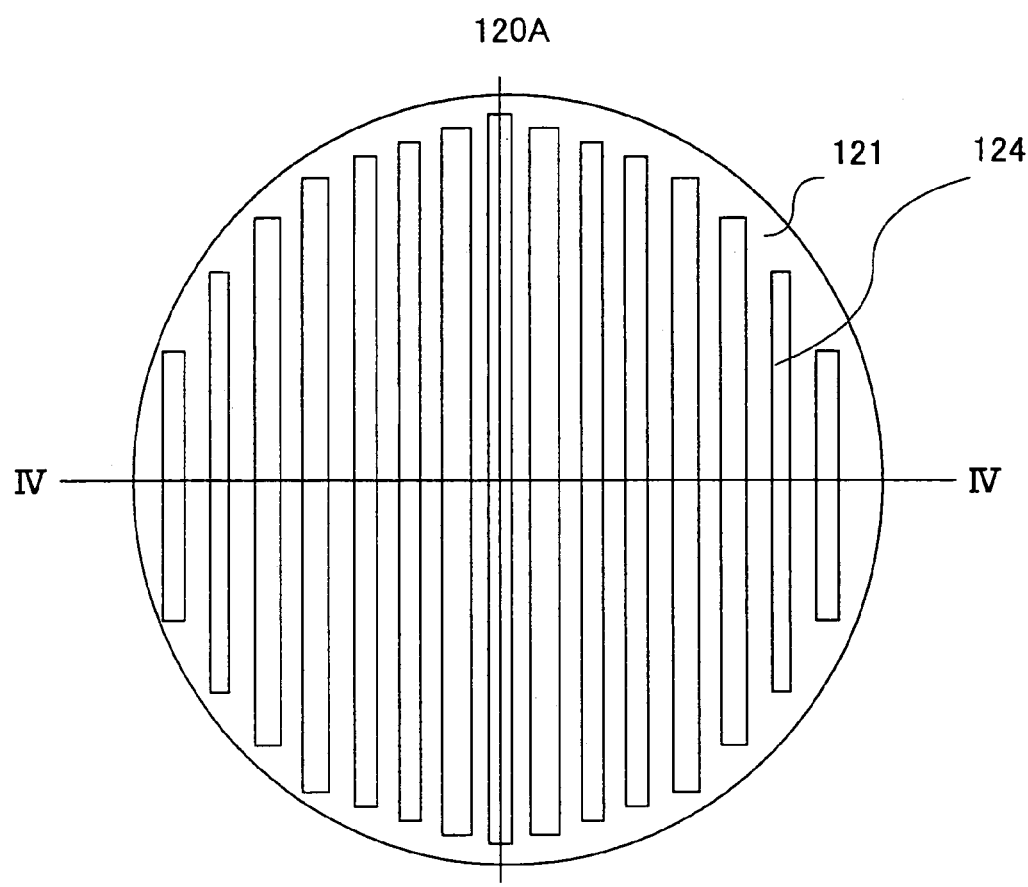
FIG. 3 is a bottom plan view of a window which is a variation of a window shown in FIG. 2.
Figure 4:
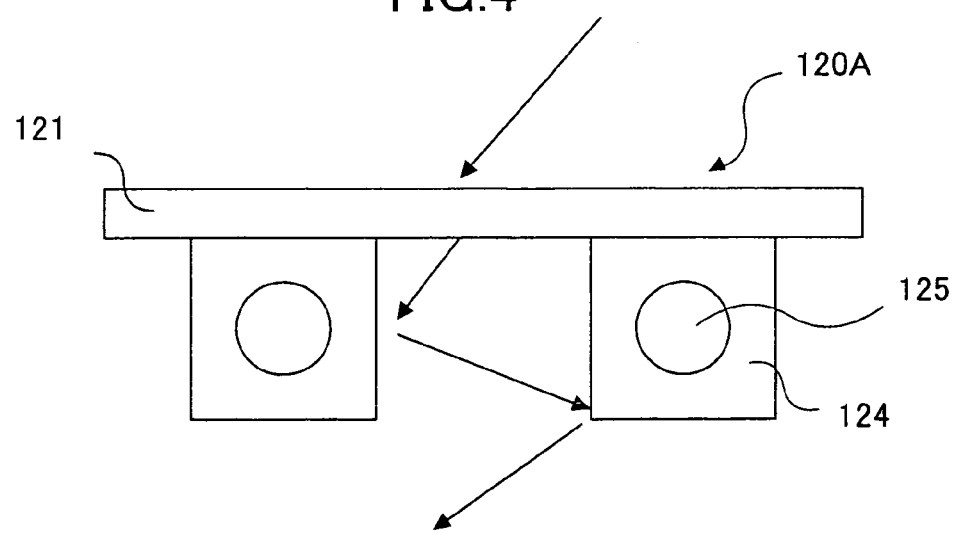
FIG. 4 is an enlarged cross-sectional view of a part of the window shown FIG. 3.

A description will now be given, with reference to FIGS. 3 and 4, of a window 120A as a variation of the window 120 of the present embodiment. FIG. 3 is a bottom plan view of the window 120A which is the variation of the window 120 shown in FIG. 2. FIG. 4 is an enlarged cross-sectional view of a part of the window 120A shown FIG. 3. The window 120A has a reinforcement member 124 having a rectangular cross section under the plate 121 shown in FIG. 3, the reinforcement member 124 made of aluminum or stainless steel (SUS). In FIG. 3, a plurality of reinforcement members 124 are linearly arranged. It should be noted that the lamps 130 are preferably arranged linearly when using the window 120A, and the reinforcement members 124 are preferably arranged so as to avoid extending directly under the lamps 130 (that is, the lamp light of the lamps 130 is not interrupted by the reinforcement member). However, the reinforcement member 124 may have configurations such as a bent form. The reinforcement member 124 may be bent so as to avoid extending directly under the lamps 130 when the lamps 130 are arranged along concentric circles as in the heating unit 14 of the present invention. Since the reinforcement member 124 has a good heat conductivity and is made of the same material with the process chamber, the reinforcement member 124 cannot become a pollutant source to the object W to be processed. The thickness of the plate 121 of the window 120A can be 5 mm to 10 mm, preferably equal to or less than 5 mm, more preferably equal to or less than 3 mm, which provides the above-mentioned advantages more notably. In the present embodiment, the cross-sectional dimensions of the reinforcement 124 includes a height of about 18 mm and a width of about 12 mm in FIG. 4, and a diameter of a cooling pipe is about 6 mm, but the present invention is not limited to such dimensions. As indicated by arrows shown in FIG. 4, the a light from the lamp 130 is introduced into the object W to be processed, which is arranged under the window 120A, by being reflected by side surfaces of the reinforcement members 124.

The reinforcement member 124 has a cooling pipe (cold-water pipe) 125 therein so as to further increases the strength of the window 120A. The cooling pipe 125 of the present embodiment has a function that cools both the reinforcement 124 and the plate 121. A cooling pipe 125 cools a plate 121 and has the effect of preventing the thermal deformation due to a lamp light. Moreover, if the reinforcement member 124 is made of aluminum, a suitable temperature control is required since aluminum may deform or melt at a temperature from 200° C. to 700° C. The temperature control by the cooling pipe 125 may be the same as that of the cooling pipe 116, and any approaches known in the art is applicable.

Figure 5:
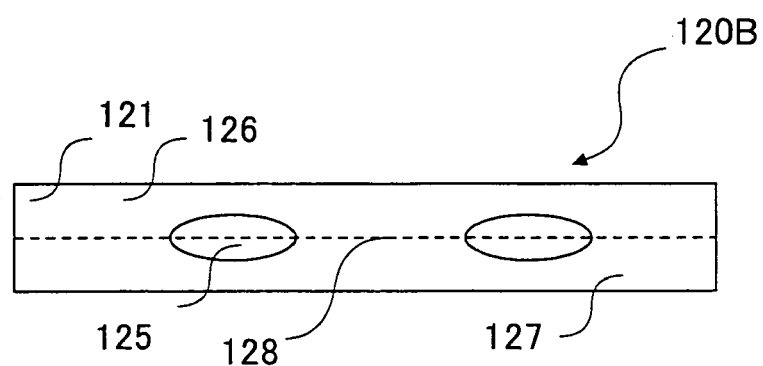
FIG. 5 is an enlarged cross-sectional view of a part of a window which is another variation of the window shown in FIG. 2.

Next, a description will be given, with reference to FIG. 5, of a window 120B as another variation of the window 120 of the present embodiment. FIG. 5 is an enlarged cross-sectional view of a part of the window 120B which is another variation of the window 120 shown in FIG. 2. The window 120B comprises the plate 121 and the cooling pipe 125. The plate 121 comprises two thin plates 126 and 127 formed of translucent ceramics, and the cooling pipe 125 is arranged between the plates 126 and 127.

The plates 126 and 127 are arranged in line symmetry with respect to the lamination surface 128 indicated by a dotted line in the figure along which the plates 126 and 127 contact with each other. A groove that receives the cooling pipe 125 is formed in each of the plates 126 and 127, and the plates 126 and 127 are combined by fitting the cooling pipe 125 into the grooves. It should be noted that the grooves are arranged between the lamps 130 and to avoid extending directly under the lamps. This structure is enabled since the translucent ceramics has an advantage in that a local processing can be easily applied to the translucent ceramics as compared with quartz. Moreover, the thickness of the plate 121, when the plates 126 and 127 are combined, is preferably the same as the thickness of the plate 121 of the window 120.

The cooling pipe 125 has a circular or elliptic cross section, and is arranged between the plates 126 and 127. Since the cooling pipe 125 is arranged between the plates 126 and 127, there is an advantage in that the cooling efficiency for the plate 121 is improved as compared to the window 120A. It should be noted that the cooling pipe 125 has the same effect as the above-mentioned window 120A, and a detailed description thereof will be omitted.

Figure 6:
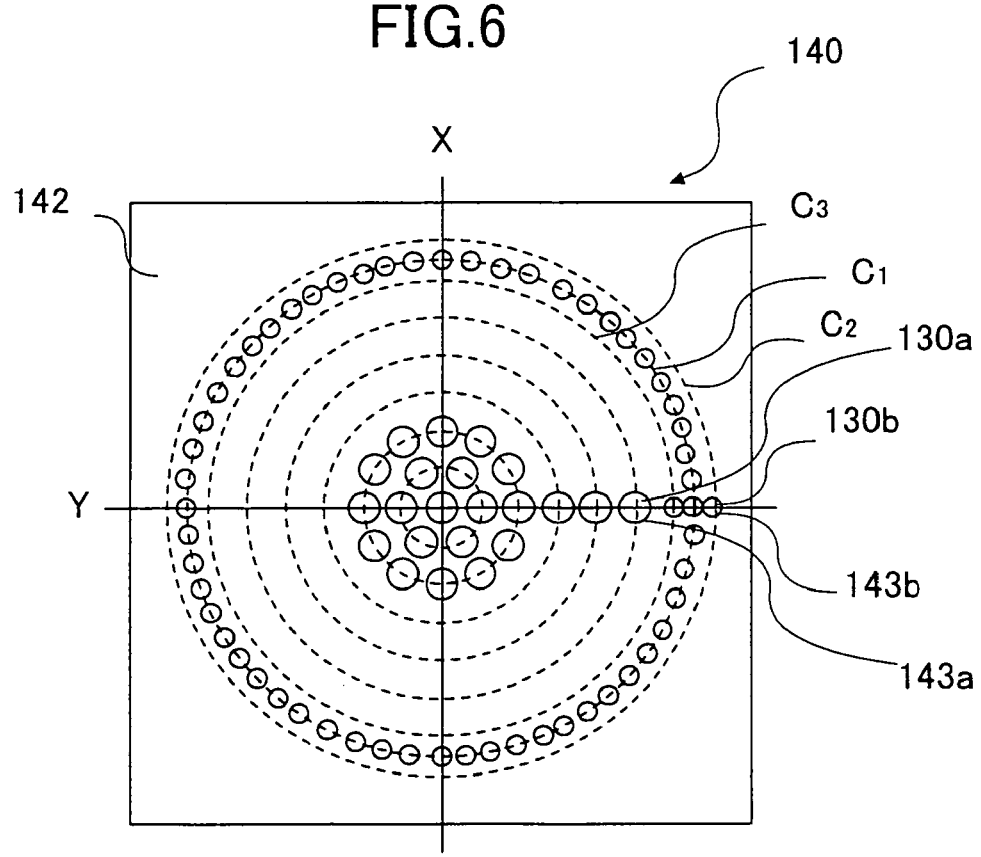
FIG. 6 is an illustrative bottom plan view of a heating unit shown in FIG. 2.
Figure 7:
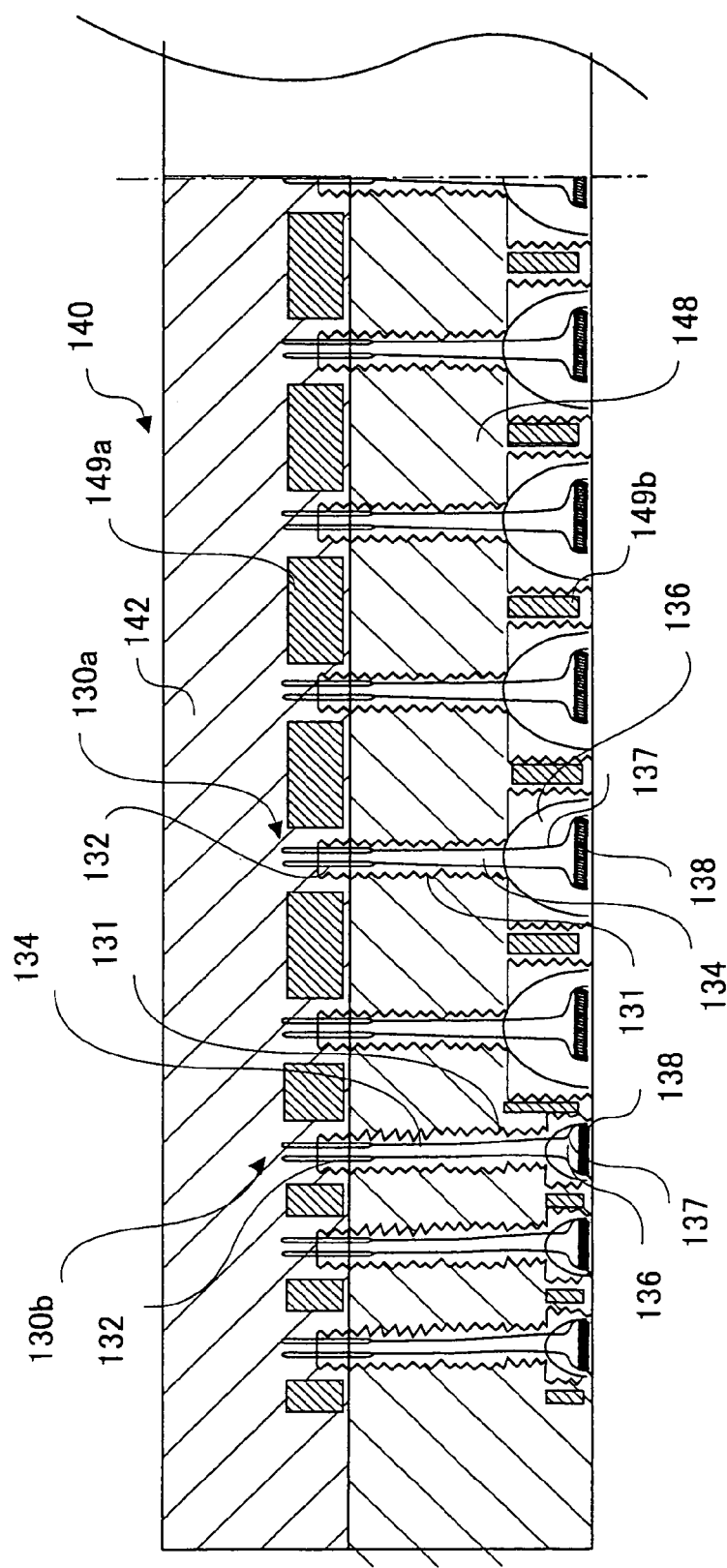
FIG. 7 is an enlarged cross-sectional view showing a part of the heating unit shown in FIG. 6.
Figure 8:
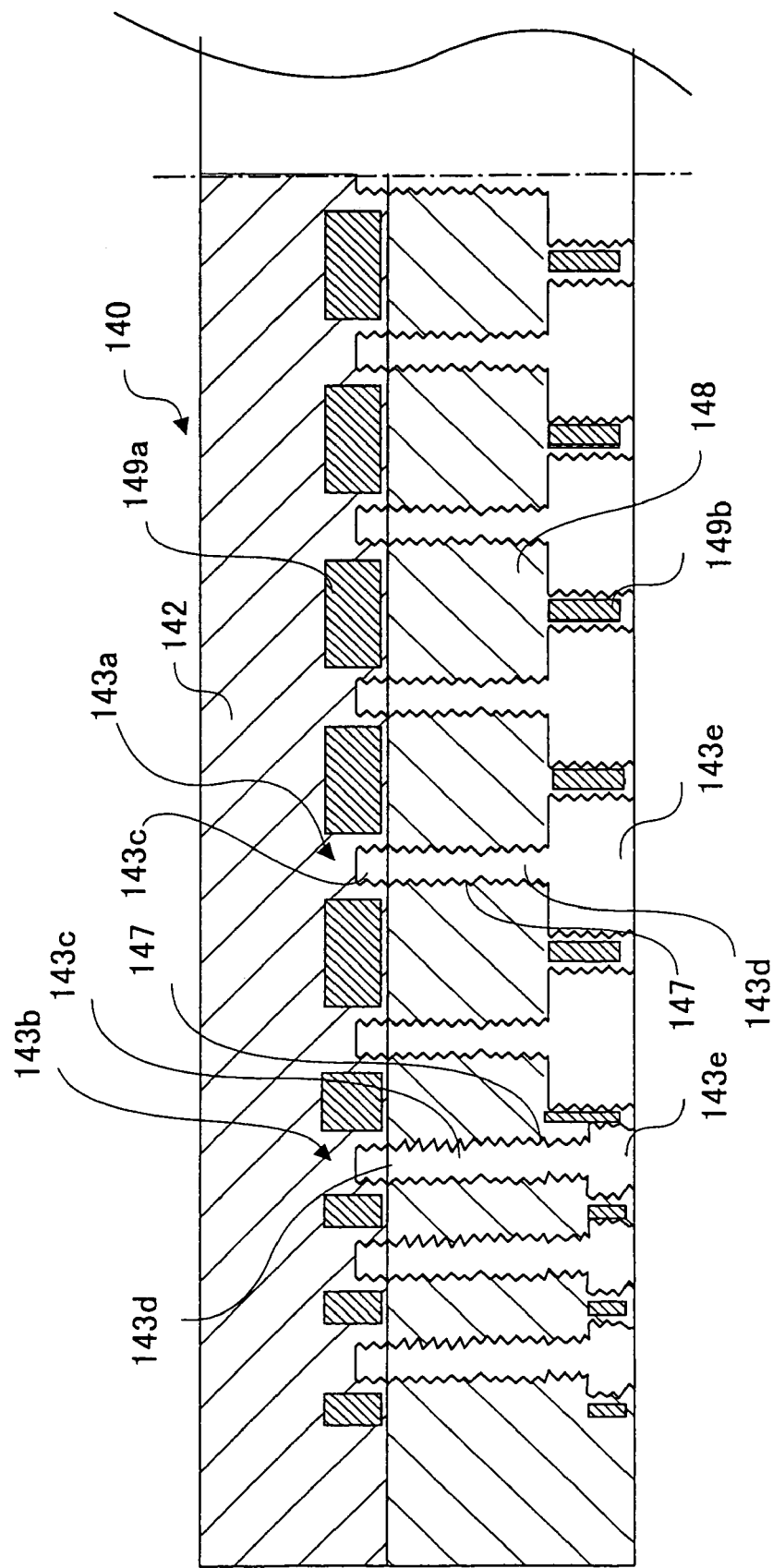
FIG. 8 is a view corresponding to FIG. 7 when lamps are removed from the heating unit shown in FIG. 6.
Figure 9:
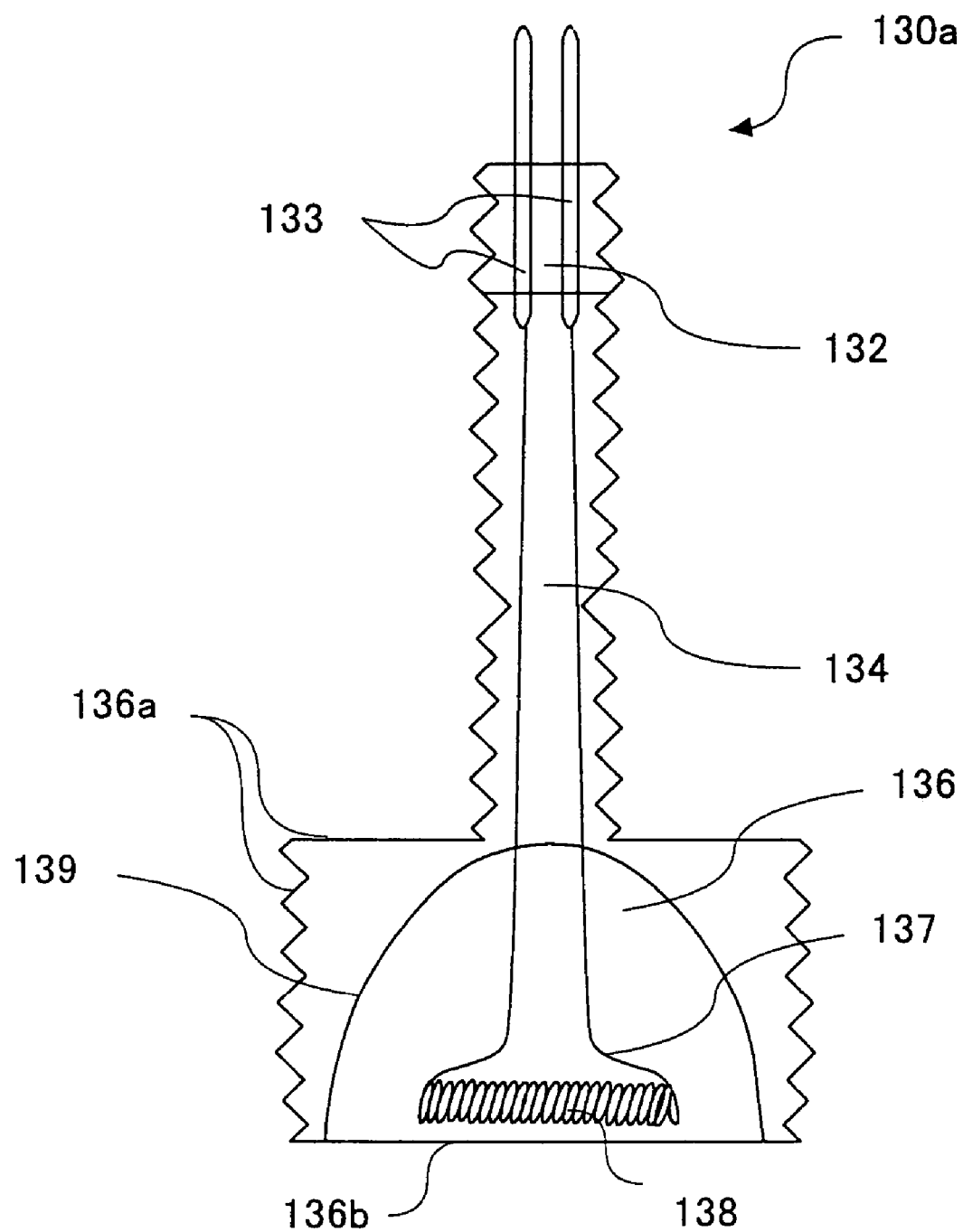
FIG. 9 is an illustrative cross-sectional view of a lamp shown in FIG. 7.
Figure 10:
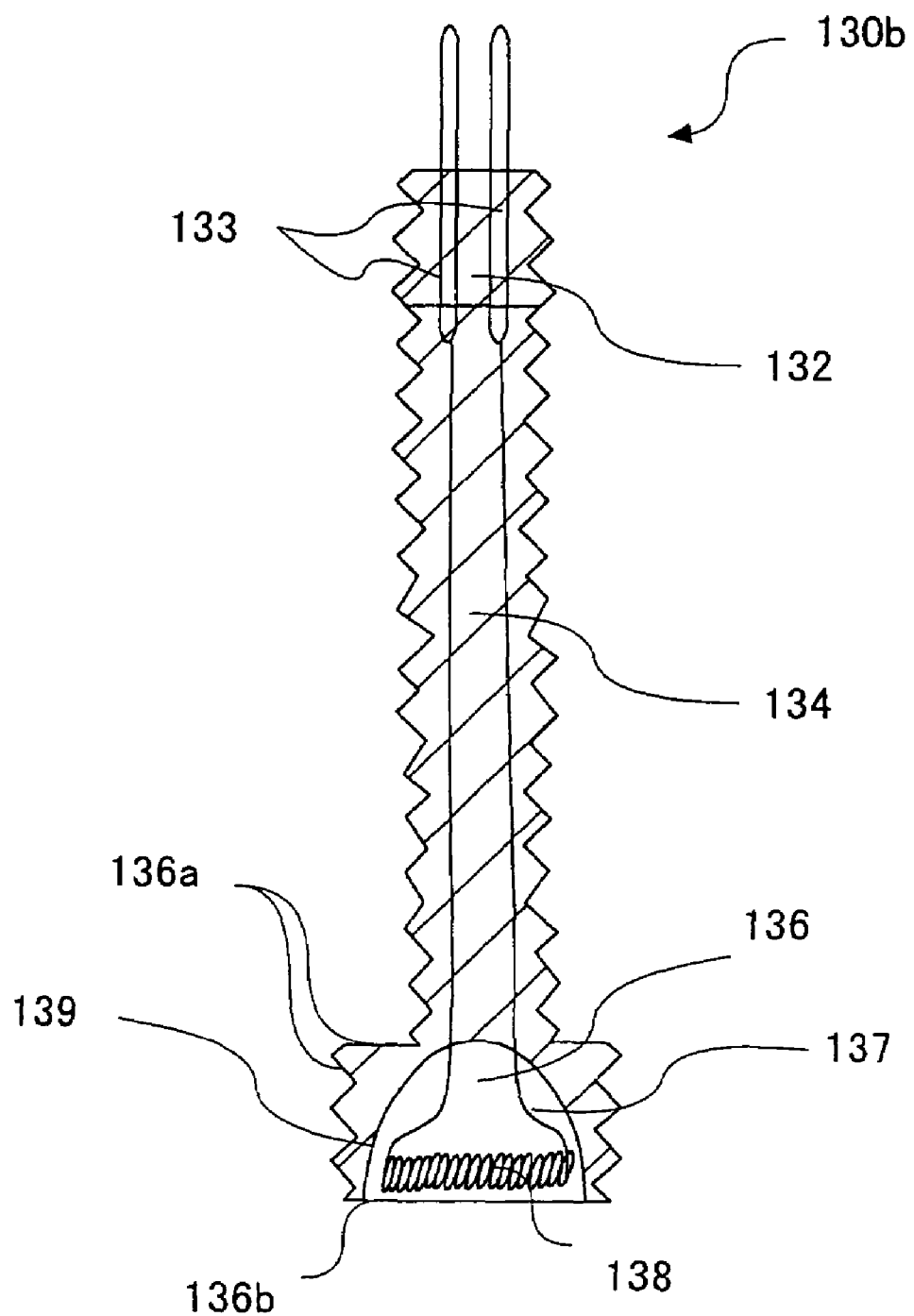
FIG. 10 is an illustrative cross-sectional view of the lamp shown in FIG. 7.
Figure 11:
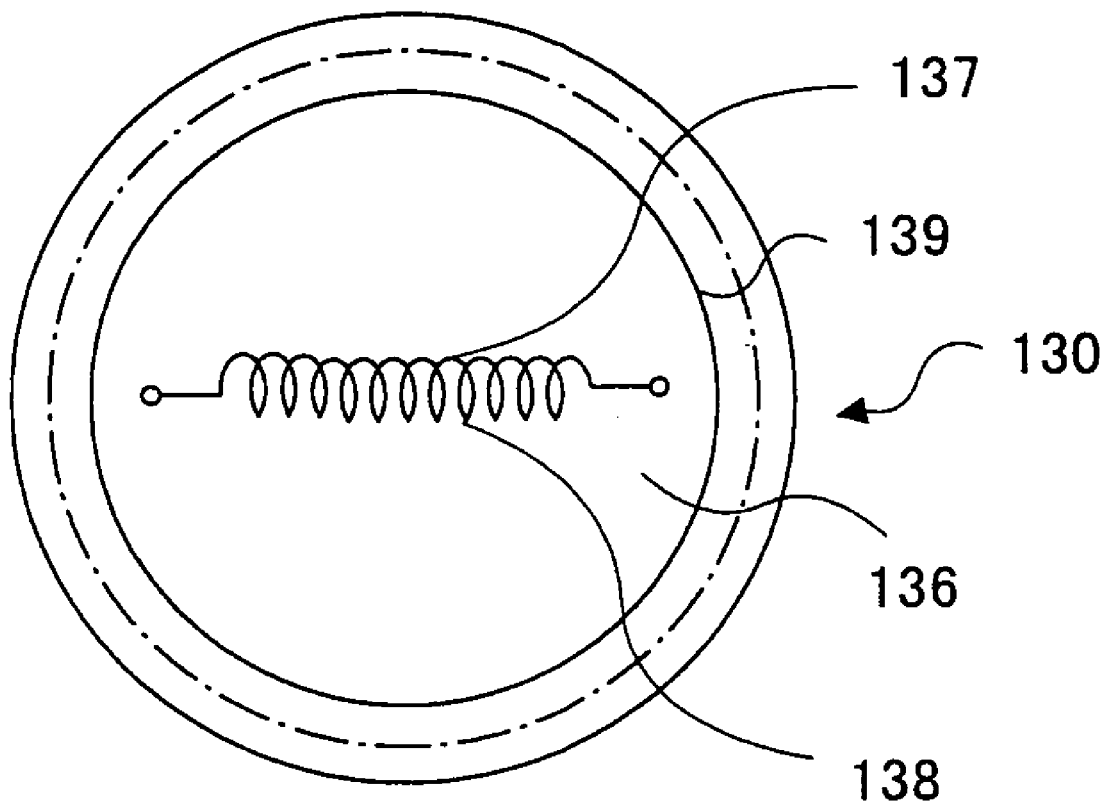
FIG. 11 is an illustrative bottom plan view of the lamp shown in FIG. 7.

A description will now be given, with reference to FIGS. 6 through 11, of the heating unit 140 of the present embodiment. FIG. 6 is an illustrative bottom plan view of the heating unit 140 shown in FIG. 2. FIG. 7 is an enlarged cross-sectional view showing a part of the heating unit 140 shown in FIG. 6. FIG. 8 is a view corresponding to FIG. 7 when the lamps 130 are removed from the heating unit 140 shown in FIG. 6. FIG. 9 is an illustrative cross-sectional view of a lamp 130a shown in FIG. 7. FIG. 10 is an illustrative cross-sectional view of a lamp 130b shown in FIG. 7. FIG. 11 is an illustrative bottom plan view of the lamp 130 shown in FIG. 7. It should be noted that, in FIG. 6 through FIG. 11, the heating unit 140 and the lamps 130 are somewhat exaggerated so as to emphasize the feature of the present invention. The heating unit 140 has two kinds of lamps 130a and 130b and a lamp support part 142 as a lamp house, and functions as a heating system which applies a predetermined heat treatment to the object W to be processed. Here, the lamp 130 generically represents the lamp 130a and the lamp 130b. In the present embodiment, the heating unit 140 is separated from the object W to be processed so that a distance between the irradiation surface of the lamp 130 and the object W to be processed is set to about 40 mm.

Although the lamp 130 is a single-end type in the present embodiment, other energy source such as an electric wire heater may be used. Here, the single-end type refers to a kind of lamp which has a single electrode part 132 as shown in FIG. 7. Although the lamp 130 has the function to heat the object W to be processed and is a halogen lamp in the present embodiment, a lamp applicable to the heating unit 140 is not limited to a halogen lamp. Moreover, although an output of the lamp 130 is determined by the lamp driver 310, the lamp driver 310 is controlled by the control part 300 as described later and supplies an electric power to the lamp 130. It should be noted that, in the present embodiment, the electric power supplied to the lamp 130 is controlled by the control part 300 so that the power density of the lamp 130b is larger than the power density of the lamp 130a. Specifically, the lamp 130b has a power density two to three times that of the lamp 130a.

As shown in FIG. 6, in the present embodiment, the lamps 130 are arranged along almost concentrically so as to correspond to the almost circular object W to be processed (in FIG. 6, the number of lamps 130 shown is reduced). Moreover, the lamps 130a having a larger diameter are arranged in a position corresponding to the vicinity of the center of the object W to be processed, and the lamps 130b having a smaller diameter are arranged in a position corresponding to the vicinity of the support ring 150 and the end of the object W to be processed. It should be noted that the lamps 130 are later described with reference to a lamp support part 142.

Typically, the lamp 130 has a single electrode part 132, a middle part 134 and a light-emitting part 136 connected to the electrode part 132 via the middle part 134. The light-emitting part 136 comprises a coil part 138 and a reflector 139. The coil part 138 is provided to a filament 137 connected to the electrode part 132 via the middle part 134. In the present embodiment, a thread (external thread) 131 is formed on a side of the lamp support part 142, which faces a groove 143 described later. The thread 131 is a triangular screw thread in the present embodiment, and a generally triangle-shaped ridge is formed. It should be noted that the thread 131 is not limited to the above-mentioned configuration, and may be a square thread or a trapezoidal thread. However, the lamp 130 does not always require the thread 131, and the lamp 130 having no thread may be used.

In the present embodiment, the height of the electrode part 132 of the lamp 130a is about 25 mm, the height of the middle part 134 is about 45 mm and the height of the light-emitting part 136 is about 25 mm. Moreover, the diameter of the middle part 134 is about 10 mm and the light-emitting part 136 of the diameter of the middle part 134 is about 40 mm. On the other hand, the height of the electrode part 132 of the lamp 130b is about 25 mm, the height of the middle part 124 is about 55 mm, and the height of the light-emitting part is about 10 mm. Moreover, the diameter of the middle part 134 is about 10 mm, and the diameter of the light-emitting part is about 20 mm.

The electrode part 132 has a pair of electrodes 133 and is connected with the lamp driver 310 electrically through the lamp support part 142. The electrodes 133 are electrically connected to the filament 137. The electric power supplied to the electrode part 132 is determined by the lamp driver 310, and the lamp driver 310 is controlled by the control part 300. A seal part 143c mentioned later connects between the electrode part 132 and the lamp driver 310.

The middle part 134 is formed airtight with the light-emitting part 136. Nitrogen, argon or halogen gas is enclosed within the interior of the middle part 134. The middle part 134 is a cylinder, which is located between the electrode part 132 and the light-emitting part 136 and has a predetermined length so as to separate the electrode part 132 and the light-emitting part 136 from each other. The middle part 134 has an advantage in that the length thereof is preferable for the temperature control of the lamp 130 described later. It should be noted that since the filament 137 positioned inside the middle part 134 emits a light, it is natural that the filament is a part of the light-emitting part 136. However, in this specification, since the electrode part 132 and the light-emitting part 136 (the part which emits light most strongly) are separated by a predetermined distance, this area is defined merely defined as the middle part 134. In the present embodiment, the middle part 134 is formed of ceramics. However, the middle part 134 may be formed of a metal other than ceramics, such as aluminum or SUS (stainless steel).

The light-emitting part 136 has the cylindrical shape having a diameter larger than the middle part 134 in the present embodiment. The light-emitting part 136 comprises a side surface 136a inscribed with a groove 143 and a projecting surface 136b, which faces the object W to be processed and from which a lamp light is projected. The light-emitting part 136 has the coil 138 of the filament 137 and the reflector 139 inside thereof. In the present embodiment, the side surface 136a of the light-emitting part 136 is fabricated integrally with the middle part 134 by the same material as the middle part 134. On the other hand, the projecting surface 136b of the light-emitting part 136 is formed of a material such as quartz or translucent ceramics, which transmits the lamp light.

The thread 131, which is explained later, is formed on the side surface 139 of the lamp 130 although the side face 139 is fundamentally formed in a hemisphere, a half-ellipse sphere or a cone. Then, as shown in FIGS. 7, 9 and 10, according to the present embodiment, in order to form the thread 131, the configuration of the side surface 136b differs from the hemisphere and the circular cone configuration, and is should be understood that the light-emitting part 136 is illustrated as being deformed. Moreover, the shape of the reflector 137 mentioned later has a shape the same as the side surface 136a and has a hemisphere shape because the side surface 136a are illustrated as being deformed.

The filament 137 is made of tungsten (W). As shown in FIGS. 8 through 10, the filament 137 is connected to the electrodes 133 and constitutes the coil 138 which can be an illuminant in the light-emitting part 136. The axial center of the coil 138 is formed so as to be parallel to the object W to be processed. The light emitted from the filament 137 is irradiated in a normal direction of the coil 138 (a direction perpendicular to the axial direction of the coil 138). Therefore, at least a light from the side of the coil 138, which faces the object W to be processed, is directly irradiated onto the object W to be processed (without associated with the reflector 139). The reflective loss of such a light due to association with the reflector 139 is zero, and the light is irradiated onto the object W to be processed while maintaining a high energy. On the other hand, lights other than the above-mentioned light are efficiently reflected by the reflector 139 mentioned later, and are irradiated onto the object W to be processed.

The reflector 139 covers the coil 138 and has a convex hemisphere configuration in a direction away from the object W to be processed. The reflector 139 is a reflective part which reflects a light toward the object W to be processed, and, more specifically, is formed in the same shape as the side surface 136a of the light-emitting part 136. However, in FIGS. 7, 9 and 10, since the thread 131 is formed on the light-emitting part 136, the configuration of the light-emitting part 136 is changed as mentioned above. Moreover, the configuration of the reflector 139 is not limited to a hemisphere configuration, will not eliminate other configurations if the configuration of the reflector 139 is substantially the same as that of the side surface of the light-emitting part 136. For example, the reflectors 139 may be in the form of a half-ellipse globular form or a cone form. Moreover, the reflector 139 has a penetration holes (not shown in the figures) which allow the filament 137 passing therethrough so as to be connected to the electrodes 133 and cover the coil 138. However, the penetration holes are preferably formed so as not to affect the reflective function of the reflector 139. Furthermore, the surface of the reflector 139 covering the coil 138 is provided with a coating so as to efficiently reflect a light including a visible light and an infrared light. It is possible to use gold (Au), gold (Au) and rhodium (Rh), or gold (Au) and nickel (Ni) as a material for the coating.

The reflector 139 has the function which improves the directivity of the lamp 130 while reflecting a light emitted by the coil 138 toward the object W to be processed. The reflector 139 efficiently reflects a light emitted by the coil 138 toward the object W to be processed, preferably by only one reflection, and converge the light in a direction substantially perpendicular to the object W to be processed.

Figure 12:
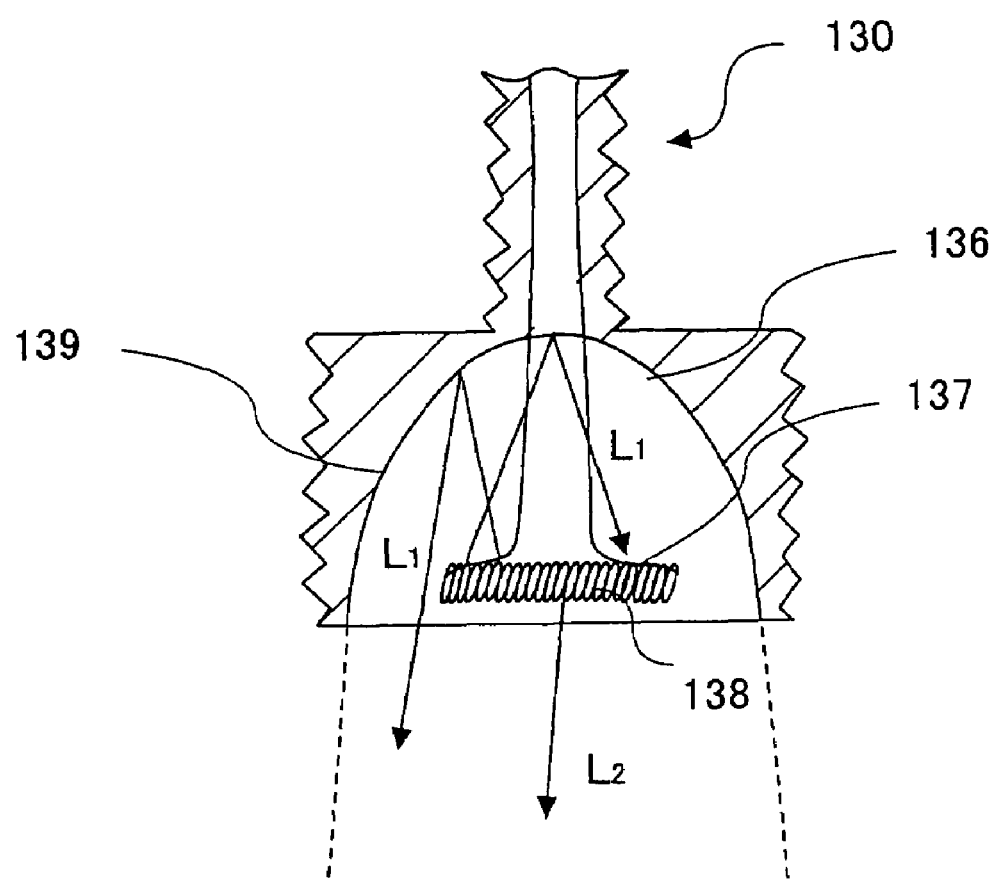
FIG. 12 is an illustrative side view of the lamp indicating optical path of a light emitted from a filament.
Figure 13:
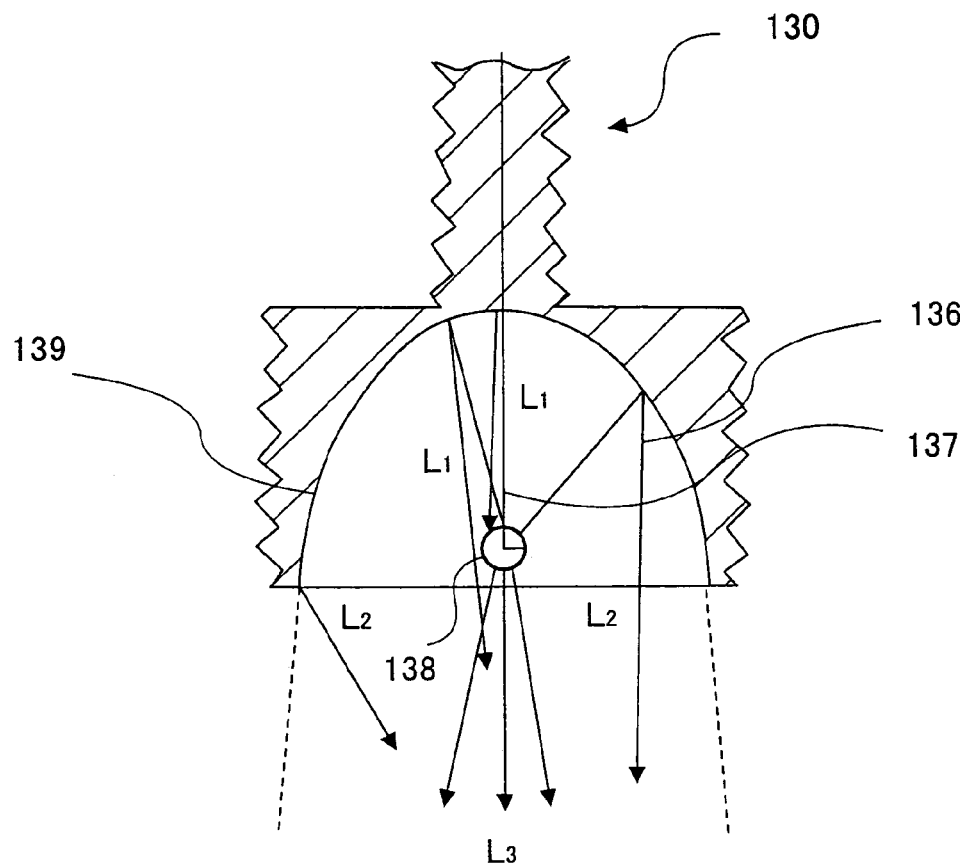
FIG. 13 is another illustrative side view of the lamp indicating optical path of a light emitted from the filament.

A description will be given, with reference to FIGS. 12 and 13, of an optical path of the lamp 130. FIG. 12 is an illustrative side view of the lamp 130 indicating optical path of a light L emitted from the filament 137. The light L generically represents lights L1, L2 and L3 emitted from the filament 137 of the lamp 130 shown in FIG. 7. FIG. 13 is another illustrative side view of the lamp 130 indicating optical path of a light L emitted from the filament 137. The light L1 emitted from the top surface (the side which faces the object W to be processed) of the coil 138 travels in a direction away from the reflector 139. As mentioned above, since the reflector 139 reflects the light so as to travel toward the object W to be processed, the light L1 is reflected by the reflector once and travels toward the object W to be processed. In addition, a part of the light L1 reaches the filament 137, which is not irradiated onto the object W to be processed. However, since the energy of such a part of the light L1 contributes heating and luminescence of the coil 138, there is no energy loss. Moreover, the light L2 emitted from the side of the coil 138 is incident on the reflector 139, and a large part of the light L2 is irradiated onto the object W to be processed, and the reset returns to the filament 137, which contributes the luminescence of the coil 138 as mentioned above. Finally, the light L3 emitted from the undersurface side (the side which faces the object W to be processed) of the coil 138 is directly irradiated onto the object W to be processed without reflection of the reflector 139.

Figure 1:
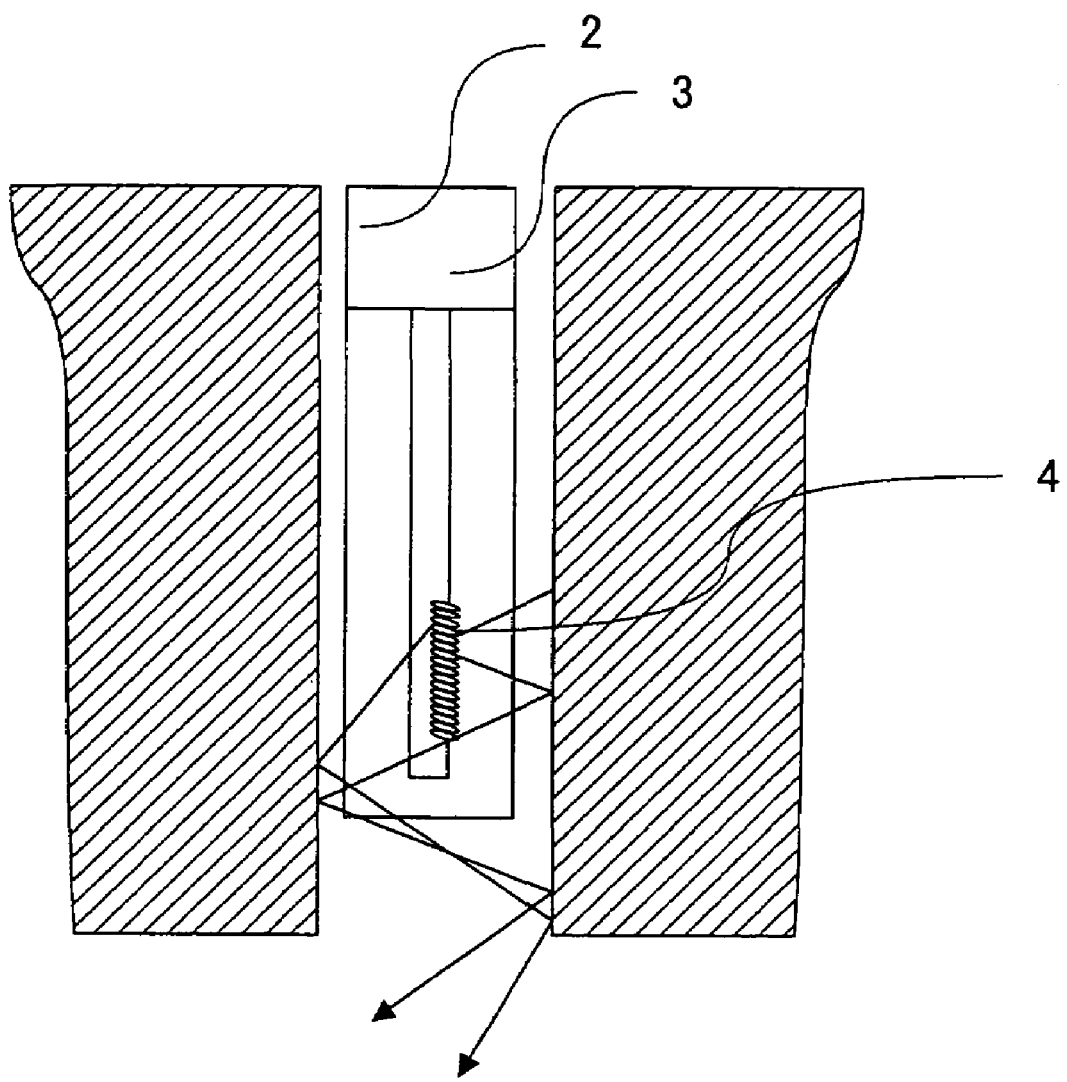
FIG. 1 is an illustration showing a configuration of a conventional lamp.

As explained above, the lamp 130 of the present embodiment projects a light in a direction perpendicular to the object W by positioning the coil 138 of the filament 137 parallel to the object W to be processed. The light of is directly irradiated onto the object W to be processed, and other lights travels toward the reflector 139. Moreover, as mentioned above, the reflector 139 is formed so that a light is reflected toward the object W to be processed. Therefore, the light emitted from the lamp 130 is irradiated onto the processed with only one reflection by the reflector 139. Moreover, the light emitted from the lamp 130 is converged within a range of an opening of the reflector 139 in a tangential direction. Namely, the lamp 130 according to the present embodiment is reflected less number of times than the conventional lamp shown in FIG. 1. For this reason, the light is transmitted to the object W to be processed with little energy loss, and is excellent also in directivity. Although there is a problem in that the energy of the lamp light is reduced by the reflective loss associated with multiple reflection by the reflector, the present embodiment solves such a problem. Therefore, since the lamp 130 can improve the irradiation efficiency to the object W to be processed, a high-speed temperature rise can be attained at a low power consumption. It should be noted that the curvature and opening of the reflector 139 may vary in accordance with a desired directivity to be achieved.

Moreover, since the thread 131 applicable to the groove 143 of the lamp support part 142 is formed on the side surface of the lamp 130, the middle part 134 and the light-emitting part 136 of the lamp 130 are formed of the above-mentioned material in consideration of the strength and machinability. However, the lamp 130 of the present embodiment is not limited to such a material, and an entire middle part 134 and light-emitting part 136 may be formed of quartz or translucent ceramics. However, in such as case, it is necessary to provide a cover material to the lamp 130 and to acquire a strength and machinability in the cover with respect to the lamp support part 142. Furthermore, it is preferable to select the cover material from materials having a high heat conductivity so as not to prevent cooling of the lamp 130. On the other hand, in the lamp 130, the side surface 136b of the light-emitting part 136 may be formed in a hemisphere or a cone form as mentioned above. Furthermore, the light-emitting part 136 and the middle part 134 may be formed in cylindrical shapes having the same diameter. However, the configuration of the lamp 130 mentioned above has many advantages as mentioned above.

Figure 14:
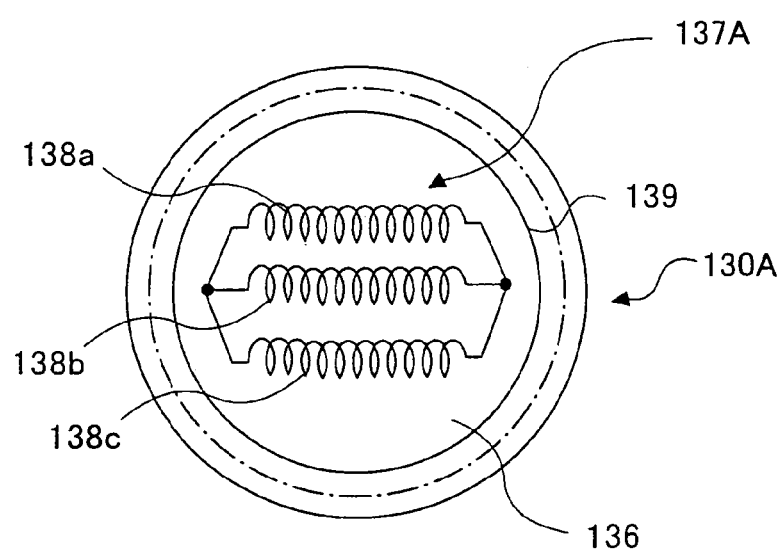
FIG. 14 is an illustrative bottom plan view of a lamp 130A which is a variation of the lamp shown in FIG. 7.

A description will now be given, with reference to FIG. 14, of a lamp 130A as a variation of the lamp 130 of the present embodiment. FIG. 14 is an illustrative bottom plan view of the lamp 130A which is a variation of the lamp 130 shown in FIG. 7. The lamp 130A has filament 137A which constitutes a plurality of coils 138a through 138c. Similar to the filament 137 mentioned above, the coils 138a to 138c are arranged parallel to the object W to be processed. Accordingly, when the lamp 130A is seen from the object W, light-emitting part 136 of the lamp 130A can be regarded as a surface illuminant. That is, the lamp 130A has larger irradiation energy than the lamp 130. Therefore, since the irradiation efficiency to the object W to be processed can be higher than the lamp 130, a high-speed temperature rise can be attained. Moreover, the thus-structured lamp 130A has little reflective loss of the reflector 139 as described with the lamp 130, and has a directivity.

Figure 15:
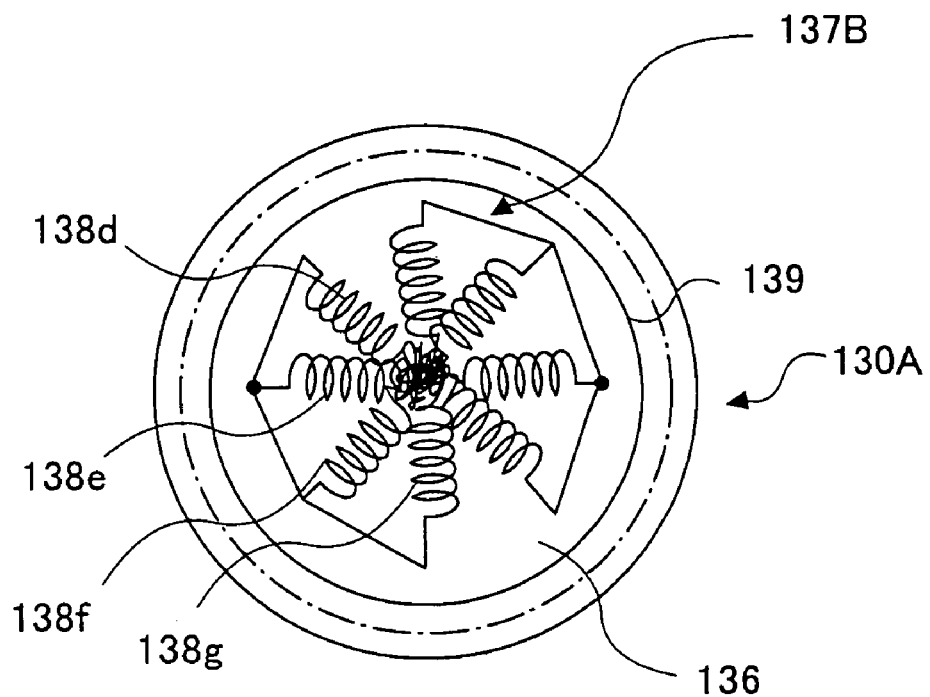
FIG. 15 shows a filament arranged so that a plurality of coils cross each other
Figure 16:
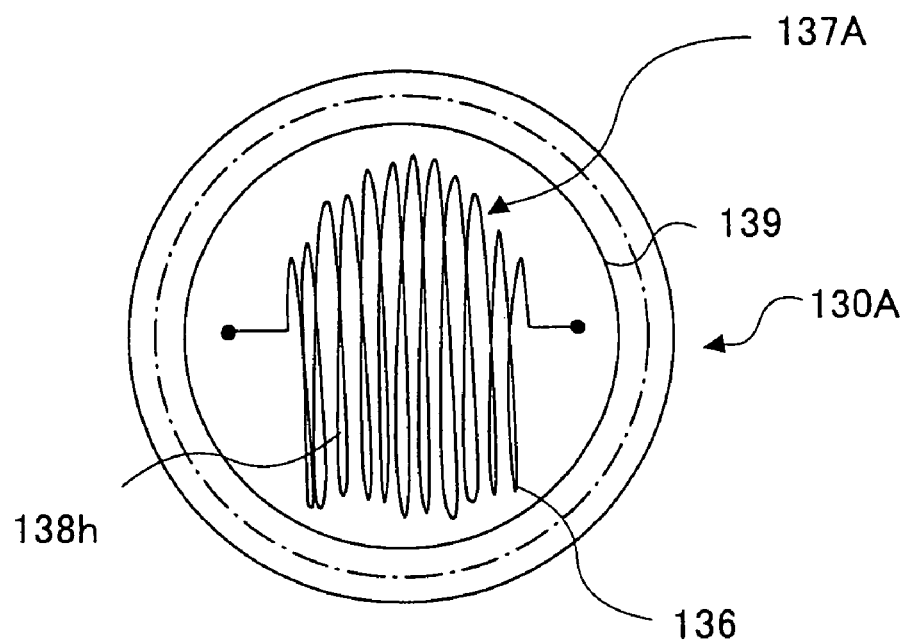
FIG. 16 shows a filament which has a coil formed with a large width.
Figure 17:
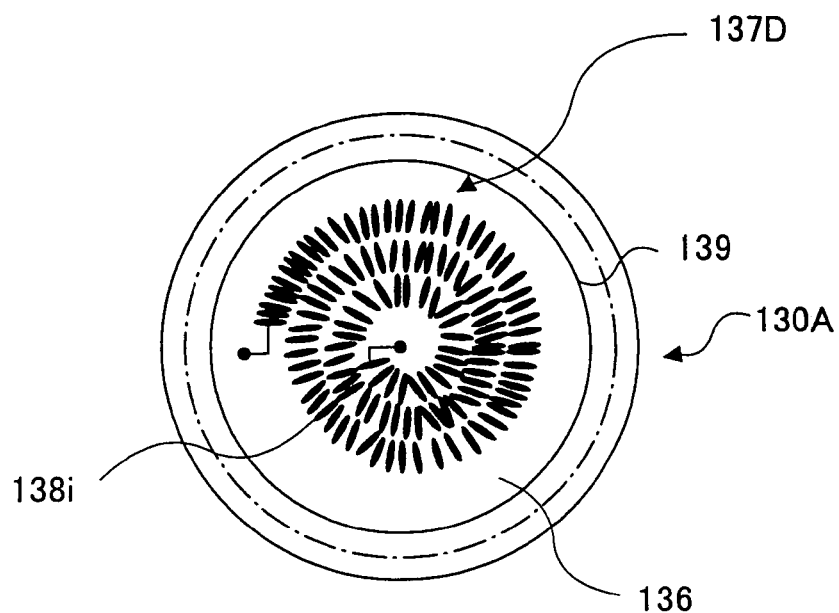
FIG. 17 is an illustrative bottom plan view of a filament in which a coil forms a spiral
Figure 18:
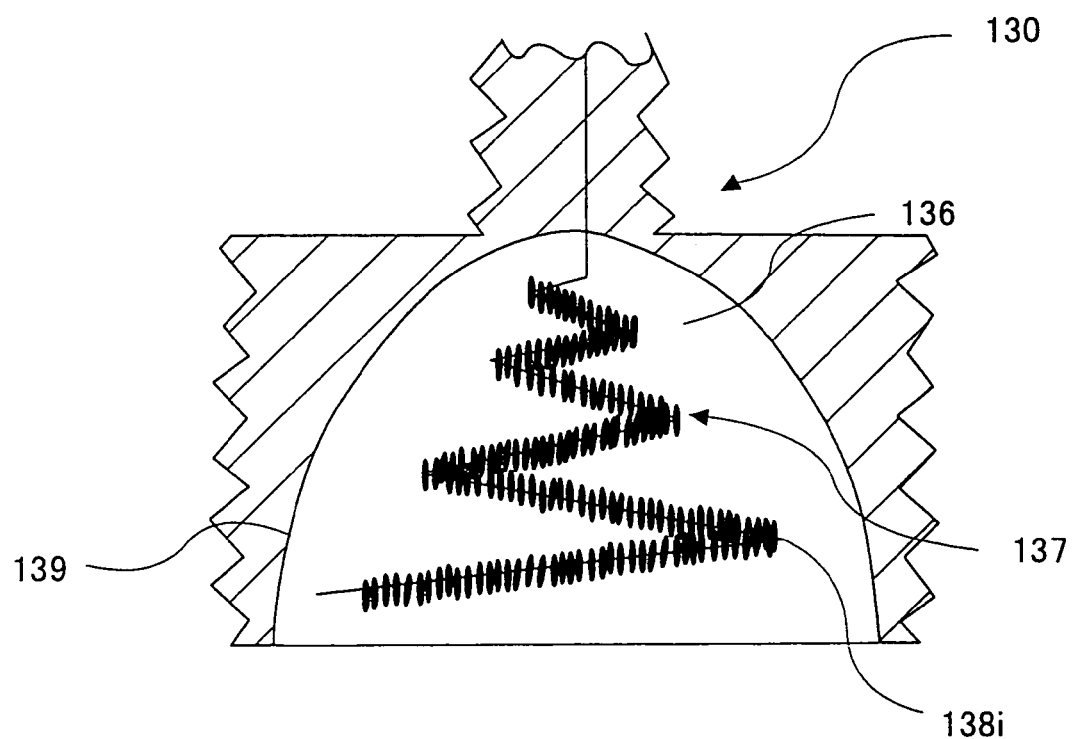
FIG. 18 is an illustrative side view of the filament shown in FIG. 17.

It should be noted that, in the lamp 130A, the number of coils 138a through 138c, which constitute filament 137A, can be changed in accordance with a desired irradiation energy. Moreover, the arrangement and configuration of the filament 137A are sufficient for the lamp 130A to be regard as a surface illuminant with respect to the object W to be processed. That is, the arrangement of the filament 137 as shown in FIGS. 15 through 18 may be used. Here, FIG. 15 through FIG. 17 are illustrative plan views showing filaments 137B trough 137D which are variations of the filament 137A of the lamp 130A shown in FIG. 14. FIG. 18 is an illustrative side view of the filament 130D shown in FIG. 17. FIG. 15 shows the filament 137B arranged so that a plurality of coils 138d through 139g cross each other. FIG. 16 shows the filament 137C which has a coil 138h formed with a large width. FIGS. 17 and 18 show the filament 137D in which a coil 138i forms a spiral. Even in the configuration mentioned above, it can consider that the lamp 130A is a surface illuminant, and it is possible to raise the irradiation energy of the lamp.

Figure 19:
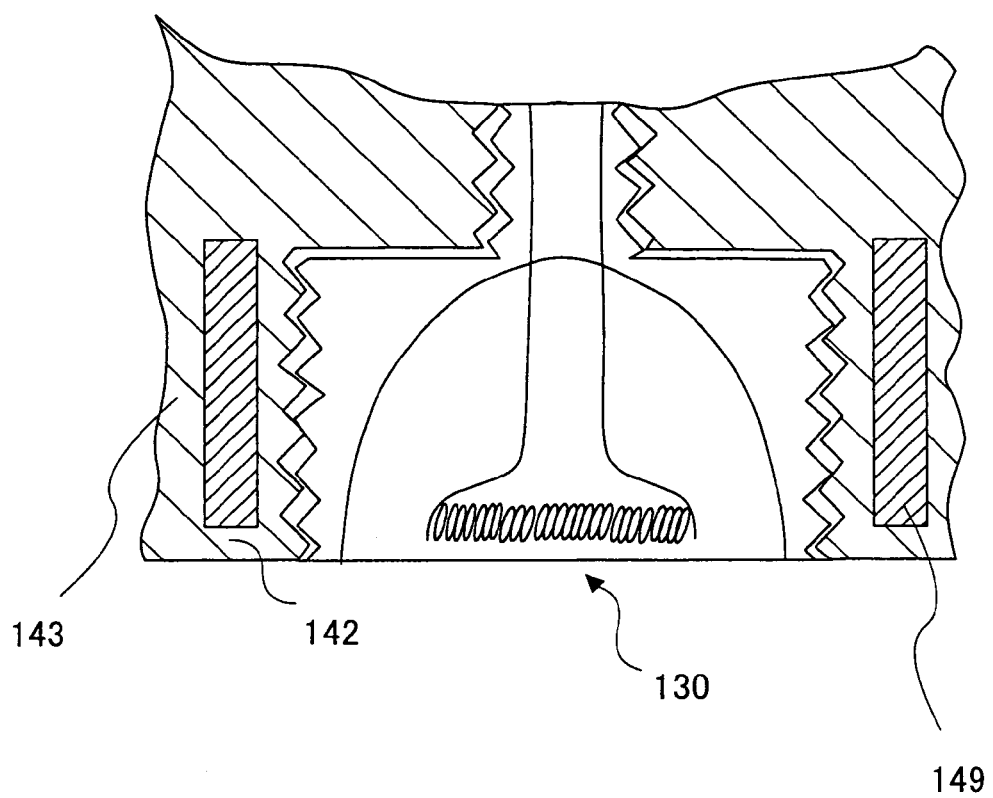
FIG. 19 is an enlarged cross-sectional view of a part of a lamp support part shown in FIG. 7 when the lamp is not expanded.

Referring to FIGS. 6 through 8 and FIG. 19, the lamp support part 142 which functions as a lamp house with has a substantially rectangular parallelepiped shape, and has the grooves 143 which contain the respective lamps 130 and isolation wall 148. FIG. 19 is an enlarged cross-sectional view of a part of the lamp support part 142 shown in FIG. 7 when the lamp 130 is not expanded. The groove 143 serves as a lamp accommodation part which accommodates the lamp, and comprises a groove 143a which accommodates the lamp 130a and a groove 143b which accommodates the lamp 130b. It should be noted that the groove 143 generically represents the grooves 143a and 143b. The configuration of the groove 143 will be described later, a description will now be given of an arrangement of the grooves 143.

As shown in FIG. 6, the groove 143a is formed along concentric circles arranged in an area from the center of the lamp support part 142 (a position corresponding to the center of the object W to be processed) to the vicinity of the support ring 150 in a radial direction. More specifically, a plurality of grooves 143a are formed along the concentric circles of which radius is increased by a first distance from the center so that the center of each of the grooves 143a is positioned on the corresponding concentric circles. The first distance is set to about 0.5 to 1.5 times a half-value width of a radiation distribution. The half-value width corresponds to a width of the radiation distribution when an intensity of the light of the lamp 130a is one half of a peak value. In the present embodiment, the lamp 130a shows the half-value width of about 40 mm in a direction of radiation of the lamp light at a point about 40 mm from the projecting surface 136b. The distance of 40 mm corresponds to the distance between the lamp 130 and the object W to be processed. It should be noted that the half-value width differs from lamp to lamp, and the present invention is not limited to this value. Moreover, in the present embodiment, since the cooling pipe 149 mentioned later is provided in the light-emitting-part 136, the first distance is set to 50 mm (1.25 times the half-value width) which is a lager value than the diameter of the light-emitting part 136 of the lamp 130a. It should be noted that the concentric circles may be extended to the location at which the concentric circles do not overlap with a groove 143b mentioned later. Moreover, it is preferable that an interval between the grooves 143a arranged along one of the concentric circles be set equal to the first distance.

On the other hand, the grooves 143b are formed along a plurality of concentric circles within and in the vicinity of an area where the support ring 150 overlaps with the object W to be processed. More specifically, the grooves 143b are arranged along first, second and third circles C1, C2 and C3. The first circle is located within the area where the support ring 150 overlaps with the object W to be processed. The second circle C2 has a radius larger than the radius of the first circle by a second distance. The third circle C3 has a radius smaller than the radius of the first circle by the second distance. It should be noted that the second distance is set to about 0.5 to 1.5 times the half-value width of a radiation distribution of the lamp 130b. The lamp 130b shows the half-value width of about 20 mm in a direction of radiation of the lamp light at a point about 40 mm from the projecting surface 136b. In the present embodiment, the distance of 40 mm corresponds to the distance between the lamp 130 and the object W to be processed. It should be noted that the half-value width differs from lamp to lamp, and the present invention is not limited to this value. Moreover, similar to the grooves 143a, since the cooling pipe 149 mentioned later is provided in the light-emitting-part 136, the second distance is set to 25 mm (1.25 times the half-value width). Moreover, it is preferable that an interval of the grooves 143b along one of the circles be set equal to the second distance.

In the present embodiment, although the grooves 143b are formed along the three circles C1, C2 and C3, the number of circles is not limited to three and may be changed to an appropriate value. As mentioned above, the grooves 143b are formed so that the lamps 130b can irradiate the area where the support ring 150 and the object W to be processed overlap with each other. For example, when the object W to be processed is larger than the circle C2, additional grooves 143b may be arranged along a circle having a diameter larger than the diameter of the circle C2 by a length equal to the second distance. Similarly, when the support ring 150 is smaller than the circle C3, additional grooves 143b may be arranged along a circle having a diameter smaller than the diameter of the circle C3 by a length equal to the second distance.

Figure 22:
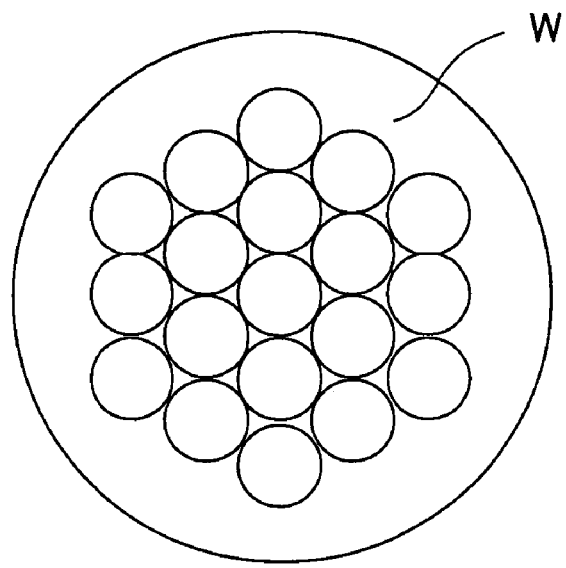
FIG. 22 is an illustration of lights irradiated by the lamps of the heating unit shown in FIG. 2 onto the object to be processed.
Figure 23:
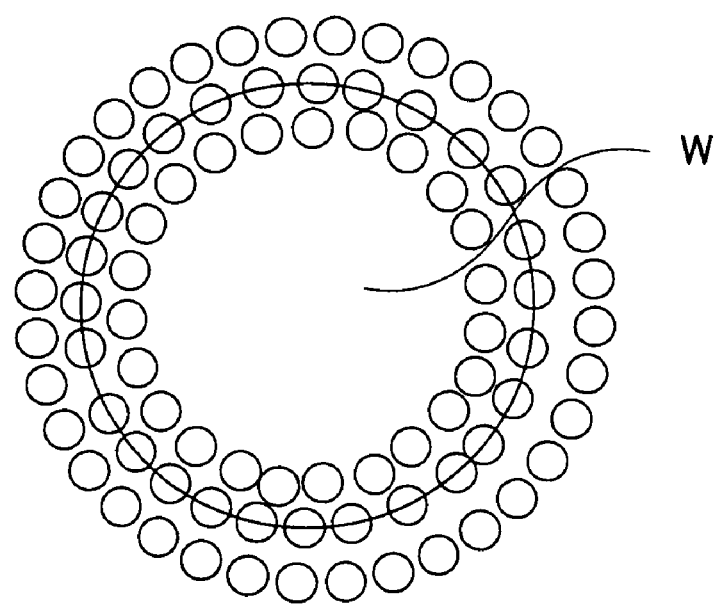
FIG. 23 is an illustration of lights irradiated by the lamps of the heating unit shown in FIG. 2 onto the object to be processed.

In the structure mentioned above, the lamp support part 142 enables arrangement of the lamps 130a at the positions in the vicinity of the object W to be processed and the lamps 130b in the part where a support ring 150 overlaps with the object W to be processed and in the vicinity of the part concerned. FIG. 22 is an illustration of lights irradiated by the lamps 130a of the heating unit 140 shown in FIG. 2 onto the object W to be processed. FIG. 23 is an illustration of lights irradiated by the lamps 130b of the heating unit 140 shown in FIG. 2 onto the object W to be processed. If the lamp 130 irradiates in the state shown in FIGS. 22 and 23, a greater irradiation area can be obtained by the lamps 130a in the center of the object W to be processed. On the other hand, a smaller irradiation area can be obtained by the lamps 130b in the vicinity of the outer end of the object W to be processed. It should be noted that FIGS. 22 and 23 illustrate the lamp lights as an example, and the number of lamps 130 does not match the present embodiment.

In the present embodiment, it becomes possible to irradiate efficiently the small area where the support ring 150 and the end of the object W to be processed overlap with each other by arranging the small-diameter lamps 130b around the lamps 130a. Moreover, as mentioned above, the electric power supplied to the lamp 130b is larger than the electric power supplied to the lamp 130a. That is, an energy irradiated by the lamps 130b per unit area is greater than that of the lamps 130a. According to the arrangement of lamps in the conventional heat treatment apparatus, it is impossible to control the lamp irradiation area separately between the center area and the end area of the object W to be processed since only one kind of lamp is used.

The specific heat differs from the support ring 150 to the object W to be processed. Specifically, the specific heat of the support ring 150 is smaller than the specific heat of the object W to be processed. Therefore, there is a problem in that the a temperature siring rate of the area where the support ring 150 overlaps with the object W to be processed and the area in the vicinity of the area concerned is smaller that other areas of the object W to be processed. However, in the present embodiment, since the small area in the periphery of the object W to be processed is irradiated by the small-diameter lamps 130b, the object W to be processed can be efficiently heated. Furthermore, the center area and the peripheral area of the object W to be processed are prevented from being heated unevenly, which results in a high-quality heat treatment process. Moreover, using the large-diameter lamps 130a in the vicinity of the center of the object W provides a large irradiation area by one of the lamps 130a. Therefore, the number of the lamps 130 in the vicinity of the center can be smaller than conventional one, which allows a reduction in the power consumption. In the present embodiment, the above-mentioned problem is solved by using the lamps 130a and 130b having different diameters and varying an electric power supplied to the lamps 130a and 130b.

Figure 24:
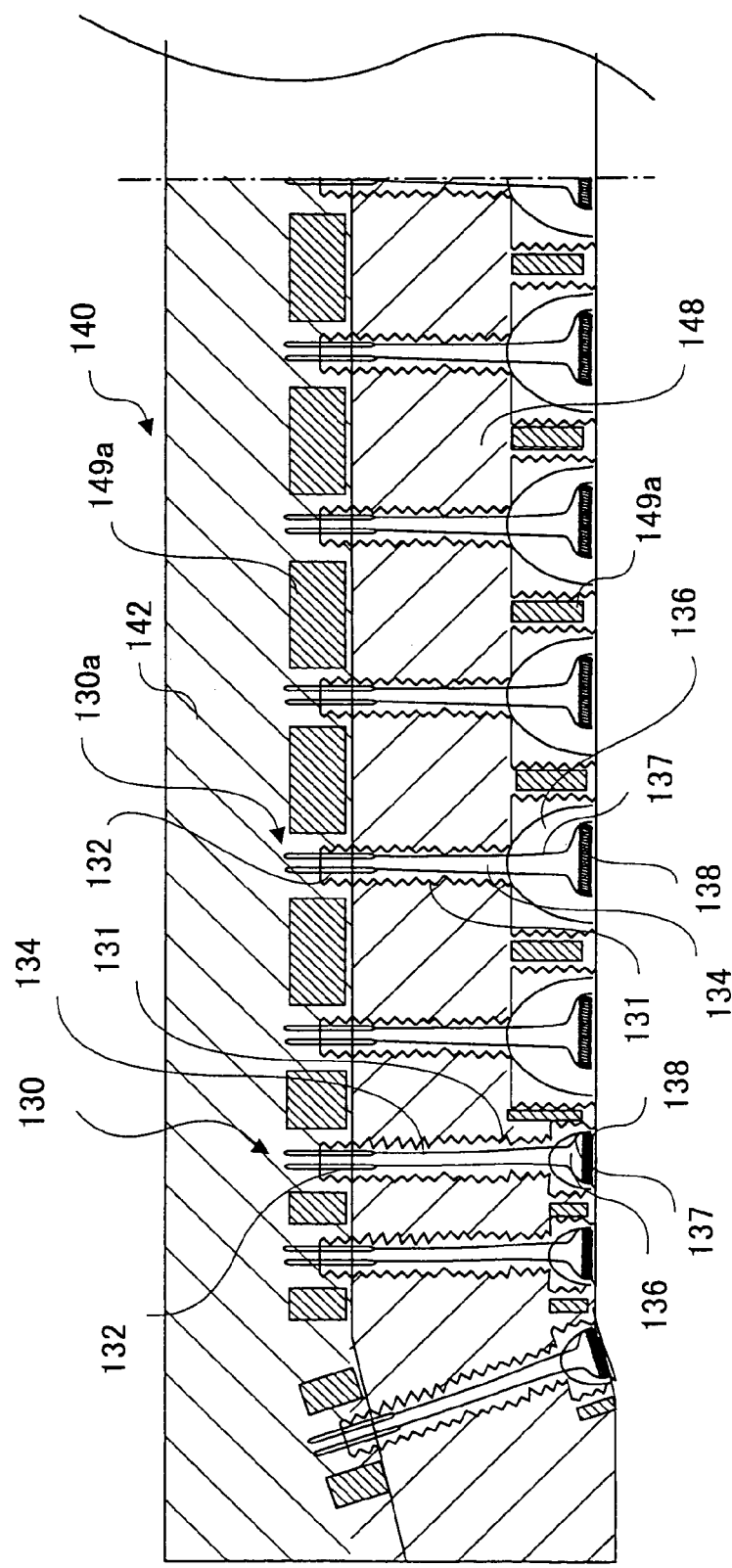
FIG. 24 is an illustrative cross-sectional view showing a variation of an arrangement of the lamps shown in FIG. 7.

As shown in FIG. 24, the lamps 130b may be inclined so that the lights irradiated by the adjacent lamps 130b located in the outermost area in a radial direction overlap with each other on the object W to be processed. FIG. 24 is an illustrative cross-sectional view showing a variation of the arrangement of the lamps 130 shown in FIG. 7. This structure has an effect to increase the irradiation density of the lamps in the periphery of the object to be processed, and is further effective in preventing uneven heating between the center area and the peripheral area.

It should be noted that the arrangement of the grooves 143 is not limited to the concentric arrangement, and other arrangements such as, for example, a linear arrangement or a spiral arrangement may be used if such an arrangement satisfies the above-mentioned conditions. Moreover, in the present embodiment, since the opening configuration of the reflector 139 of the lamp 130 is circular, the irradiation configuration of the lamp light is circular. However, the lamp 130 does not have limitation in the irradiation configuration in view of the concept that the lamps having a large irradiation area located in the center of object W to be processed and the lamps having a small irradiation area are located in the peripheral area of the object W to be processed. For example, the configuration of the lamp 130 and/or the reflector 139 may be changed so that the irradiation area becomes a triangle. In addition, the configuration of the lamp light may not be limited to a triangle but may be other polygons such as a square or hexagon. Moreover, any irradiation approaches, which can provide similar effect, may be used.

A description will now be given of the configuration of the groove 143. The groove 143 has the same configuration as the lamp 130, and comprises a part 143c which accommodates the electrode part 132 of the lamp 130, a part 143d which accommodates the middle part 134 and a part 143e which accommodates the light-emitting part 136. The part 143c connects the electrode part 132 to a lamp driver 310 shown in FIG. 2, and serves as a seal part which gives a seal between the electrode part 132 and the lamp driver 310. The groove 143 has a thread (female screw) 147 formed on a part inscribing with the lamp 130. In the present embodiment, the thread 147 is a triangular screw thread which matches the thread formed on the lamp 130. It should be noted that the shape of the thread profile is not limited to the triangular profile, and if the thread 131 of the lamp 130 is a square screw or a trapezoidal screw thread, the thread 147 of the groove 143 is also formed to correspond to the thread 131 of the lamp 130. In addition, the groove 143 is formed so that the thread 147 optimally fits to the thread of the lamp 130 when the lamp 130 expands thermally. That is, when the lamp 130 is not thermally expanded, the outer and inner diameter and the pitch of the thread 147 formed in the groove 143 are slightly larger than that of the thread 131 formed on the lamp 130. However, the difference between the dimensions of the threads is such that insertion of the lamp 130 and engagement with the groove 134 are not prevented.

In the above-mentioned structure, the groove 143 and the lamp 130 have a relationship of a nut and a bolt. The lamp 130 can be attached to the groove 143 by inserting the lamp support part 142 into the groove 143 while rotating so as to engage the threads with each other. As shown in FIG. 19, when the lamp 130 is in a normal state where the lamp 130 does not expand thermally, the threads of the lamp 130 and the groove 143 engages with each other at surfaces in the direction of gravity. That is, a contact area is maintained between the lamp 130 and the groove 143. Although such a contact area is necessary to retain the lamp 130, there is a problem as mentioned below. The groove of the lamp support part of the conventional lamp has the same cylindrical shape with the lamp to be inserted into the groove. The groove is formed so that, when the lamp is thermally expanded and becomes a maximum size, the lamp completely fits in the groove. That is, in the conventional structure, when the lamp is not completely expanded, the cooling effect of the cooling pipe, which is provided in the lamp support part to cool the lamp, deteriorates since the contact area between the lamp and the groove is small. The present embodiment eliminates such a problem. Moreover, since the ridge of the thread 147 of the groove 143 is slightly larger than the ridge of the thread 131 of the lamp 130, there is formed a small space between the groove 143 and the lamp 130. The groove 143 and the lamp 130 are configured to fit with each other when the lamp 130 is heated and expanded thermally so that the small space permits the thermal expansion of the lamp 130 within the groove 143.

Furthermore, the configuration of the lamp 130 and the configuration of the groove 143 have the following advantages. If an output of a part of the lamps is increased, the part of the lamps may degrade faster. Moreover, the reflector also degrades faster if a larger power is supplied to the lamp. Therefore, a high-output lamp has a shorter service life than a low-output lamp. Similarly, a reflector for the high-output lamp has a shorter service life than a reflector for the low-output lamp.

Consequently, in order to exchange the lamp and reflector of which service life has expired located in the peripheral area of the lamp support part, it is required to exchange the entire lamp support part including the lamps and reflectors which area still usable, which is not an economical way. However, in the present embodiment, the groove 143 and the lamp 130 of the lamp support part 142 have a relationship of a nut and a bolt as mentioned above, and, thereby, the lamps 130 can be removed on an individual lamp basis.

Therefore, the usable lamps 130 can be continuously used by replacing only degraded lamps 130. Thus, the present embodiment solves the above-mentioned problem by constituting the lamps being easily replaceable on an individual lamp basis. Moreover, the present embodiment eliminates a replacement work of the entire lamp support part, which is complex and inconvenient, and, thus, there is a further advantage that the maintenance efficiency is improved.

Figure 20:
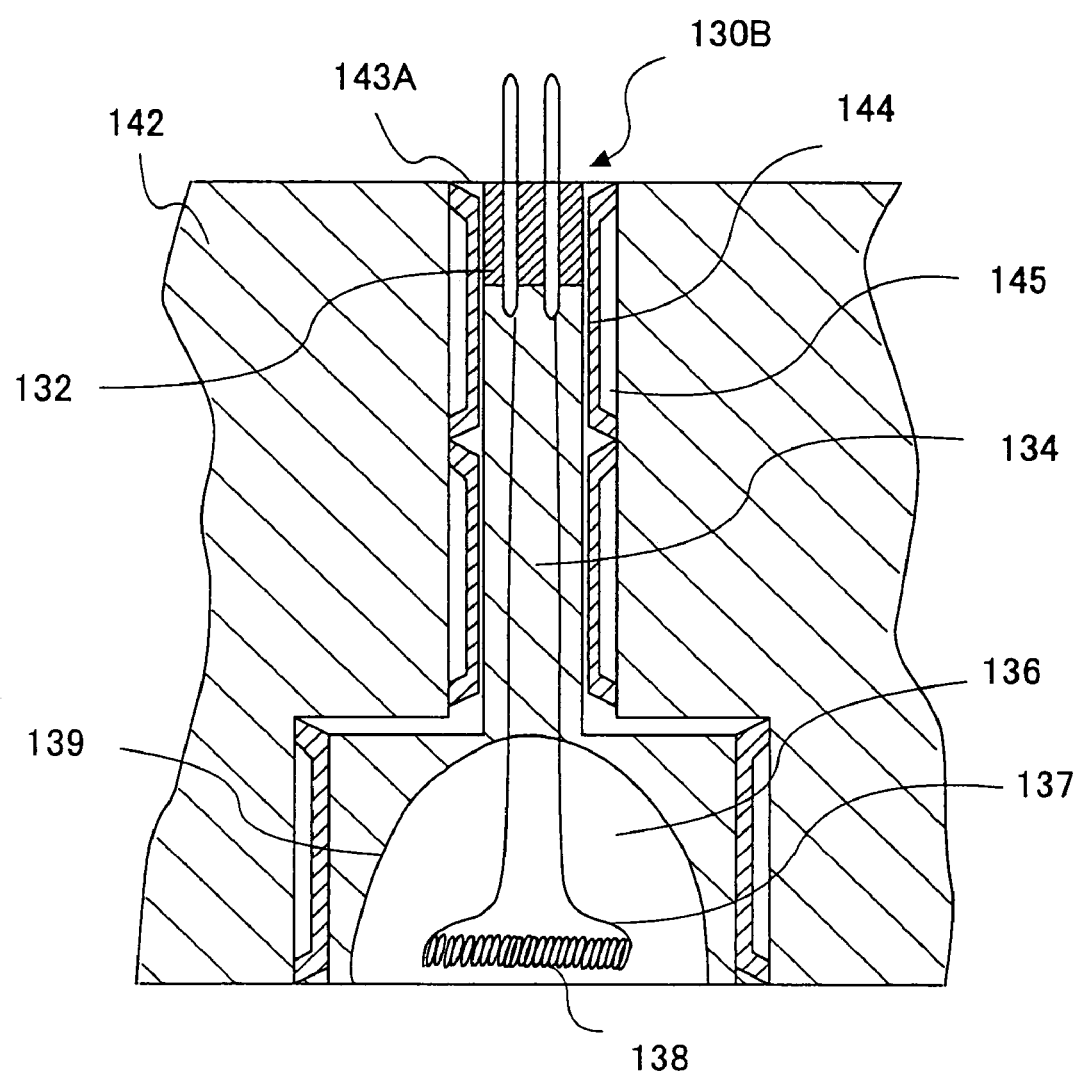
FIG. 20 is an illustrative cross-sectional view of a lamp support part of the heating unit shown in FIG. 6.
Figure 21:
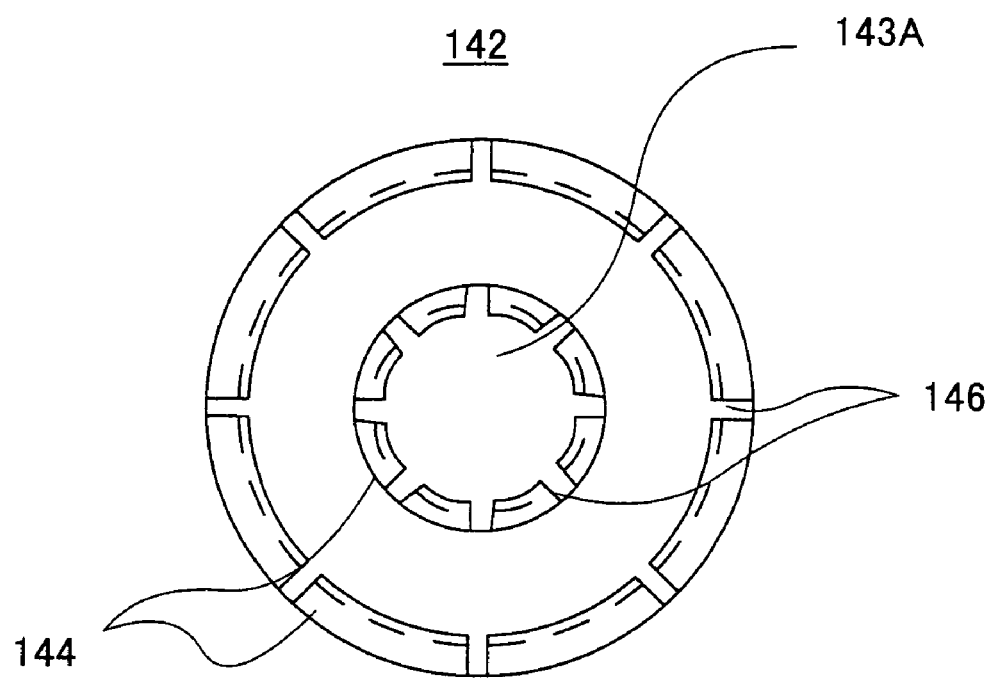
FIG. 21 is an illustrative bottom plan view of the lamp support part of the heating unit shown in FIG. 6.

A description will be given, with reference to FIGS. 20 and 21, of a groove 143A which is a variation of the groove 143 of the lamp support part 142. FIG. 20 is an illustrative cross-sectional view of the lamp support part 142 of the heating unit 140 shown in FIG. 6. FIG. 21 is an illustrative bottom plan view of the lamp support part 142 of the heating unit shown in FIG. 6. It should be noted that FIG. 21 shows a state where the lamp 130 is removed. The lamp 130 applicable to the groove 143A does not need the thread 131, and, thus, a lamp 130B having no thread is used.

The groove 143A has a slightly larger configuration than the lamp 130B so as to accommodate the lamp 130B therein. Moreover, the groove 143A has a plurality of thin plates 144 inscribed with an inner surface of the groove 134A. The thin plates 144 serves as leaf springs so as to hold the lamp 130B.

Each of the thin plates 144 is formed in a rectangle shape in the present embodiment, and is fabricated by an aluminum plate or a stainless steel plate. Each end of the thin plate 144 in a longitudinal direction is bent in the form of L-shape. Furthermore, each of the thin plates 144 has a curvature equal to the curvature of the side surface of the lamp 130B. As shown in FIGS. 20 and 21, the opposite ends of each of the thin plates 144 contact the inner surface of the groove 143A, and are joined to the inner surface by means of, for example, welding.

Each of the thin plates 144 forms a space 145 between the inner surface of the groove 143A and the thin plate 144. The space 145 is formed due to the bending process applied to the thin plate 144, and the space 45 can be set to a desired size by changing a position of a part to be bent. The space 145 is provided so that thin plate 144 can move outwardly in a radial direction of the groove 143A when the lamp 130B expands thermally within the groove 143A.

In the present embodiment, eight thin plates 144 are arranged along the inner surface of the groove 143A while maintaining a predetermined gap 146 between the adjacent thin plates 144. In this structure, the thin strips 144 together form a substantially octagonal cross section within the groove 143A. In addition, the gap 146 is set so that the adjacent thin plates do not contact with each other when the thin plates 144 is pressed and deforms in a radial direction of the groove 143A. Similarly, three thin plates 144 are arranged along the longitudinal direction of the groove 143A. That is, in the present embodiment, the groove 143A has 24 (=8×3) sheets of the thin plates 144 arranged on the inner surface thereof. Thus, the lamp 130B just or tightly fits in the groove 143A in a state where the thin plates 144 are provided in the groove 143A.

In above-mentioned structure, the groove 143A holds the lamp 130B by the action of the thin plates 144. More specifically, the lamp 130B is held by the groove 143A by being strongly pressed into the space defined by the thin plate 144. At this time, the thin plates 144 elastically deform due to the insertion of the lamp 130, and the lamp 130 is tightly fitted in the groove 143A. Therefore, the lamp 130B is held in the groove 143A by a restoration force and frictional force of the thin plates 144, and almost the entire side surface of the lamp 130B contacts the thin plates 144.

Moreover, even when the lamp 130B expands thermally, the lamp 130B is held within the groove 143A since the thin plates 144 follow the thermal expansion of the lamp 130B. Accordingly, the present embodiment eliminates the problem of less contact area between the lamp and inner surface of the groove into which the lamp is inserted, by providing the thin plates in the groove. Moreover, even in the above-mentioned structure, a partial replacement of the lamps can be carried out. That is, the usable lamps 130 can be continuously used by replacing only degraded lamps 130. Thus, the present embodiment solves the above-mentioned problem by constituting the lamps being easily replaceable on an individual lamp basis. Moreover, the present embodiment eliminates a replacement work of the entire lamp support part, which is complex and inconvenient, and, thus, there is a further advantage that the maintenance efficiency is improved.

It should be noted that the number of thin plates 144 and their configuration are not limited to that described above. For example, the space formed inside the groove by the thin plates 144 is not limited to the octagonal cross section, and a polygonal shape other than the octagonal shape may be used. However, it is preferable that the cross section can be regarded as a substantially circular shape. Although the preferable form of the groove 143 holding the lamp 130 has been explained, the present invention is not limited to the specifically disclosed embodiments, and other form may be used if the same action and effect can be obtained. Moreover, the form of the groove 143 is not limited to the use of the configuration of the lamp 130, and may be applied to other lams known in the art.

As shown in FIGS. 7 and 8, the isolation wall 148 is arranged between the adjacent grooves 143 which are arranged along the concentric circles. In the present embodiment, the thickness of the isolation wall 148 between the parts 143c is about 50 mm, and the thickness of the isolation wall between the parts 143e is about 10 mm. Moreover, the thickness of the isolation wall between the parts 143c of groove 143b is about 15 mm, and the thickness of the isolation wall between the parts 143e is about 5 mm. The isolation wall 148 is provided with a pair of cooling pipes (cooling water pipes) 149a and 149b. Hereinafter a cooling pipe 149 generically represents the cooling pipes 149a and 149b. More specifically, the cooling pipe 149a is located in the place corresponding to the electrode part 132 of the lamp 130, and the cooling pipe 149b is located in the place corresponding to the light-emitting part 136 of the lamp 130.

The cooling pipe 149 is connected to the temperature-control device which is not shown in the figure. The temperature-control device comprises the control part 300, a temperature sensor or thermometer and a heater. A cooling water is supplied to the temperature-control device from a water source such as a water line. Instead of the cooling water, other coolants such as alcohol, gurden, chlorofluorocarbon, etc. may be used. As for the temperature sensor, a well-known sensor such as, for example, a PTC thermistor, an infrared sensor or a thermocouple may be used. A temperature sensor or thermometer measures a temperature of the inner wall of the electrode part 132 and the light-emitting part 136 of the lamp 130. A heater is constituted by a wire heater wound on an outer surface of the cooling pipe 116. By controlling the magnitude of the current, which flows through the wire heater, the temperature of the water flowing through the cooling pipe 149 can be adjusted.

When the electrodes 133 are made of molybdenum, in order to prevent destruction of the electrodes 133 and seal part 143c due to oxidization of molybdenum, the cooling pipe 149a maintains the temperature of the seal part 143c at 350° C. or less. Moreover, the cooling pipe 149b maintains the temperature of the light-emitting part 136 at 250° C. to 900° C. so that the middle part 134 and the light-emitting part 136 maintain a halogen cycle. In the halogen cycle, the tungsten which constitutes the filament 137 evaporates and reacts with halogen gas, a tungsten-halogen compound is generated which floats inside the lamp 130. When the lamp 130 is maintained at 250° C. to 900° C., the tungsten-halogen compound maintains the floating state.

However, when the tungsten-halogen compound is carried to the vicinity of the filament 137 by convection, the tungsten-halogen compound is decomposed into tungsten and halogen gas due to the high-temperature of the filament 137. Then, the tungsten is deposited on the filament 137 and the halogen gas repeats the same reaction. It should be noted that, generally, if the temperature exceeds 900° C., devitrification (a phenomenon in which the light-emitting part 136 becomes white) may occur. On the other hand, if the temperature is below 250° C., blackening (phenomenon in which the tungsten-halogen compound adheres to the wall of the lamp 130, and becomes black) may occur.

In the present embodiment, the cooling pipe 149a is maintained at a temperature within the range of halogen cycle and which can prevent oxidization of molybdenum. Such a temperature preferably ranges from 250° C. to 350° C. Additionally, the cooling pipe 149b is maintained at a temperature within the range of halogen cycle, preferably at a temperature ranging from 800° C. to 900° C. Although the cooling temperature for the light-emitting part 136 can be in the range of 250° C. to 900° C., when the cooling efficiency is taken into consideration, the cooling temperature is preferably set to an upper limit temperature of the halogen cycle since cooling can be carried out with a less electric power.

The cooling pipe 149a is at the common temperature for halogen cycle and oxidization prevention of molybdenum, and the light-emitting part 136 is maintained by the cooling pipe 149b within the halogen cycle temperature range. Moreover, a temperature slope arises in the lamp 130 due to the separate cooling pipes 149a and 149b in accordance with the length of the middle part 134 of the lamp 130. The temperature slope (250° C. to 950° C.) maintains the entire lamp 130 within the halogen cycle temperature range. That is, although there is a possibility that the temperature (800° C. or 950° C.) of the light-emitting part 136 may influence the temperature (250° C. to 350° C.) of the seal part 143c if the light-emitting part 136 and the seal part 143c are close to each other such a problem is solved by providing the middle part 134 in the lamp 130 according to the present embodiment.

According to the present embodiment, devitrification and blackening of the lamp 130 can be suppressed. Moreover, the electrode part 132 and the seal part 143c are prevented form being damaged due to oxidization of the molybdenum of the electrodes 133. Furthermore, the lamp 130 is cooled so as to be at a temperature within the halogen cycle temperature range. A conventional cooling system of the lamp 130 merely cools the seal part 143c, and the cooling in accordance with the halogen cycle is not carried out. Therefore, the cooling pipe 149 according the present invention has an advantage of elongating the service life of the lamp 130. It should be noted that the contact area between the groove 143 and the lamp 130 is larger than that of the conventional structure as mentioned above, and it is possible to acquire a sufficient cooling effect.

It should be noted that instead of providing the isolation wall 148 between parts corresponding to the light-emitting parts 136 of the lamps 130, the space provided with the isolation wall 148 may be empty so as to carry out air cooling for the light-emitting parts 136. The seal part 143c shall be cooled by the above-mentioned cooling pipe 149a. Since the light-emitting part 136 is to be cooled at a relatively high temperature of 800° C. to 900° C., the light-emitting part 136 can be cooled by air cooling so as to obtain the same action and effect as mentioned above. The air cooling may be carried out by a known cooling system such as a blower, which carries out forced air cooling. Furthermore, another cooling method in which a common cooling pipe is provided so as to cool both the isolation wall 148 and the light-emitting part 136 may be used. In such a method, the cooling pipe may be cooled at a temperature of 250° C. to 350° C., which is a temperature common to both the oxidization prevention of molybdenum and the halogen cycle range. Even with the above-mentioned structure, the same effect as the above-mentioned cooling pipe 149 can be acquired.

A description will now be given of the radiation thermometer 200. The radiation thermometer 200 is provided on the opposite side of the lamp 130 with respect to the object W to be processed. Although the present invention does not exclude a structure in which the radiation thermometer 200 is provided on the same side with the lamp 130, it is preferable that a light form the lamp 130 is prevented from being incident on the radiation thermometer 200.

The radiation thermometer 200 is attached to a bottom part 114 of the process chamber 110. A surface of the bottom part 114 that faces inside the process chamber 110 serves as a reflective plate (high-reflectance surface) by being provided with gold plating. This is for the reason that is the surface of the bottom part 114 is a low-reflectance surface such as a black surface, the surface absorbs the heat emitted from the object W to be processed, which uneconomically requires an increase in the irradiation output of the lamp 130. The bottom part 114 has a cylindrical through hole. The radiation thermometer 200 can be any known device, and a description thereof will be omitted. The radiation thermometer 200 is connected to the control part 300, and the control part 300 computes a temperature T of the object W to be processed. It should be noted that an arithmetic part (not shown in the figure) provided in the radiation thermometer 200 may carry out the arithmetic operation of computing the temperature T. The control part 300 can obtain the temperature T of the object W to be processed from the radiation thermometer 200.

The control part 300 comprises a central processing unit (CPU) and a memory. The control part 300 carries out a feedback control of the output of the lamp 130 by recognizing the temperature T of the object W to be processed so as to control the lamp driver 310. In the present embodiment, the control part 300 continues to maintain the temperature of the lamp 130 in the halogen cycle temperature range by controlling the lamp driver 310 when an electric power is supplied to the lamp 130. That is, an electric power is continuously supplied to the lamp driver from a time when the driver 310 after a main switch of a cluster tool (not shown in the figure) including the heat treatment apparatus 100 is turned on and until the main switch of the cluster tool is turned off. At this time, an electric power is also continuously supplied to the lamp 130 through the lamp driver 310.

It should be noted that, as mentioned above, the lamp 130 is controlled within the halogen cycle temperature range. Therefore, the temperature of the lamp 130 rises to about 900 degrees C. at the time of heating, and is maintained at 250 degrees C. or more even at the time of cooling. The object W to be processed is heat-treated within this temperature range. It should be noted that the temperature control of the lamp 130 may be achieved by a feedback control in which an electric power to be supplied is varied using the temperature sensor or thermometer of the temperature-control system connected to the cooling pipe 149b. Alternatively, a function representing a relationship between the temperature of the lamp 130 and the function of the electric power to be supplied is calculated so as to supply an electric power to the lamp 130 based on a temperature expected according to the function.

In the conventional heat treatment apparatus, an electric power is not supplied to the lamp driver 310 and the lamp 130 except for a heat treatment operation. That is, a control is made to drive the lamp driver 310 so as to supply a desired electric power to the lamp 130 only at the time of heating. However, the filament 137 of the lamp 130 has a very small resistance at a room temperature, and will be almost in a short-circuit state at the moment of supply of a voltage. In such a state, even in a case where there is an external resistance, a current of seven to ten times the rated current value flows. When there is no external circuit resistance, a rush current of thirteen to seventeen times the rated current flows, which is an occurrence of a rush current phenomenon. In the heat treatment apparatus which rapidly turns lamps on and off in response to up and down of a temperature of the object W to be processed, the rush current phenomenon occurring at every power supply time is a cause of degradation of the lamps and the lamp driver.

In the present embodiment, the power supply to the lamp 130 is a necessary minimum thing related to a start of the cluster tool containing the heat treatment apparatus 100, and the lamp 130 is not turned on and off in response to up and down of the temperature of the object W to be processed. Accordingly, the present embodiment solves the problem mentioned above and can elongate the service life of the lamp 130 and the lamp driver 310. Moreover, the lamp 130 is controlled within the halogen cycle temperature range, which also contributes to the elongation of the service life of the lamp 130.

It should be noted that the cooling pipe 149 is provided for cooling the lamp 130, which facilitates to maintain the lamp 130 within the halogen cycle temperature range by a control cooperating with the lamp driver 130. Moreover, the present embodiment does not exclude the use of either the method of controlling the temperature of the lamp 130 or the method of controlling the temperature of the lamp 130 by the lamp driver 310.

The control part 300 controls a rotational speed of the object W to be processed by sending a drive signal to the motor driver 320 at a predetermined timing. The control part 300 also feedback-controls the output of the lamp 130 by recognizing the temperature of the lamp 130 in cooperation with the temperature control system.

The gags introducing part 180 includes a gas source, a flow adjust valve, a mass-flow controller, a gas supply nozzle and a gas supply passage interconnecting the aforementioned (not shown in the figure) so as to introduce a gas used for heat treatment into the process chamber 110. It should be noted that although the gas introducing part 180 is provided to the sidewall 112 of the process chamber 110 so as to introduce the gas into the process chamber from the side, the position of the as introducing part 180 is not limited to the side of the process chamber. For example, the gas introducing part 180 may be constituted as a showerhead, which introduces the process gas from an upper portion of the process chamber 110.

If the process to be performed in the process chamber 110 is an annealing process, the process gas includes $N_2$, Ar, etc.; if the process is an oxidation process, the process gas includes $O_2$, $H_2$, $H_2O$, $NO_2$, etc; if the process is a nitriding process, the process gas includes $N_2$, $NH_3$, etc.; if the process is a film deposition process, the process gas includes $NH_3$, $SiH_2$, $Cl_2$, $SiH_4$, etc. It should be noted that the process gas is not limited the above-mentioned gasses.

The mass-flow controller is provided for controlling a flow of the process gas. The mass-flow controller comprises a bridge circuit, an amplification circuit, a comparator control circuit, a follow adjust valve, etc. so as to control the flow adjust valve by measuring a gas flow by detecting an amount of heat transmitted from the upstream side to the downstream side in association with the gas flow. The gas supply passage uses a seamless pipe and a bite-type coupling or a metal gasket coupling so as to prevent impurities from entering the gas to be supplied. Additionally, the supply pipe is made of a corrosion resistant material so as to generation of dust particles due to dirt or corrosion on an inner surface of the supply pipe. The inner surface of the supply pipe may be coated by an insulating material such as PTFE (Teflon), PFA, polyimide, PBI, etc. Additionally, the inner surface of the supply pipe may be subjected to an electropolishing. Further, a dust particle filter may be provided to the gas supply passage.

In the present embodiment, although the exhaust part 190 is provided parallel to the gas introducing part 180, the position and the number are not limited to that shown in the figure. The exhaust part 190 is connected to a desired exhaust pump, such as a turbomolecular pump, a sputter ion pump, a getter pump, a sorption pump, a cryostat pump, together with a pressure adjust valve. It should be noted that although process chamber is maintained at a negative pressure environment in the present embodiment, such a structure is not an essential feature of the present invention. That is, for example, the process chamber may be maintained at a pressure ranging from 133 Pa to an atmospheric pressure. The exhaust part 190 has a function to exhaust helium gas before starting a subsequent heat treatment.

A description will now be given, with reference to FIG. 2, of a rotating mechanism of the object (wafer) W to be processed. In order to maintain a good electric characteristic of each element in an integrated circuit and a high yield rate of products, a uniform heat treatment is required over the entirety of the surface of the object W to be processed. If a temperature distribution on the surface of the wafer W is uneven, the RTP apparatus 100 cannot provide a high-quality heat treatment since a thickness of a film produced by a film deposition process may vary and a slip may be generated in the wafer W due to a thermal stress.

The uneven temperature distribution on the surface of the object W to be processed may be caused by an uneven irradiance distribution or may be caused by a process gas, which is supplied near the gas introducing part 180, absorbing heat from the surface of the wafer W. The rotating mechanism rotates the object W to be processed, which enables a uniform heating by the lamps 130 over the entire surface of the object W to be processed.

The rotating mechanism of the object W to be processed comprises the support ring 150, the permanent magnet 170, a ring-like magnetic member 172, a motor driver 320 and a motor 330.

The support ring 150 has a ring shape and is made of a heat resistant ceramic such as SiC. The support ring 150 serves as a placement stage on which the object W to be processed is placed. The support ring 150 supports a periphery of the backside of the object W to be processed. If necessary, the support ring 150 may be provided with an electrostatic chuck or a clamp mechanism so as to fix the wafer to the support ring 150. The support ring 150 is configured and arranged to prevent heat form being released from an outer edge of the object W to be processed so that the uniform heating of the wafer W is not deteriorated.

The support ring 150 is connected to the support part 152 at outer end thereof. If necessary, a heat insulating member formed on quartz glass is interposed between the support ring 150 and the support part 152 so as to thermally protect the magnetic member 172. In the present embodiment, the support part 152 is formed as an opaque quartz member having a hollow cylindrical shape. The bearing 160 is fixed to the support part 152 and the inner wall of process chamber 110 so as to allow a rotation of the support part 152 while maintaining the negative pressure environment of the process chamber 110. The magnetic member 172 is attached to the lower end of the support part 152.

The ring-like permanent magnet 170 and magnetic member 172, which are concentrically arranged, are magnetically coupled with each other, and the permanent magnet 170 is rotated by the motor 330. The motor 330 is driven by the motor driver 320, which is controlled by the control part 300.

Consequently, when the permanent magnet 170 rotates, the magnetically coupled magnetic member 172 is rotated together with the support part 152, which results in rotation of the support ring and the object W to be processed. Although the rotation speed in the present embodiment is 90 r.p.m., the rotation speed may be determined based on a material and size of the object W to be processed and a type and temperature of the process gas so that there is less effect of turbulence of gas within the process chamber 110 and stream of gas due to the rotation of the object W to be processed. The permanent magnet 170 and the magnetic member 172 may be reversed as long as they are magnetically coupled, or the magnetic member 172 may also be formed of a permanent magnet.

A description will now be given of an operation of the RTP apparatus 100. First, the object W to be processed is carried in the process chamber 110 through a gate valve (not shown in the figure) by a conveyance arm of a cluster tool (not shown in the figure). When the conveyance arm supporting the object W to be processed reaches above the support ring 150, a lifter pin vertically moving system moves lifter pins (for example, three lifter pins) upward so as to protrude the lifter pins from the support ring 150 to support the object W to be processed. As a result, the wafer is transferred from the conveyance arm to the lifter pins, and, then, the conveyance arm returns out of the process chamber 110 through the gate valve. Thereafter, the gate valve is closed. The conveyance arm may return to a home position (not shown in the figure).

The lifter vertically moving mechanism retracts the lifter pins below the surface of the support ring 150, thereby placing the object W to be processed on the support ring 150. The lifter pin vertically moving mechanism may use a bellows so as to maintain the negative pressure environment in the process chamber 110 and prevent the atmosphere inside the process chamber 110 from flowing out of the process chamber 110 during the vertically moving operation.

Figure 25:
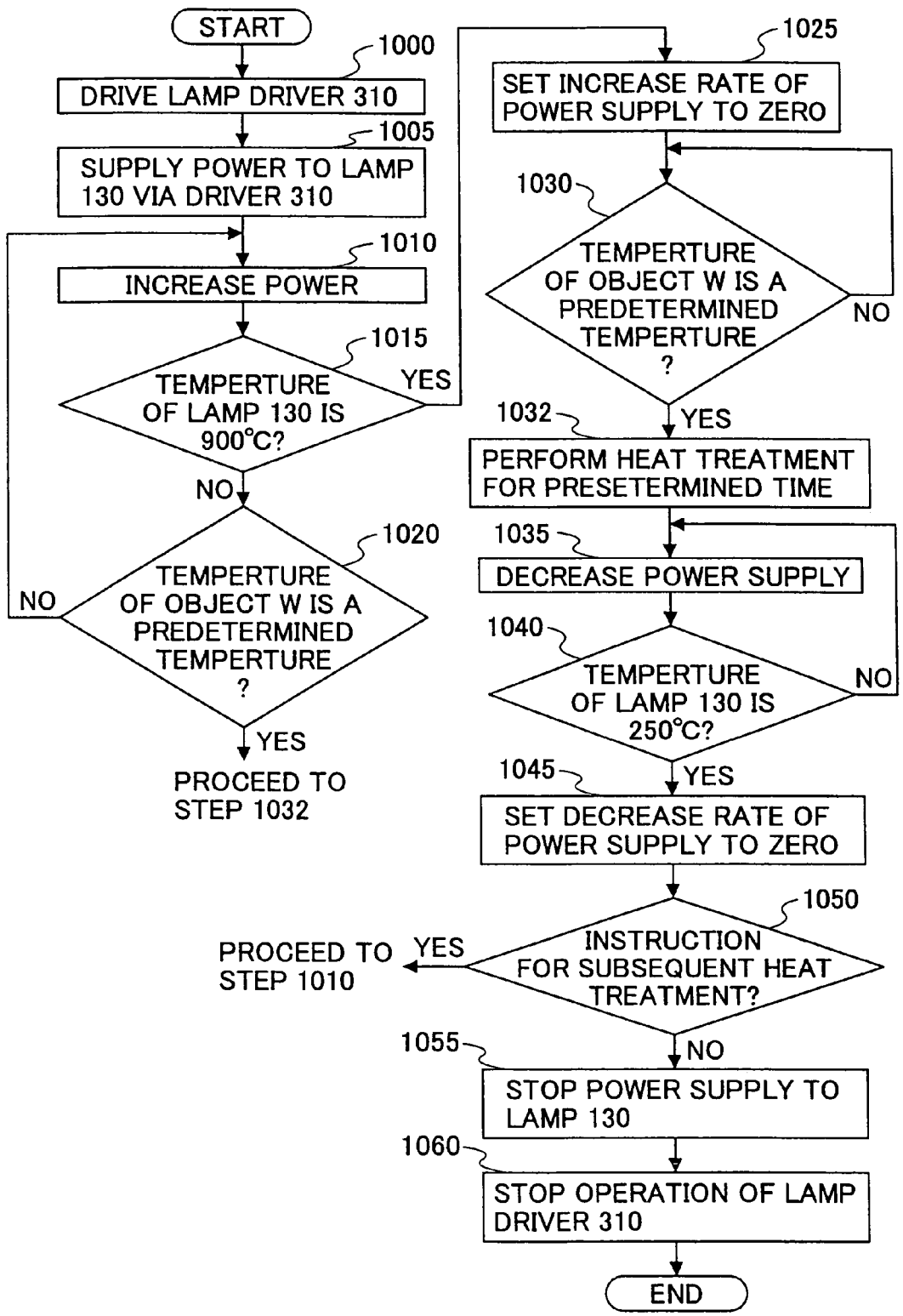
FIG. 25 is a flowchart of an operation to drive the lamps.

Thereafter, the heat treatment apparatus 100 carries out heat treatment. FIG. 25 is a flowchart of an operation to drive the lamps 130. Referring to FIG. 25, the control part 300 drives the lamp driver 310 in step 1000 so as to supply an electric power to the lamps 130 in step 1005. In response, the control part 300 further increases, in step 1010, the electric power supplied to the lamps 130 through the lamp driver 310. Then, the control part 300 determines, in step 1015, whether or not the temperature of the lamps 130 (the temperature of the light-emitting part 136) is 900° C. After the temperature of the lamps 130 reaches 900° C., which is an upper limit value of the halogen cycle, the control part 300 maintains, in step 1025, the value of the electric power to the lamps 130 through the lamp driver 310 by setting an increasing rate of the supplied electric power to zero. Thereby, the object W to be processed is heated by the radiation of the lamps 130. The control part 300 determines, in step 1030, whether or not the object W to be processed is at a predetermined temperature, for example, 800° C. After the temperature of the object W to be processed reaches 800° C., the heat treatment apparatus 100 carries out a predetermined heat treatment in step 1032. It should be noted that if the temperature of the object W to be processed reaches the predetermined temperature before the temperature of the lamps 130 reaches 900° C., the routine immediately proceeds to step 1032 so as to carry out the heat treatment.

A heat ray (radiation light) emitted by the lamps 130 is irradiated onto the surface of the object W to be processed by passing through the quartz window 120 so as to rapidly heat the object W to be processed at 800° C. Generally, a periphery of the object W to be processed tends to release a greater amount of heat than the center portion thereof. However, the lamps 130 of the present embodiment can provide a high directivity and temperature control capability by the concentrically arranged lamps 130a and 130b.

Figure 26:
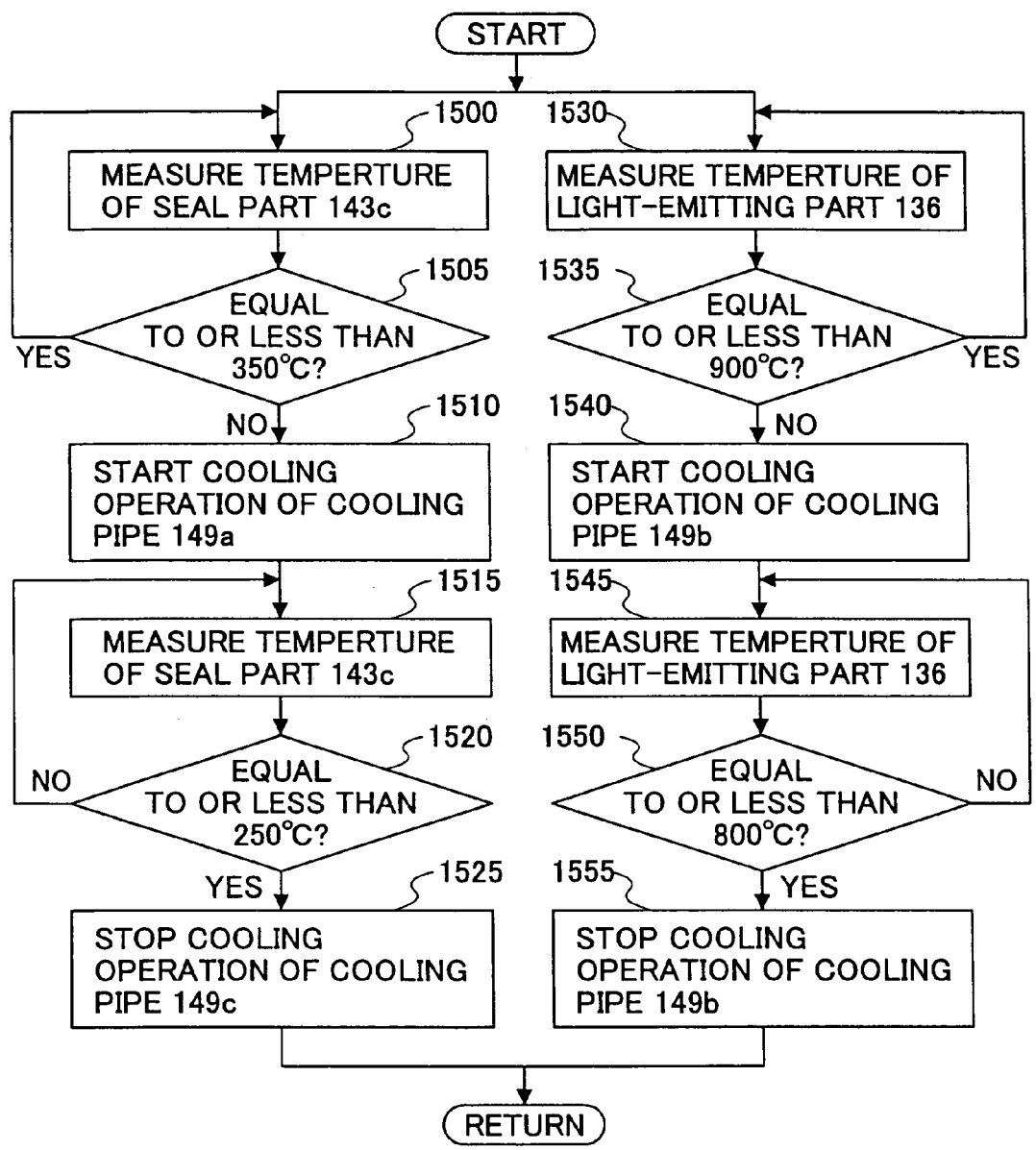
FIG. 26 is a flowchart of a control operation for cooling the lamps.

Thereafter, the control part 300 controls the temperature control system so as to cool the lamps 130. That is, the control part 300 carries out a feedback control in accordance with information from a thermometer (not shown in the figures) so as to control the temperature of the cooling pipe 149a so that the temperature of the seal part 143c falls in a range from 250° C. to 350° C., preferably at 300° C. FIG. 26 is a flowchart of a control operation for cooling the lamps 130. Referring to FIG. 26, the control part 300 measures the temperature of the seal part 143c in step 1500. The control part 300 determines, in step 1505, whether or not the temperature of the seal part 143c is equal to or less than 350° C. If the temperature of the seal part 143c is equal to or less than 350° C., the routine proceed to step 1510 to start cooling the cooling the seal part 143c by using the cooling pipe 149a. Then, the control part 300 measures, in step 1515, the temperature of the seal part 143c, and determines, in step 1520, whether or not the temperature of the seal part 143c is equal to or less than 250° C. If the temperature of the seal part 143c is equal to or less than 250° C., the cooling operation is stopped in step 1525, and otherwise the cooling operation is continued until the temperature reaches 250° C. Thus, the temperature of the seal part 143c is maintained within a range from 250° C. to 350° C. by repeating the above-mentioned process.

Similarly, a temperature of the light-emitting part 136 is controlled by the process of steps 1530 through 1555. That is, the temperature of the light-emitting part 136 is controlled to fall within a range from 800° C. to 900° C., preferably at 850° C., by adjusting the temperature of the cooling pipe 149b. Such a control prevents oxidation of molybdenum constituting the electrodes 133 of the electrode part 132 of the lamp 130. Additionally, the light-emitting part 136 of the lamp 130 is controlled within the halogen cycle. Consequently, the factors causing a damage of the lamp 130 is eliminated, and elongation of the service life of the lamp 130 can be achieved.

At the same time the control part 300 controls the motor driver 320 to send an instruction to drive the motor 330. In response to the instruction, the motor driver 320 drives the motor 330 so as to rotate the ring-like magnet 170. As a result, the support part 152 (or 152A) rotates, and the object W to be processed rotates together with the support ring 150. Since the object W rotates, the temperature within the surface of the object W to be processed is maintained uniform during the heat treatment process.

During the heating, the window 120 provides some advantages since the plate 121 of the window 120 has a relatively small thickness and a high thermal conductivity. The advantages includes:

1) thermal spots hardly occurs in the object W to be processed since the window 120 uniformly transmits a light from the lamp 130;

2) the irradiation efficiency to the wafer W is not deteriorated since the quartz window 120 having the reduced thickness absorbs less heat;

3) a thermal stress fracture hardly occurs since the temperature difference between the front and back surfaces of the plate 121 is small;

4) in a case of a film deposition process, a deposition film and byproduct are hardly formed on the surface of the plate 121 since a temperature rise in the surface of the plate 12e is small; and 5) a pressure difference between the negative pressure in the process chamber 110 and the atmospheric pressure can be maintained even if the thickness of the plate 121 is small since the mechanical strength of the window 120 is increased by a high bending strength of translucent ceramics.

The temperature of the object W to be processed is measured by the radiation thermometer 200, and the control part 300 feedback-controls the lamp driver 310 based on the result of measurement. Since the object W to be processed is rotated, the temperature distribution on the surface of the object W is supposed to be uniform. However, if necessary, the radiation thermometer 200 may measure a temperature at a plurality of points (for example, the center and periphery) on the surface of the object W to be processed so that the control part 300 sends an instruction to change the output of the lamps with respect to a specific area of the object W when the result of measurement of the radiation thermometer 200 indicates that the temperature distribution on the surface of the object W to be processed is not uniform.

Returning to the process of FIG. 25, after the object W to be processed is heated at the desired temperature, a process gas is introduced into the process chamber 110 through the gas introducing part (not shown in the figure). After the heat treatment (for example, 10 seconds) is completed in step 1032, the control part 300 controls the lamp driver 310, in step 1035, so as to decrease the electric power supplied to the lamps 130. Then, the lamp driver 310 checks, in step 1040, whether or not the temperature of the lamps 130 is equal to 250° C. If the temperature of the lamps 130 is equal to 250° C., the control part 300 maintain, in step 1045, the amount of electric power supplied to the lamps 130 by setting the decreasing rate of the electric power to zero. Otherwise, the routine returns to step 1035 to further decrease the temperature of the lamps 130.

After the heat treatment, the wafer W is carried out of the process chamber 110 by the conveyance arm of the cluster tool through the gate valve in the reverse sequence. Thereafter, if necessary, the conveyance arm conveys the wafer W to a next stage apparatus such as a film deposition apparatus. If the control part receives, in step 1050, an instruction for a subsequent heat treatment to be performed, the control part 300 repeats the above-mentioned process so as to carry out the heat treatment by returning to step 1010. If there is no instruction for a subsequent heat treatment, the power supply to the lamps 130 is stopped in step 1055, and then the operation of the lamp driver 310 is stopped in step 1060.

In the above-mentioned series of heat treatment process, the lamp driver 310 and the lamps 130 are turned on only once at an initial operation of the heat treatment, and the power is not necessarily turned on and off so as to control the temperature of the object W to be processed. That is, according to the heat treatment method of the present embodiment, a rush current is generated only once, which enables elongation of the service life of the lamp 130 and the lamp driver 310. Additionally, since the temperature of the lamp 130 is controlled within the halogen cycle temperature range, this also contributes the elongation of the service life of the lamp 130.

Second Embodiment

A description will now be given of a heat treatment apparatus according to a second embodiment of the present invention.

The heat treatment apparatus according to the second embodiment of the present invention has basically the same structure as the above-mentioned heat treatment apparatus according to the first embodiment shown in FIG. 2 except for the lamp 130 provided in the heating unit 140. Thus, descriptions of the entire structure of the heat treatment apparatus according to the second embodiment of the present invention will be omitted.

Figure 27:
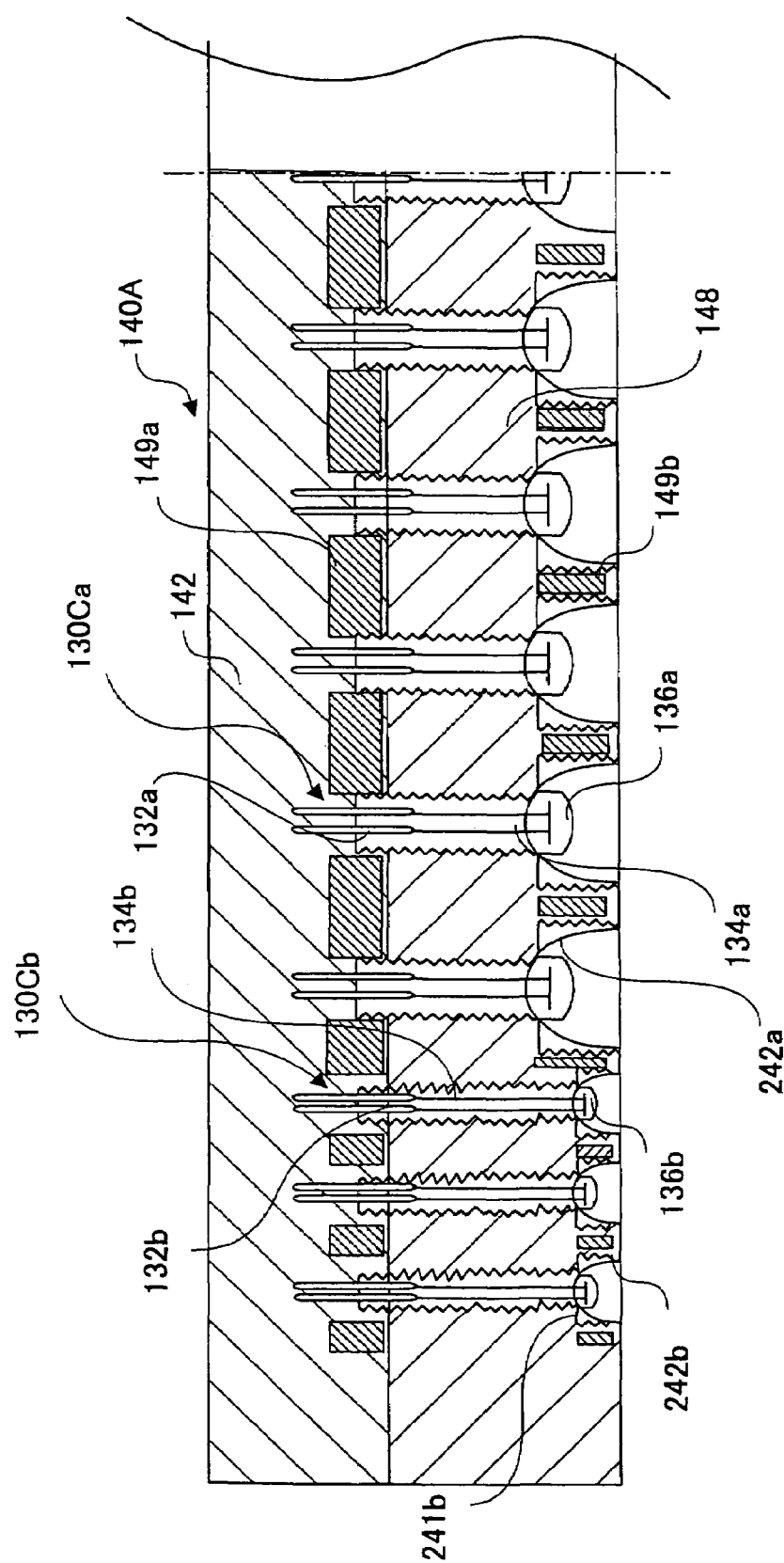
FIG. 27 is a cross-sectional view of a heating unit provided in a heat treatment apparatus according to a second embodiment of the present invention.
Figure 28:
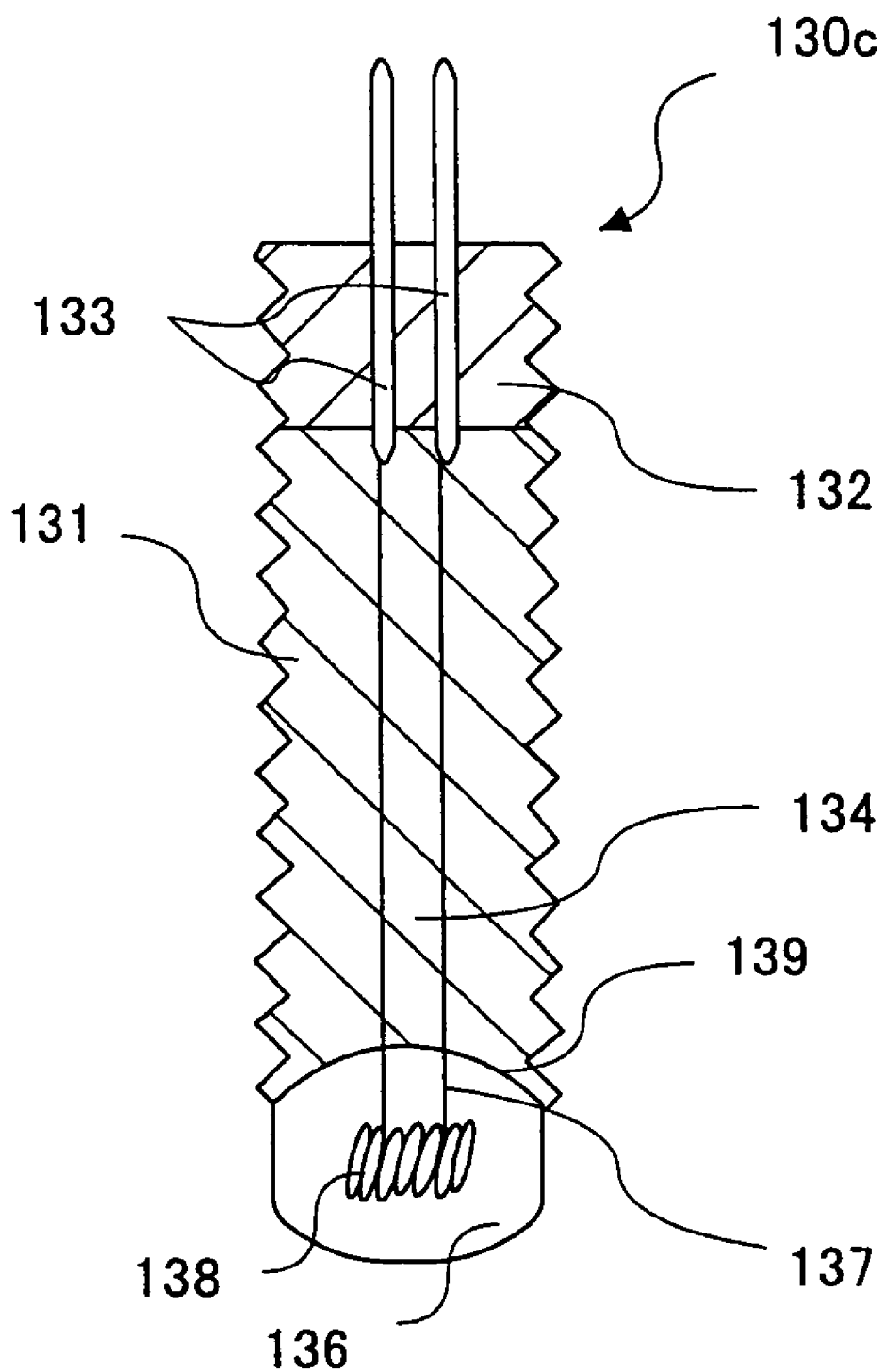
FIG. 28 is an illustrative cross-sectional view of a lamp provided in the heating unit shown in FIG. 27.

FIG. 27 is a cross-sectional view of a heating unit 140A provided in the heat treatment apparatus according to the present invention. FIG. 28 is an illustrative cross-sectional view of a lamp 130C provided in the heating unit 140A shown in FIG. 27. In FIGS. 27 and 28, parts that are the same as the parts shown in FIGS. 7 and 9 are given the same reference numerals, and descriptions thereof will be omitted.

The heating unit 140A is provided with a plurality of lamps 130 that includes large-diameter lamps 130Ca and small-diameter lamps 130Cb. The large-diameter lams 130Ca correspond to the lamps 130a shown in FIG. 9, and the small-diameter lamps 130Cb correspond to the lamps 130b shown in FIG. 10.

Here, the lamp 130 generically represents the lamp 130Ca and the lamp 130Cb. In the present embodiment, the heating unit 140A is separated from the object W to be processed so that a distance between the irradiation surface of the lamp 130 and the object W to be processed is set to about 40 mm.

Although the lamp 130 is a single-end type in the present embodiment, other energy source such as an electric wire heater may be used. Here, the single-end type refers to a kind of lamp which has a single electrode part 132 as shown in FIG. 28. Although the lamp 130 has the function to heat the object W to be processed and is a halogen lamp in the present embodiment, a lamp applicable to the heating unit 140A is not limited to a halogen lamp. Moreover, although an output of the lamp 130 is determined by the lamp driver 310, the lamp driver 310 is controlled by the control part 300 as described later and supplies an electric power to the lamp 130. It should be noted that in the present embodiment, the electric power supplied to the lamp 130 is controlled by the control part 300 so that the power density of the lamp 130b is larger than the power density of the lamp 130a. Specifically, the lamp 130Cb has a power density two to three times that of the lamp 130Ca.

Typically, the lamp 130 has a single electrode part 132, a middle part 134, a light-emitting part 136 connected to the electrode part 132 via the middle part 134, and a reflector 241. The light-emitting part 136 comprises a coil 138 part and a reflector 139. The coil part 138 is provided to a filament 137 connected to the electrode part 132 via the middle part 134. In the present embodiment, a thread (external thread) 131 is formed on a side of the lamp support part 142, which faces a groove 143 described later. The thread 131 is a triangular screw thread in the present embodiment, and a generally triangle-shaped ridge is formed. It should be noted that the thread 131 is not limited to the above-mentioned configuration, and may be a square thread or a trapezoidal thread. However, the lamp 130 does not always require the thread 131, and the lamp 130 having no thread may be used.

The electrode part 132 has a pair of electrodes 133 and is connected with the lamp driver 310 electrically through the lamp support part 142. The electrodes 133 are electrically connected to the filament 137. The electric power supplied to the electrode part 132 is determined by the lamp driver 310, and the lamp driver 310 is controlled by the control part 300. A seal part 143c mentioned later connects between the electrode part 132 and the lamp driver 310.

The middle part 134 is formed airtight with the light-emitting part 136. Nitrogen, argon or halogen-gas is enclosed within the interior of the middle part 134. The middle part 134 is a cylinder, which is located between the electrode part 132 and the light-emitting part 136 and has a predetermined length so as to separate the electrode part 132 and the light-emitting part 136 from each other. The middle part 134 has an advantage in that the length thereof is preferable for the temperature control of the lamp 130 described later. It should be noted that since the filament 137 positioned inside the middle part 134 emits a light, it is natural that the filament is a part of the light-emitting part 136. However, in this specification, since the electrode part 132 and the light-emitting part 136 (the part which emits light most strongly) are separated by a predetermined distance, this area is defined merely defined as the middle part 134. In the present embodiment, the middle part 134 is formed of ceramics. However, the middle part 134 may be formed of a metal other than ceramics, such as aluminum or SUS (stainless steel).

The light-emitting part 136 refers to a part, which emits a light in the lamp 130. The light-emitting part 136 has a side surface configuration such as a hemisphere, an ellipse hemisphere or a cylinder, and is formed of quartz or glass. In addition, as mentioned above, the light-emitting part 136 is formed integral and airtight with the middle part 134, and halogen gas is enclosed therein.

The light-emitting part 136 has a coil part 138 of a filament 137, which is a luminescent part, and a reflective means 139 therein. The coil part 138 may be any kind of types such as a single coil or a double coil. The configuration of the coil part 138 can also be made into an arbitrary configuration such as a parallel arrangement of a plurality of coils. The reflective means 139 is located at a position opposite to the object W to be processed with respect to the coil part 138 so as to reflect a light emitted from the coil part 138, which travels away from the object W to be processed in the longitudinal direction of the lamp 130. Furthermore, the reflective means 139 has a configuration having a top located along the axial center in the longitudinal direction of the lamp 130, such as a cone or a hemisphere.

More specifically, as shown in FIG. 28, the reflective means 139 forms a domal shape, such as a hemisphere, a half-ellipse sphere or a circular cone, in cooperation with a reflective area 242 of a reflector 241 described later. By providing the reflective means 139 in the lamp 130, the light which travels toward the middle part 134 of the lamp 130 can be reflected, and the light can be irradiated efficiently onto the object W to be processed.

In the present embodiment, a thread 131 is formed on the middle part 134 and the electrode part 132 of the lamp 130. The thread 131 can fits to the groove 143 formed in lamp support part 142 mentioned later. Accordingly, it is preferable that the middle part 134 and the electrode part 132 of the lamp 130 are formed of a material mentioned above in consideration with its mechanical strength and machinability. However, the lamp 130 of the present invention is not limited to such a material, and the middle part 134 of the lamp 130 may be a cylindrical member formed of quartz or translucent ceramics like the light-emitting part 136. However, when such a structure is used in the present embodiment, a cover must be provided to the lamp 130 so as to provide a mechanical strength and machinability. A material of the cover preferably has a high thermal conductivity so as not prevent cooling of the lamp 130 as mentioned later.

Reflectors 241a and 241b cover the light-emitting parts 136a and 136b of Lamps 130a and 130b respectively, so as to reflect the light of the lamp 130 toward the object W to be processed. It should be noted that the reflector 241 generically represents the reflector 241a and the reflector 241b. The reflector 241 has a cylindrical shape the same as the groove 143, and a thread (male thread) 144 engageable with the groove 143 is formed on a side surface which is brought into contact with an inner surface of the groove 143. As mentioned later, the thread 147 engageable with a thread 244 of the reflector 241 is formed on the inner surface of the groove 143, and, thereby, the lamp 130 is detachable from the lamp support part 142 together with the reflector 241.

The reflector 241 includes the reflective area 142, which reflects the lamp light toward the object W to be processed. The reflector 241 has an opening 243a for inserting the light-emitting part 136 of the lamp 130 into the reflective area 242 and an opening 243b from which a lamp light is projected. This opening 243a is formed in a shape substantially the same as the light-emitting part 136 of the lamp 130 so that the light-emitting part 136 of the lamp 130 and the reflector 241 are detachably attached. On the other hand, the opening 243b has the same configuration as the opening of the reflective area 242 mentioned later, and the light projected from the coil part 138 of the light-emitting part 136 is irradiated onto the object W to be processed through the opening 243b.

Moreover, for example, a non-penetrating hole or a protrusion may be provided to a bottom surface of the cylindrical reflector 241 so as to facilitate detachment of the reflector 241. It should be noted that although the reflector 241 has the opening 243a so as to be detachable attached to the light-emitting part 136 of the lamp 130 and the lamp support part 142 in the present embodiment, the reflector 241 may be formed integrally with the light-emitting part 136. In the present embodiment, the body of the lamp including the light-emitting part 136 and the reflector 241 can be detachable attached individually, thereby increasing convenience of attachment and detachment of the lamp 130 as mentioned later.

The reflective area 242 has a domal shape such as a convex which protrudes away from the object W to be processed so as to cover the light-emitting part 136 of the lamp 130. It should be noted that it is impossible for the reflective area 242 to form a perfect domal shape due to presence of the opening 243a. However, the reflective area 242 of the reflector 241 can form a substantially perfect domal shape in cooperation with the reflective means 139 of the lamp 130 as mentioned above. Therefore, the opening 243a does not become a factor, which generates a reflective loss of the lamp 130. It should be noted that the reflective means 139 of the lamp 130 can also be interpreted as a part of the reflector 241.

More specifically, the domal shape may be formed in a hemisphere configuration so that the light projected from the coil part 138 may travel toward the opening 243b of the reflector by efficiently reflected, preferably by one time reflection. The configuration of the reflector 241 may not be limited to a hemisphere configuration, but may be in other configurations, if the above-mentioned action and effect can be achieved. For example, the reflective area 242 may have a shape of a half-ellipse globular form or a circular cone.

The reflective area 242 is formed of aluminum (Al). Since the surface of the reflective area 242, which covers the coil part 138, is coated by a high-reflectance film so as to efficiently reflect a light including a visible light and an infrared light. As a material of the coating, nickel (Ni), gold (Au) or rhodium (Rh) is preferably used. As a method of coating, it is preferable to carry out the coating by plating Ni and Au on an aluminum material or plating Ni, Au, Rh and Au on an aluminum material sequentially in that order.

The reflector 241 has the function to reflect a light emitted by the coil part 138 of the filament 137 by the reflective area 242 and the reflective means 139 of the lamp 130, and also has a function to improve the directivity of the lamp 130. More specifically, the reflector efficiently reflects the light emitted by the coil part 138 of the filament 137 by the domal shape formed by the reflective area 242 and the reflective means 139 of the lamp 130, preferably with one time reflection, and irradiates the reflected light onto the object W to be processed, and also converges the light in a direction substantially perpendicular to the surface of the object W to be processed. That is, the light emitted by the lamp 130 is concentrated into a range in the tangential direction of the opening 243*b* of the reflector 241. Thus, since there is little number of times of reflection by the reflector 139, the light emitted by the lamp 130 of the present embodiment reaches the object W to be processed, with little energy loss, and has excellent directivity.

Conventionally, there is a problem in that the energy of light decreases due to a reflective loss associated with a multiple reflection of the reflector. The present embodiment eliminates such as problem. Therefore, since the irradiation efficiency of the lamp 130 with respect to the object W to be processed can be higher than the conventional lamp, a high-speed temperature rise can be attained with a low power consumption. It should be noted that a radius of curvature and the configuration of the opening of the reflector 241 may be changed depending on a directivity required to the lamp 130.

Referring to FIGS. 6 and 27, the lamp support part 142 which functions as a lamp house with has a substantially rectangular parallelepiped shape, and has the grooves (holes) 143 which contain the respective lamps 130C and isolation wall 148. Each groove 143 serves as a lamp accommodation part which accommodates the lamp, and comprises a groove 143*a* which accommodates the lamp 130Ca and a groove 143*b* which accommodates the lamp 130Cb. It should be noted that the groove 143 generically represents the grooves 143*a* and 143*b*. The configuration of the groove 143 will be described later, and a description will be given below of an arrangement of the grooves 143.

As shown in FIG. 6, the groove 143*a* is formed along concentric circles arranged in an area from the center of the lamp support part 142 (a position corresponding to the center of the object W to be processed) to the vicinity of the support ring 150 in a radial direction. More specifically, a plurality of grooves 143*a* are formed along the concentric circles of which radius is increased by a first distance from the center so that the center of each of the grooves 143*a* is positioned on the corresponding concentric circles. The first distance is set to about 0.5 to 1.5 times a half-value width of a radiation distribution. The half-value width corresponds to a width of the radiation distribution when an intensity of the light of the lamp 130Ca is one half of a peak value. In the present embodiment, the lamp 130Ca shows the half-value width of about 40 mm in a direction of radiation of the lamp light at a point about 40 mm from the projecting surface 136*b*. The distance of 40 mm corresponds to the distance between the lamp 130 and the object W to be processed. It should be noted that the half-value width differs from lamp to lamp, and the present invention is not limited to this value. Moreover, in the present embodiment, since the cooling pipe 149 mentioned later is provided in the light-emitting-part 136, the first distance is set to 50 mm (1.25 times the half-value width) which is a lager value than the diameter of the light-emitting part 136 of the lamp 130Ca. It should be noted that the concentric circles may be extended to the location at which the concentric circles do not overlap with a groove 143*b* mentioned later. Moreover, it is preferable that an interval between the grooves 143*a* arranged along one of the concentric circles be set equal to the first distance.

On the other hand, the grooves 143*b* are formed along a plurality of concentric circles within and in the vicinity of an area where the support ring 150 overlaps with the object W to be processed. More specifically, the grooves 143*b* are arranged along first, second and third circles C1, C2 and C3. The first circle is located within the area where the support ring 150 overlaps with the object W to be processed. The second circle C2 has a radius larger than the radius of the first circle by a second distance. The third circle C3 has a radius smaller than the radius of the first circle by the second distance.

It should be noted that the second distance is set to about 0.5 to 1.5 times the half-value width of a radiation distribution of the lamp 130Cb. The lamp 130Cb shows the half-value width of about 20 mm in a direction of radiation of the lamp light at a point about 40 mm from the projecting surface 136*b*. In the present embodiment, the distance of 40 mm corresponds to the distance between the lamp 130C and the object W to be processed. It should be noted that the half-value width differs from lamp to lamp, and the present invention is not limited to this value. Moreover, similar to the grooves 143*a*, since the cooling pipe 149 mentioned later is provided in the light-emitting-part 136, the second distance is set to 25 mm (1.25 times the half-value width). Moreover, it is preferable that an interval of the grooves 143*b* along one of the circles be set equal to the second distance.

In the present embodiment, although the grooves 143*b* are formed along the three circles C1, C2 and C3, the number of circles is not limited to three and may be changed to an appropriate value. As mentioned above, the grooves 143*b* are formed so that the lamps 130Cb can irradiate the area where the support ring 150 and the object W to be processed overlap with each other. For example, when the object W to be processed is larger than the circle C2, additional grooves 143*b* may be arranged along a circle having a diameter larger than the diameter of the circle C2 by a length equal to the second distance. Similarly, when the support ring 150 is smaller than the circle C3, additional grooves 143*b* may be arranged along a circle having a diameter smaller than the diameter of the circle C3 by a length equal to the second distance.

In the structure mentioned above, the lamp support part 142 enables arrangement of the lamps 130Ca at the positions in the vicinity of the object W to be processed and the lamps 130Cb in the part where a support ring 150 overlaps with the object W to be processed and in the vicinity of the part concerned. If the lamp 130C irradiates in the state shown in FIGS. 22 and 23, a greater irradiation area can be obtained by the lamps 130Ca in the center of the object W to be processed. On the other hand, a smaller irradiation area can be obtained by the lamps 130Cb in the vicinity of the outer end of the object W to be processed.

In the present embodiment, it becomes possible to irradiate efficiently the small area where the support ring 150 and the end of the object W to be processed overlap with each other by arranging the small-diameter lamps 130Cb around the lamps 130Ca. Moreover, as mentioned above, the electric power supplied to the lamp 130Cb is larger than the electric power supplied to the lamp 130a. That is, an energy irradiated by the lamps 130Cb per unit area is greater than that of the lamps 130Ca. According to the arrangement of lamps in the conventional heat treatment apparatus, it is impossible to control the lamp irradiation area separately between the center area and the end area of the object W to be processed since only one kind of lamp is used.

The specific heat differs from the support ring 150 to the object W to be processed. Specifically, the specific heat of the support ring 150 is smaller than the specific heat of the object W to be processed. Therefore, there is a problem in that the a temperature siring rate of the area where the support ring 150 overlaps with the object W to be processed and the area in the vicinity of the area concerned is smaller that other areas of the object W to be processed. However, in the present embodiment, since the small area in the periphery of the object W to be processed is irradiated by the small-diameter lamps 130Cb, the object W to be processed can be efficiently heated.

Furthermore, the center area and the peripheral area of the object W to be processed are prevented from being heated unevenly, which results in a high-quality heat treatment process. Moreover, using the large-diameter lamps 130Ca in the vicinity of the center of the object W provides a large irradiation area by one of the lamps 130Ca. Therefore, the number of the lamps 130C in the vicinity of the center can be smaller than conventional one, which allows a reduction in the power consumption. In the present embodiment, the above-mentioned problem is solved by using the lamps 130Ca and 130Cb having different diameters and varying an electric power supplied to the lamps 130Ca and 130Cb.

Similar to the lamps 130C in the first embodiment, the lamps 130Cb may be inclined so that the lights irradiated by the adjacent lamps 130Cb located in the outermost area in a radial direction overlap with each other on the object W to be processed.

It should be noted that the arrangement of the grooves 143 is not limited to the concentric arrangement, and other arrangements such as, for example, a linear arrangement or a spiral arrangement may be used if such an arrangement satisfies the above-mentioned conditions. Moreover, in the present embodiment, since the opening configuration of the reflector 241 of the lamp 130C is circular, the irradiation configuration of the lamp light is circular. However, the lamp 130C does not have limitation in the irradiation configuration in view of the concept that the lamps having a large irradiation area located in the center of object W to be processed and the lamps having a small irradiation area are located in the peripheral area of the object W to be processed. For example, the configuration of the lamp 130C and/or the reflector 241 may be changed so that the irradiation area becomes a triangle. In addition, the configuration of the lamp light may not be limited to a triangle but may be other polygons such as a square or hexagon. Moreover, any irradiation approaches, which can provide similar effect, may be used.

A description will now be given of the configuration of the groove 143. The groove 143 has the same configuration as the lamp 130C, and comprises a part 143c which accommodates the electrode part 132 of the lamp 130C, a part 143d which accommodates the middle part 134 and a part 143e which accommodates the light-emitting part 136. The part 143c connects the electrode part 132 to a lamp driver 310 shown in FIG. 2, and serves as a seal part, which gives a seal between the electrode part 132 and the lamp driver 310.

The groove 143 has a thread (female screw) 147 formed on an inner surface contacting the lamp 130C. In the present embodiment, the thread 147 is a triangular screw thread, which matches the thread formed on the lamp 130C. It should be noted that the shape of the thread profile is not limited to the triangular profile, and if the thread 131 of the lamp 130C is a square screw or a trapezoidal screw thread, the thread 147 of the groove 143 is also formed to correspond to the thread 131 of the lamp 130C. In addition, the groove 143 is formed so that the thread 147 optimally fits to the thread of the lamp 130C when the lamp 130 expands thermally. That is, when the lamp 130C is not thermally expanded, the outer and inner diameter and the pitch of the thread 147 formed in the groove 143 are slightly larger than that of the thread 131 formed on the lamp 130C. However, the difference between the dimensions of the threads is such that insertion of the lamp 130C and engagement with the groove 134 are not prevented.

In the above-mentioned structure, the groove 143 and the lamp 130C have a relationship of a nut and a bolt. The lamp 130C can be attached to the groove 143 by inserting the lamp support part 142 into the groove 143 while rotating so as to engage the threads with each other. When the lamp 130C is in a normal state where the lamp 130 does not expand thermally, the threads of the lamp 130C and the groove 143 engages with each other at surfaces in the direction of gravity. That is, a contact area is maintained between the lamp 130C and the groove 143. Although such a contact area is necessary to retain the lamp 130C, there is a problem as mentioned below. The groove of the lamp support part of the conventional lamp has the same cylindrical shape with the lamp to be inserted into the groove. The groove is formed so that, when the lamp thermally expands and becomes a maximum size, the lamp completely fits in the groove. That is, in the conventional structure, when the lamp is not completely expanded, the cooling effect of the cooling pipe, which is provided in the lamp support part to cool the lamp, deteriorates since the contact area between the lamp and the groove is small. The present embodiment eliminates such a problem. Moreover, since the ridge of the thread 147 of the groove 143 is slightly larger than the ridge of the thread 131 of the lamp 130C, there is formed a small space between the groove 143 and the lamp 130C. The groove 143 and the lamp 130C are configured to fit with each other when the lamp 130C is heated and expanded thermally so that the small space permits the thermal expansion of the lamp 130C within the groove 143.

Furthermore, the configuration of the lamp 130C and the configuration of the groove 143 have the following advantages. If an output of a part of the lamps is increased, the part of the lamps may degrade faster. Moreover, the reflector also degrades faster if a larger power is supplied to the lamp. Therefore, a high-output lamp has a shorter service life than a low-output lamp. Similarly, the reflector for the high-output lamp has a shorter service life than a reflector for the low-output lamp. This is for the reason that the temperature inside the high-output lamp is high, which causes the aluminum coating material and the base metal forming the reflector 241 diffusing each other resulting in formation of an alloy. Such an alloy causes degradation of the reflectance of the aluminum coating material. Accordingly, the service life of the reflector 241b is shorter than the reflector 241a.

Consequently, in order to exchange the lamp and reflector of which service life has expired located in the peripheral area of the lamp support part, it is required to exchange the entire lamp support part including the lamps and reflectors which area still usable, which is not an economical way. However, in the present embodiment, the groove 143 and the lamp 130C of the lamp support part 142 have a relationship of a nut and a blot as mentioned above, and, thereby, the lamp 130C and the reflector 241 can be removed on an individual lamp and reflector basis.

Therefore, the usable lamps 130C can be continuously used by replacing only degraded lamps 130C. Thus, the present embodiment solves the above-mentioned problem by constituting the lamps being easily replaceable on an individual lamp basis. Additionally, in the present embodiment, since the reflector 241 is detachable attached to the lamp 130C, the lamp 130 and/or the reflector 241 may be replaced individually. Thus, the present embodiment eliminates a replacement work of the entire lamp support part, which is complex and inconvenient, and, thus, there is a further advantage that the maintenance efficiency is improved.

Figure 29:
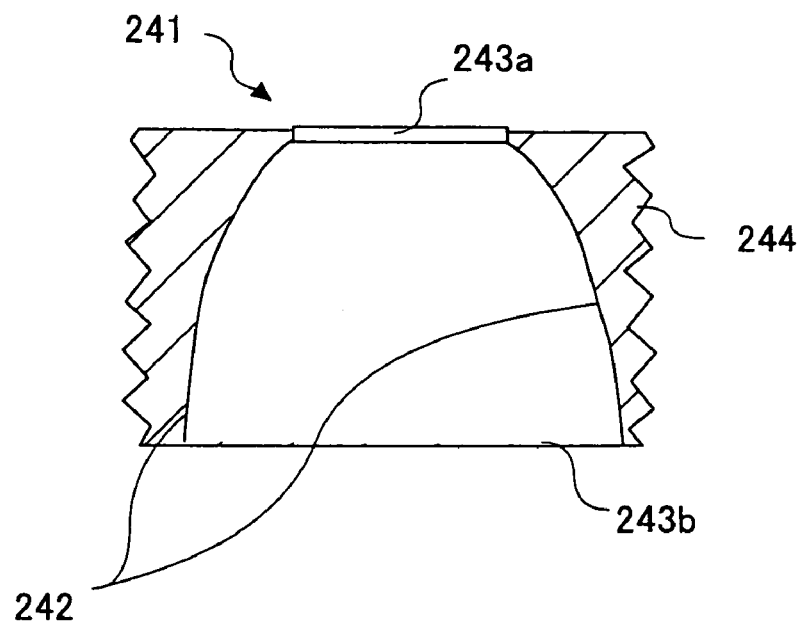
FIG. 29 is an enlarged cross-sectional view of a reflector attached to the lamp shown in FIG. 28.
Figure 30:
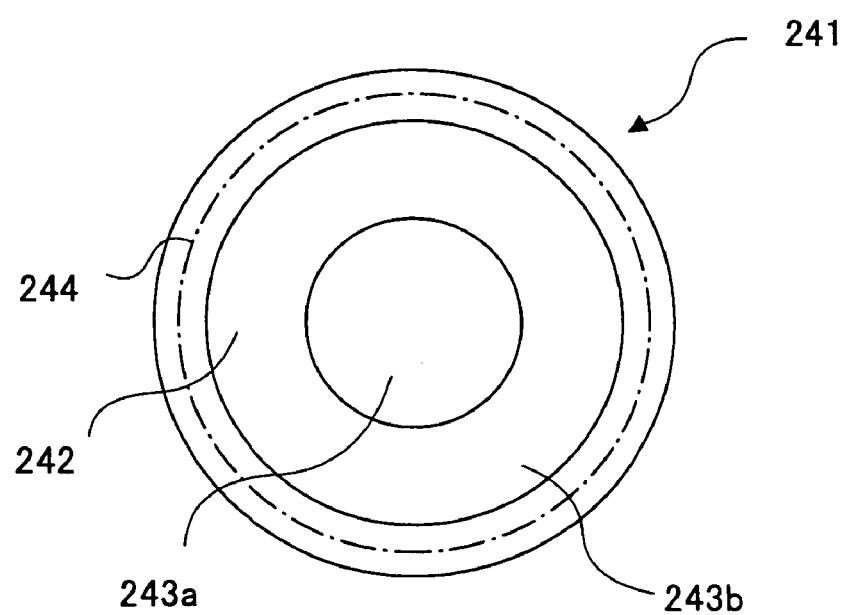
FIG. 30 is a bottom view of the reflector shown in FIG. 29.
Figure 31:
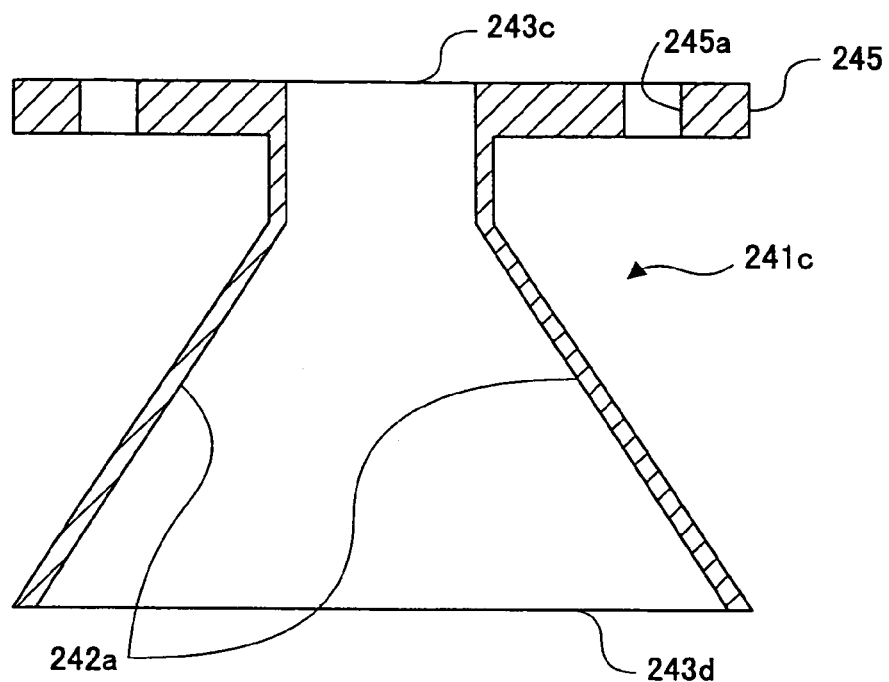
FIG. 31 is a cross-sectional view of a reflector which is a variation of the reflector shown in FIG. 29.
Figure 32:
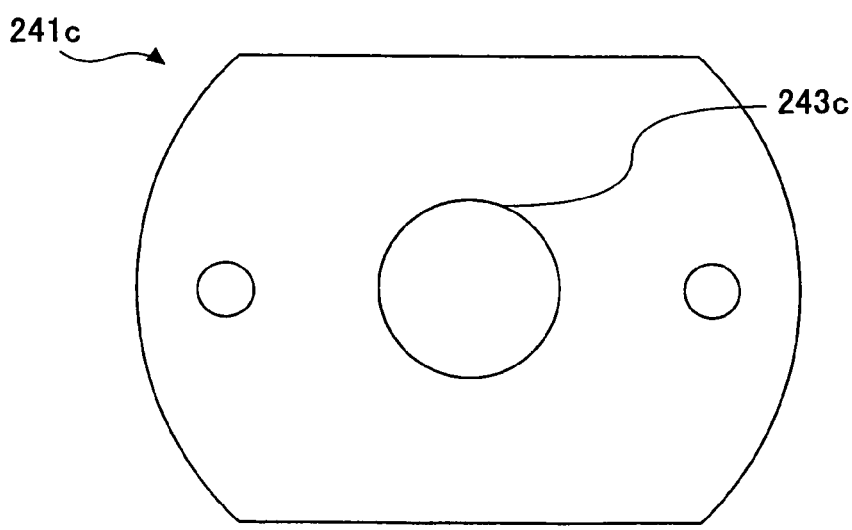
FIG. 32 is a plan view of the reflector shown in FIG. 31.

It should be noted that the above-mentioned configuration of the lamp 130C is only an example, and any configuration may be adopted if the lamp 13A and the reflector 241 can be replaced either in combination or singular. Additionally, the reflector 242 bay be connected to the lamp support member 142 by connecting members such as screws as shown in FIG. 31. FIG. 31 is a cross-sectional view of a reflector 241c, which is a variation of the reflector 241 shown in FIG. 29. FIG. 32 is a plan view of the reflector 241c shown in FIG. 31. The reflector 241c has the reflective area 242a, and has an opening 243c and an opening 243d. The opening 243c is provided for inserting the light-emitting part 136 of the lamp 130C therethrough, and the opening 243d is provided for projecting a light therethrough. A flange 245 is provided on the side of the opening 243c, and through holes 245a are provided in the flange 245. The reflector 241c is mounted to the lamp support part 142 by screws via the through holes 245a.

As shown in FIGS. 6 and 27, the isolation wall 148 is arranged between the adjacent grooves 143 which are arranged along the concentric circles. In the present embodiment, the thickness of the isolation wall 148 between the parts 143c is about 50 mm, and the thickness of the isolation wall between the parts 143e is about 10 mm. Moreover, the thickness of the isolation wall between the parts 143c of groove 143b is about 15 mm, and the thickness of the isolation wall between the parts 143e is about 5 mm. The isolation wall 148 is provided with a pair of cooling pipes (cooling water pipes) 149a and 149b. Hereinafter a cooling pipe 149 generically represents the cooling pipes 149a and 149b. More specifically, the cooling pipe 149a is located in the place corresponding to the electrode part 132 of the lamp 130C, and the cooling pipe 149b is located in the place corresponding to the light-emitting part 136 of the lamp 130C.

The cooling pipe 149 is connected to the temperature-control device which is not shown in the figure. The temperature-control device comprises the control part 300, a temperature sensor or thermometer and a heater. A cooling water is supplied to the temperature-control device from a water source such as a water line. Instead of the cooling water, other coolants such as alcohol, gurden, chlorofluorocarbon, etc. may be used. As for the temperature sensor, a well-known sensor such as, for example, a PTC thermistor, an infrared sensor or a thermocouple may be used. A temperature sensor or thermometer measures a temperature of the inner wall of the electrode part 132 and the light-emitting part 136 of the lamp 130C. A heater is constituted by a wire heater wound on an outer surface of the cooling pipe 116. By controlling the magnitude of the current, which flows through the wire heater, the temperature of the water flowing through the cooling pipe 149 can be adjusted.

When the electrodes 133 are made of molybdenum, in order to prevent destruction of the electrodes 133 and seal part 143c due to oxidization of molybdenum, the cooling pipe 149a maintains the temperature of the seal part 143c at 350° C. or less. Moreover, the cooling pipe 149b maintains the temperature of the light-emitting part 136 at 250° C. to 900° C. so that the middle part 134 and the light-emitting part 136 maintain a halogen cycle. In the halogen cycle, the tungsten which constitutes the filament 137 evaporates and reacts with halogen gas, a tungsten-halogen compound is generated which floats inside the lamp 130C. When the lamp 130C is maintained at 250° C. to 900° C., the tungsten-halogen compound maintains the floating state.

However, when the tungsten-halogen compound is carried to the vicinity of the filament 137 by convection, the tungsten-halogen compound is decomposed into tungsten and halogen gas due to the high-temperature of the filament 137. Then, the tungsten is deposited on the filament 137 and the halogen gas repeats the same reaction. It should be noted that, generally, if the temperature exceeds 900° C., devitrification (a phenomenon in which the light-emitting part 136 becomes white) may occur. On the other hand, if the temperature is below 250° C., blackening (phenomenon in which the tungsten-halogen compound adheres to the wall of the lamp 130, and becomes black) may occur. Further, molecules of the coating material of the reflective area 242 may form an alloy with a base metal by being mutually diffusing under a high temperature, which results in degradation of the reflectance of the reflective area 242. Thus, it is necessary to maintain the reflector below a predetermined temperature. For example, if Ni plating is provided, the predetermined temperature is preferably 300° C.

In the present embodiment, the cooling pipe 149a is maintained at a temperature within the range of halogen cycle and which can prevent oxidization of molybdenum. Such a temperature preferably ranges from 250° C. to 350° C. Additionally, the cooling pipe 149b is maintained at a temperature within the range of halogen cycle and also a temperature at which the coating layer is prevented from diffusion. Such a temperature preferably ranges from 250° C. to 300° C.

It should be noted that instead of providing the isolation wall 148 between parts corresponding to the reflector 241 and the light-emitting parts 136 of the lamps 130C, the space provided with the isolation wall 148 may be empty so as to carry out air cooling for the light-emitting parts 136. The air cooling may be carried out by a known cooling system such as a blower, which carries out forced air cooling. Furthermore, another cooling method in which a common cooling pipe is provided so as to cool both the reflector 241 and the light-emitting part 136 may be used. In such a method, the cooling pipe may be cooled at a temperature of 250° C. to 300° C., which is a temperature common to both the protection of the coating and the halogen cycle range. Even with the above-mentioned structure, the same effect as the above-mentioned cooling pipe 149 can be acquired.

Figure 33:
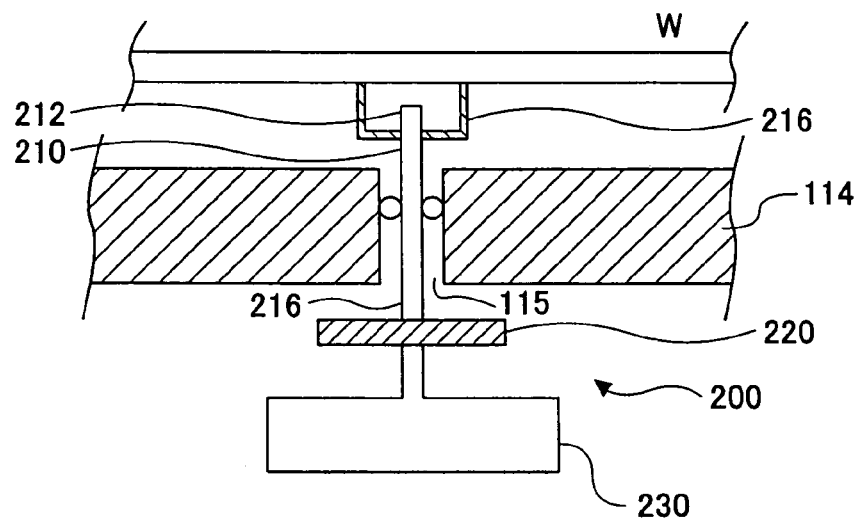
FIG. 33 is an illustrative enlarged cross-sectional view of a radiation thermometer and parts of the process chamber in the vicinity of the radiation thermometer.
Figure 34:
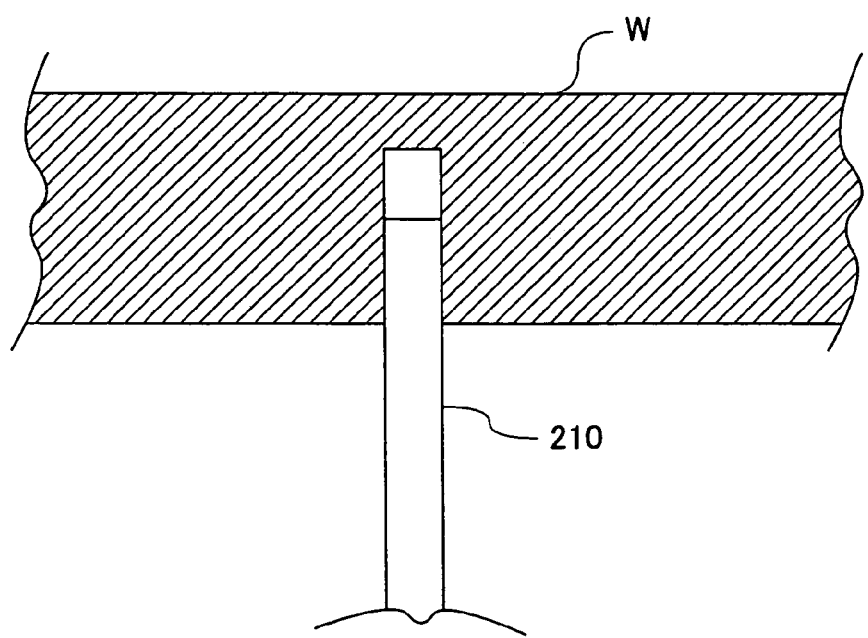
FIG. 34 is an illustrative enlarged cross-sectional view of a sensor rod and a part of the radiation thermometer in the vicinity of the sensor rod.

Next, a radiation thermometer 200 is explained with reference to FIGS. 2, 33 and 34. FIG. 33 is an illustrative enlarged cross-sectional view of the radiation thermometer 200 and parts of the process chamber 110 in the vicinity of the radiation thermometer 200. FIG. 34 is an illustrative enlarged cross-sectional view of a sensor rod 210 and a part of the radiation thermometer 200 in the vicinity of the sensor rod 210.

The radiation thermometer 200 is provided on the opposite side of the lamp 130C with respect to the object W to be processed. However, the present invention does not exclude a structure in which the radiation thermometer 200 is provided on the same side with lamp 130C. The radiation thermometer 200 is attached to the bottom part 114 of the process chamber 110. A surface 114a of the bottom part 114 facing the interior of the process chamber 110 is provided with gold plating and the like so as to serve as a reflective plate (high reflectance surface). This is for the reason that if the surface 114a is a low reflectance surface such as black surface, the surface 114a absorbs heat of the object W to be processed, which results in uneconomical rise of the irradiation output of the lamp 130C.

The bottom part 114 has a cylindrical through opening 115. The radiation thermometer 200 has the sensor rod 210, a filter 220 provided in the middle of the sensor rod 210 and a radiation detector 230 to which the sensor rod 210 is connected. An end of the sensor rod 210 protrudes into the process space within the process chamber 110 through the through hole 115. The sensor rod 210 is inserted into the through hole 115 provided in the bottom part 114 of the process chamber 110, and is sealed by an O-ring 190. Thereby, the process chamber 110 can maintain a negative pressure environment therein irrespective of the existence of the though hole 115.

It should be noted that the temperature measuring method according to the present embodiment mentioned later can omit a chopper and a motor for rotating the chopper, and the radiation thermometer adopts a minimum necessary structure, which is relatively inexpensive. The radiation thermometer 200 measures a temperature of the object W to be processed, and sends the measured temperature to the control part 300. Thereby, a heat treatment can be applied to the object W to be processed at a desired temperature.

The sensor rod 210 is comprised of a single core optical fiber or a multi-core optical fiber. With reference to FIG. 33, one end 214 of the sensor rod 210 is connected to the radiation detector 230 through the filter 220, and the other end 212 is arranged near the object W to be processed. The end 212 has a light-converging action so as to introduce a radiation light radiated by the object to be measured into the radiation detector 230. It should be noted that the end 212 of the rod 210 may be provided with a condenser lens.

Since an optical fiber is capable of guiding the radiation light to the filter 220 with almost no attenuation, the optical fiber has an advantage to provide excellent transmission efficiency. Moreover, flexibility can be provided to a light-guiding path of the sensor rod 210, and the degree of freedom of arrangement of the radiation thermometer 200 can be increased. Furthermore, since the body of the radiation thermometer 200 or the radiation detector 230 can be separate further away from the object W to be processed, each part of the radiation thermometer 200 is prevented from being deformed due to an influence of the temperature of the object W to be processed, thereby achieving a higher measurement accuracy.

However, according to the conventional thermometry approach using the radiation thermometer 200, the end 212 of the sensor rod 210 is located in the open space, and the sensor rod 210 is projected from the bottom 114 and exists in the internal space of the process chamber 110. In the measurement performed under such a condition, a factor (so-called a stray light) other than the radiation light from the object to be measured (object W to be processed) may become noise, which lowers the accuracy of measurement. Thus, the present inventor considered to improve the accuracy of measurement by interrupting a stray light by locating the sensor rod 210 inside a space (closed space) in the object to be measured, which space is shielded with respect to a stray light.

Specifically, as shown in FIG. 33, the end 212 of the sensor rod 210 defines a closed space in cooperation with a shield part 216 having a domal shape and the object to be measured (object W to be processed). The end 212 of the sensor rod 210 is located inside the closed space. The shield part 216 has a U-shaped cross-sectional configuration, and interrupts a stray light by forming an atmosphere different from the process space of the process chamber 110 by sealingly contacting an opening side of the U-shaped cross-sectional configuration with the object to be measured.

In the present embodiment, although the shield part 216 has the U-shaped cross-section, the present invention is not limited to such a configuration. It should be noted that, the shield part 226 is preferably formed of the same material as the object to be measured. If the object to be measured is made of a material, which easily transmits a stray light, the stray light must be interrupted by applying a shielding film onto the surface of the shield part 216. With the above-mentioned construction in which the shield part 216 is formed of the same material as the object to be measured, it is prevented to deteriorate the accuracy of measurement due to a radiation light radiated from a different member. However, the configuration and material of the shield part 216 are not limited to the above-mentioned, and other configurations and materials may be used if a stray light can be interrupted.

Moreover, as shown in FIG. 34, a cavity into which the sensor rod 210 is inserted may be formed in the object to be measured so as to form a closed space by inserting the sensor rod 210 into the cavity. Here, FIG. 34 is an illustrative cross-sectional view showing another example of the configuration of the end 212 end the sensor rod 210 shown in FIG. 33. However, with the composition in FIG. 34, it is necessary to form a hole or a cavity in the object to be measured, i.e., the object W to be processed. Therefore, such a cavity is preferably provided in the periphery part of the object W to be processed. Or a cavity may be formed in the support ring 150, and the sensor rod 210 may be inserted into the cavity so as to measure a temperature of the object W to be processed indirectly through the support ring.

Although noise caused by incidence of a stray light is on of factors, which decrease the accuracy of measurement, the stray light is interrupted in the present embodiment by a forming a different atmosphere by the shield part 216. Accordingly, a magnitude of influence of a stray light can be made smaller than arranging the sensor rod 210 in an open space. Therefore, it becomes possible to measure the temperature of the object to be measured with sufficient accuracy, and the stability and reproducibility of production ability can be raised. Moreover, it is possible to provide a heat treatment with high accuracy and a high-quality wafer which has been subjected to such a high accuracy heat treatment. Moreover, the sensor rod 210 may be provided with a moving mechanism.

For example, the temperature measurement of the object W to be processed may be performed, only when it is needed, by moving and contacting the sensor rod 210 to the object W to be processed, and separating the sensor rod 210 from the object W to be processed when the temperature measurement is not required. If such a structure is adopted, the sensor rod 210 can be prevented from affecting a gas treatment and flocking a rotation of the object W to be processed when performing the gas treatment and the rotation of the object W to be processed as mentioned later. Moreover, the sensor rod 210 may also be prevented from affecting the gas treatment and blocking the rotation of the object W to be processed, by locating the sensor rod 210 within the support ring 150.

Furthermore, in order to investigate the cause of the measurement error of the radiation thermometer in more detail, the present inventor investigated the radiation characteristic of the object W to be processed. Then, the present inventor measured emissivity to a wavelength with respect to a material used for the object W to be processed by setting a temperature as a parameter. The result of measurement showed that there is a wavelength range in which a material such as quartz or silicon carbide shows substantially constant value of emissivity to wavelength irrespective of the temperature. Moreover, it was found that the value of the emissivity varies depending on the wavelength.

There may be a large possibility of receiving an influence of noise if a radiation light having a wavelength of a low emissivity (that is, a small radiation energy) is used when performing a temperature measurement using a radiation thermometer. Conventionally, at the time of temperature measurement, selection of an appropriate wavelength for improving the accuracy of measurement is not performed, and, thus, a radiation light containing much noise is used for the measurement. Therefore, the present inventor assumed that such noise causes measurement errors, and considered that an accurate temperature measurement can be achieved if a radiation light having a wavelength providing a high emissivity is used. Thus, the radiation thermometer 200 of the present invention has the filter 220 so as to select a wavelength suitable for temperature measurement.

The filter 220 is located between the sensor rod 210 and the radiation detector 230, and has a function to limit the radiation light introduced into the radiation detector 230 in accordance with the wavelength. The filter 220 can be a wavelength filter produced by a known technique, and description thereof will be omitted. In the present embodiment, the filter 220 selects a wavelength from a wavelength range providing a high emissivity.

Figure 35:
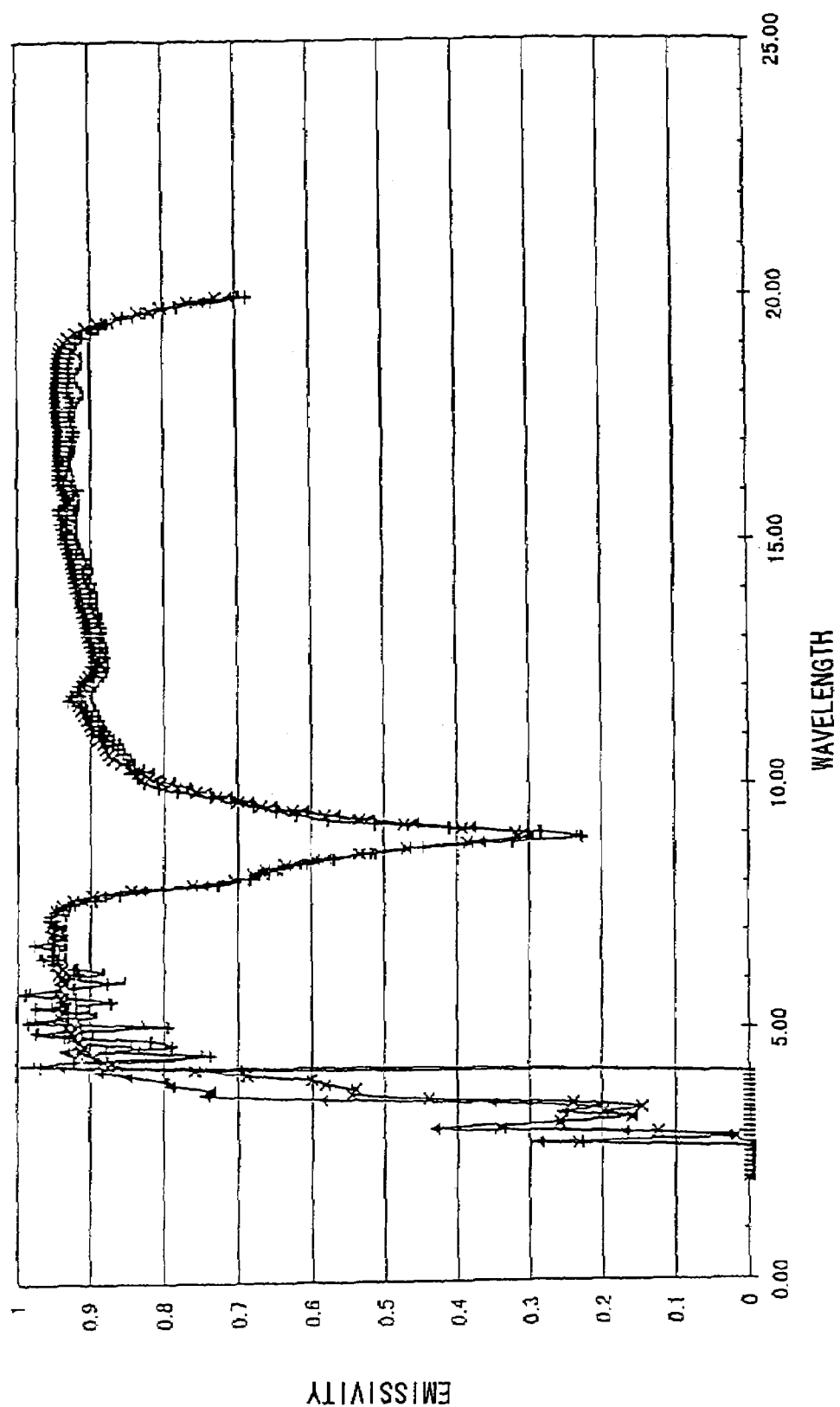
FIG. 35 is a graph showing a relationship between emissivity of a quartz board and wavelength of a radiation light.
Figure 36:
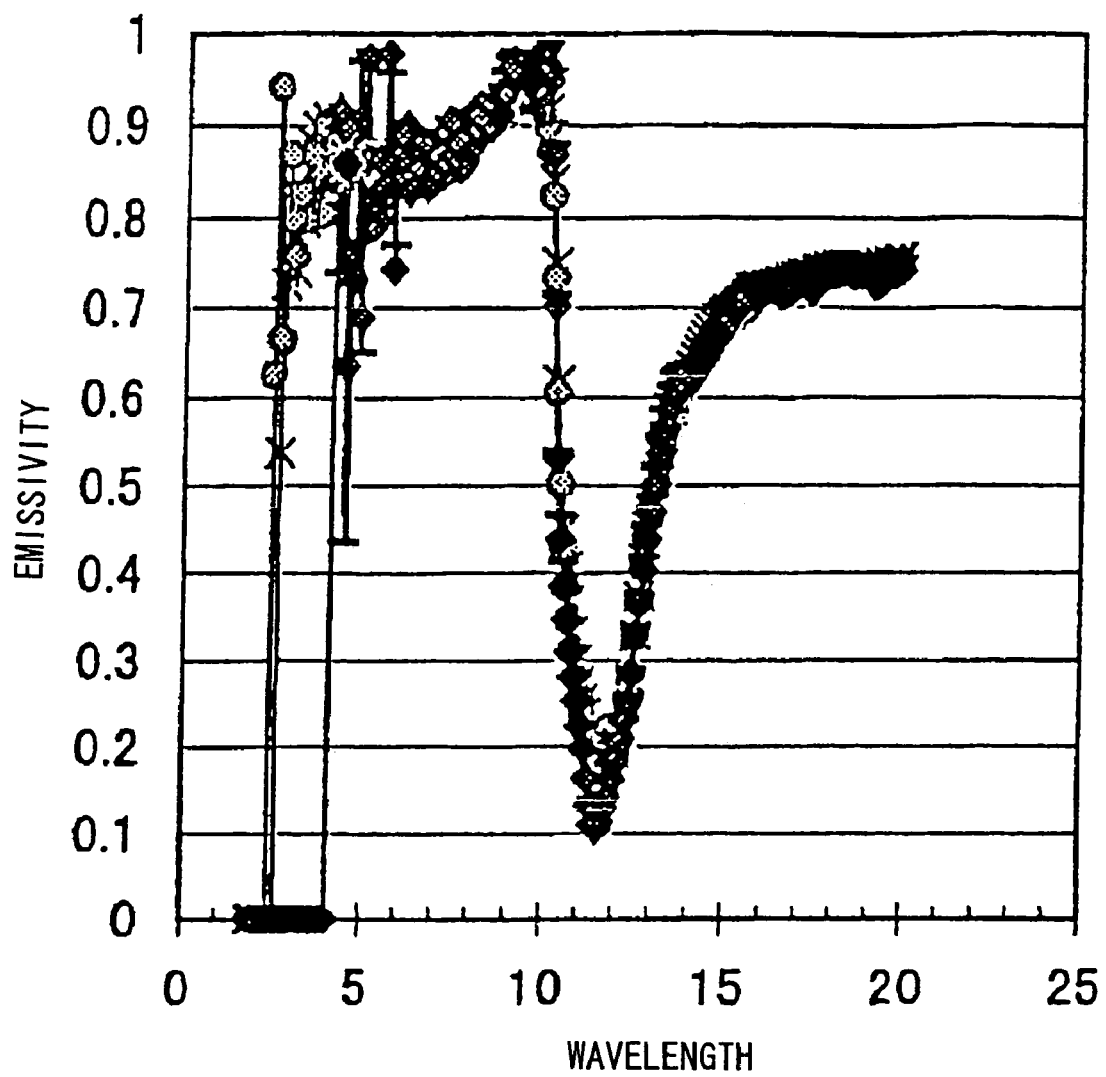
FIG. 36 is a graph showing a relationship between emissivity of a silicon carbide (SiC) board and wavelength of a radiation light.
Figure 37:
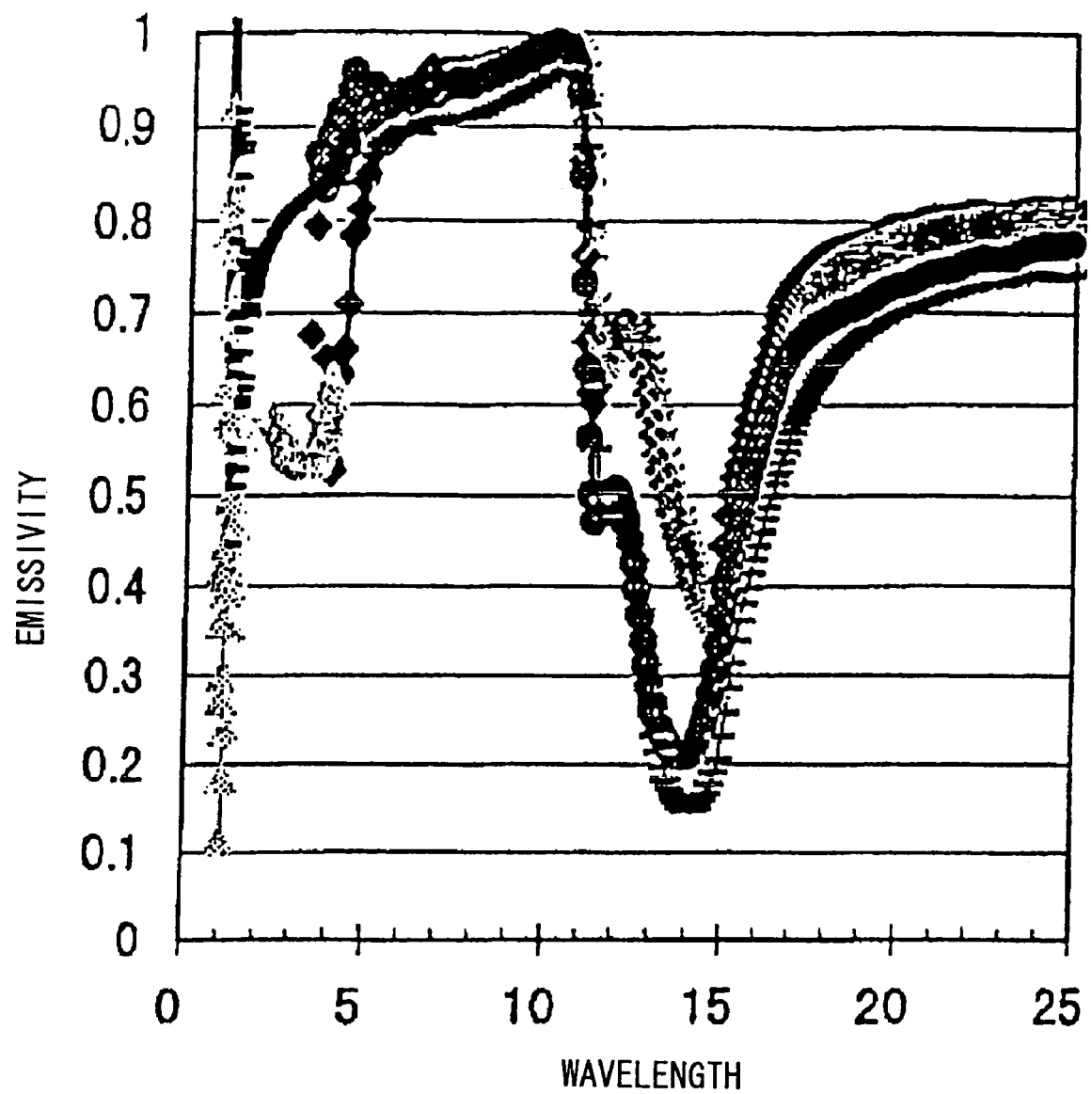
FIG. 37 is a graph showing a relationship between emissivity of an aluminum nitride (AlN) board and wavelength of a radiation light.

FIG. 35 is a graph showing a relationship between emissivity of a quartz board and wavelength of the radiation light with a temperature and a thickness of the quartz board as parameters. FIG. 36 is a graph showing a relationship between emissivity of a silicon carbide (SiC) board and wavelength of the radiation light with a temperature and a thickness of the SiC board as parameters. FIG. 37 is a graph showing a relationship between emissivity of an aluminum nitride (AlN) board and wavelength of the radiation light with a temperature and a thickness of the AlN board as parameters.

For example, as interpreted from the graph of FIG. 35, a quartz board shows a high emissivity in a wavelength range from 4.5 μm to 7.4 μm, and a wavelength range from 9.0 μm to 19.0 μm. By selectively passing a light of a wavelength within the above-mentioned wavelength ranges through the filter 220, a radiation light having a wavelength providing a high emissvity, which is known from the graph of FIG. 35, can be introduced into the radiation detector 230.

In addition, as interpreted from the graph of FIG. 36, an SiC board shows a high emissivity in a wavelength range from 4.3 μm to 10.5 μm and a wavelength range from 12.5 μm to 20.0 μm. Further, as interpreted from the graph of FIG. 37, an AlN board shows a high emissivity in a wavelength range from 45.0 μm to 11.0 μm and a wavelength range from 17.0 μm to 25.0 μm.

Accordingly, with respect to SiC and AlN, by selectively passing a light of a wavelength within the above-mentioned wavelength ranges through the filter 220, a radiation light having a wavelength providing a high emissvity, which is known from the graph of FIG. 36 or 37, can be introduced into the radiation detector 230.

It should be noted that although the filter 220 is used in the present embodiment in order to select a wavelength introduced into the radiation detector 230, the present invention is not limited to a filter and any known technique can be used to selectively pass a desired wavelength. Moreover, a plurality of filters 220 may be used as mentioned later.

The radiation detector 230 comprises an image-formation lens, an Si photo-cell and an amplification circuit, which are not shown in the figure. The radiation detector 230 converts a radiation light incident on the image-formation lens into a voltage signal, i.e., an electric signal representing an intensity of radiation $E_1(T)$, and sends the electric signal to the control part 300. The control part 300 is provided with a CPU and a memory, and computes a temperature T of the object W to be processed based on the intensity of radiation $E_1(T)$. It should be noted that a computation part (not shown) of the radiation thermometer 200 may perform such a computing operation instead of the control part 300.

More specifically, the radiation light is converged at the end 212 of the sensor rod 210, and is transmitted to the radiation detector 230 through an optical fiber. An intensity of radiation (or luminance) of the radiation light transmitted through the sensor rod 210 can be represented by the following equation (3).

$$E_1(T) = \epsilon E_{BB}(T) \quad (3)$$

Where, $E_1(T)$ represents an intensity of radiation from an object to be measured at a temperature T which is obtained by the radiation detector 230, and $E_{BB}(T)$ represents an intensity of radiation of a black body at the temperature T. The equation (3) is derivable from Planck's radiation law.

$$E_{BB}(T) = \sigma T^4 \quad (4)$$

where σ is a Stefan-Boltzmann constant which is represented as σ=5.67×10$^{-8}$ (W/m$^2$ K$^4$). The equation (4) is derivable from Stefan-Boltzmann law.

The intensity of radiation $E_{BB}(T)$ can be obtained by substituting the emissivity corresponding to the transmission wavelength of the filter 220 for a known object to be measured (the object W to be processed) for epsilon in the equation (3). Therefore, the temperature T can be obtained by substituting $E_{BB}(T)$ for the expression (4). Thus, the control part 300 can obtain the temperature T of the object W to be processed.

It should be noted that the above-mentioned temperature measurement is not limited to measurement of a temperature of the object to be processed, and may be used to measure a temperature of the quartz window 120. Moreover, a material applicable to the object W to be processed is not limited to the above-mentioned materials, and any material can be used if the radiation characteristics of the material is know.

Figure 38:
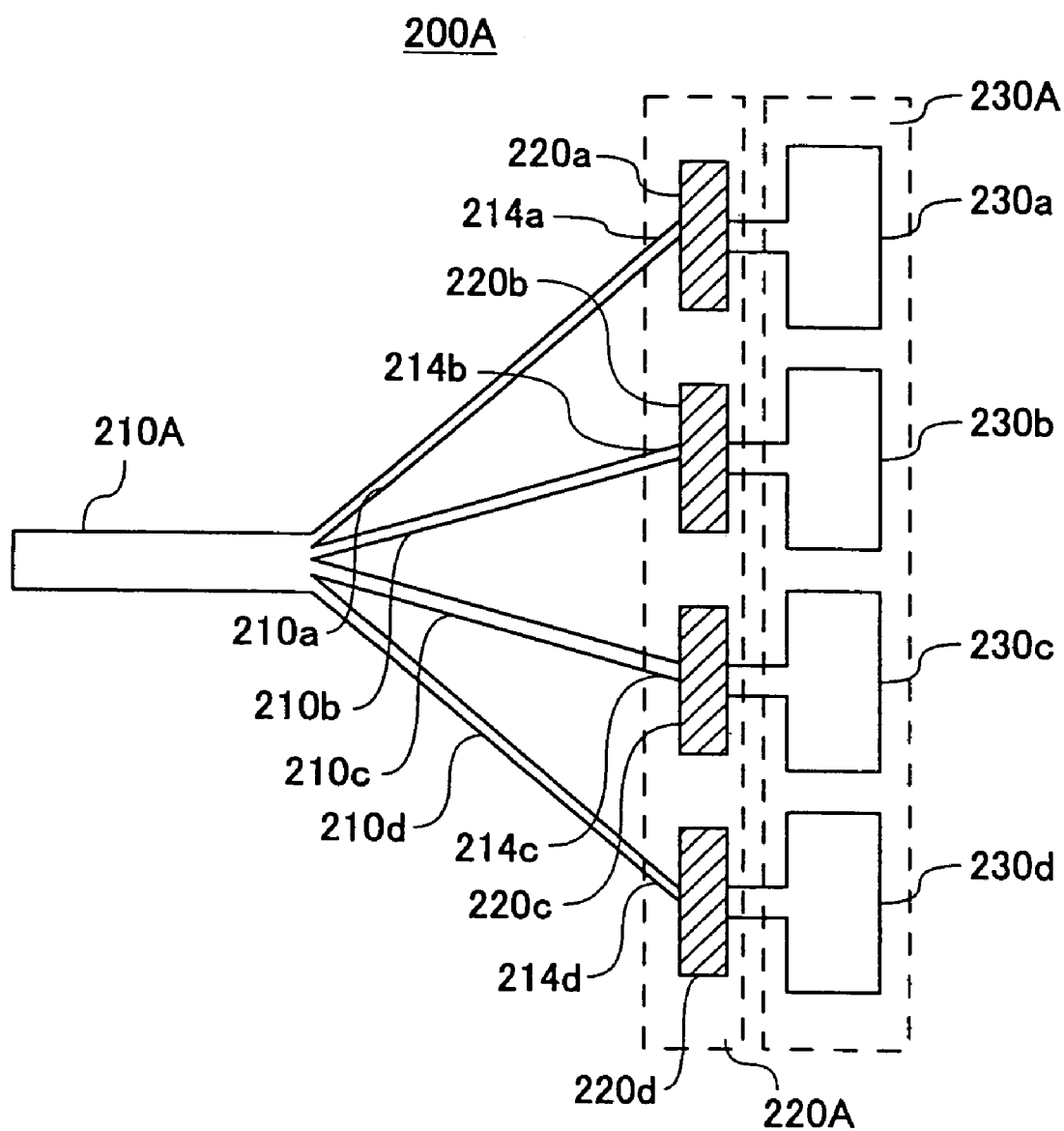
FIG. 38 is an illustrative side view of a radiation-thermometer which is a variation of the radiation thermometer shown in FIG. 2.

FIG. 38 is an illustrative side view of a radiation-thermometer 200A, which is a variation of the radiation thermometer 200 shown in FIG. 2. In the example shown in FIG. 38, a plurality of filters and a plurality of radiation detectors are provided. The radiation thermometer 200A comprises optical fibers 210A (optical fibers 210a through 210d) each of which is constituted by a plurality of single core or multi-core optical fibers, a filter 220A including a plurality of filters 220a through 220d) and a radiation detector 230A including a plurality of radiation detectors 230a through 230d. The structure of the radiation thermometer 200A is fundamentally the same as the radiation thermometer 200, and a detailed description will be omitted.

In the radiation thermometer 200A, similar to the radiation thermometer 200, the ends 212A of the plurality of optical fibers 210A are located within a closed space. The opposite ends 214A (ends 214a to 214d) are connected to the radiation detector 230A through the filter 220A. It should be noted that the plurality of filters 220a through 220d, which together constitute the filter 220A, selectively passes different wavelengths of the radiation light introduced into the radiation detector 230A. It should be noted that each of the filters 220a through 220d selectively passes a wavelength providing a known high emissivity as mentioned above. Thereby, a plurality of wavelengths each providing a known high emissivity can be introduced into the radiation detector 230A. Thus, the number of radiation lights having different wavelengths can be increased so as to provide a plurality of detection signals so that the measurements and other errors are averaged by the control part 300, thereby achieving a higher accuracy of measurement than the radiation thermometer 200. It should be noted that signals supplied by the radiation thermometer 230 may be averaged by a predetermined circuit, which is provided between the radiation thermometer 230A and the control part 300.

Third Embodiment

A description will now be given of a heat treatment apparatus according to a third embodiment of the present invention.

The heat treatment apparatus according to the third embodiment of the present invention has basically the same structure as the above-mentioned heat treatment apparatus according to the first embodiment shown in FIG. 2 except for the lamp 130 provided in the heating unit 140. Thus, descriptions of the entire structure of the heat treatment apparatus according to the third embodiment of the present invention will be omitted.

A description will now be given, with reference to FIGS. 39 through 44, of a heating unit 140B provided in the heat treatment apparatus according to the third embodiment of the present invention.

Figure 39:
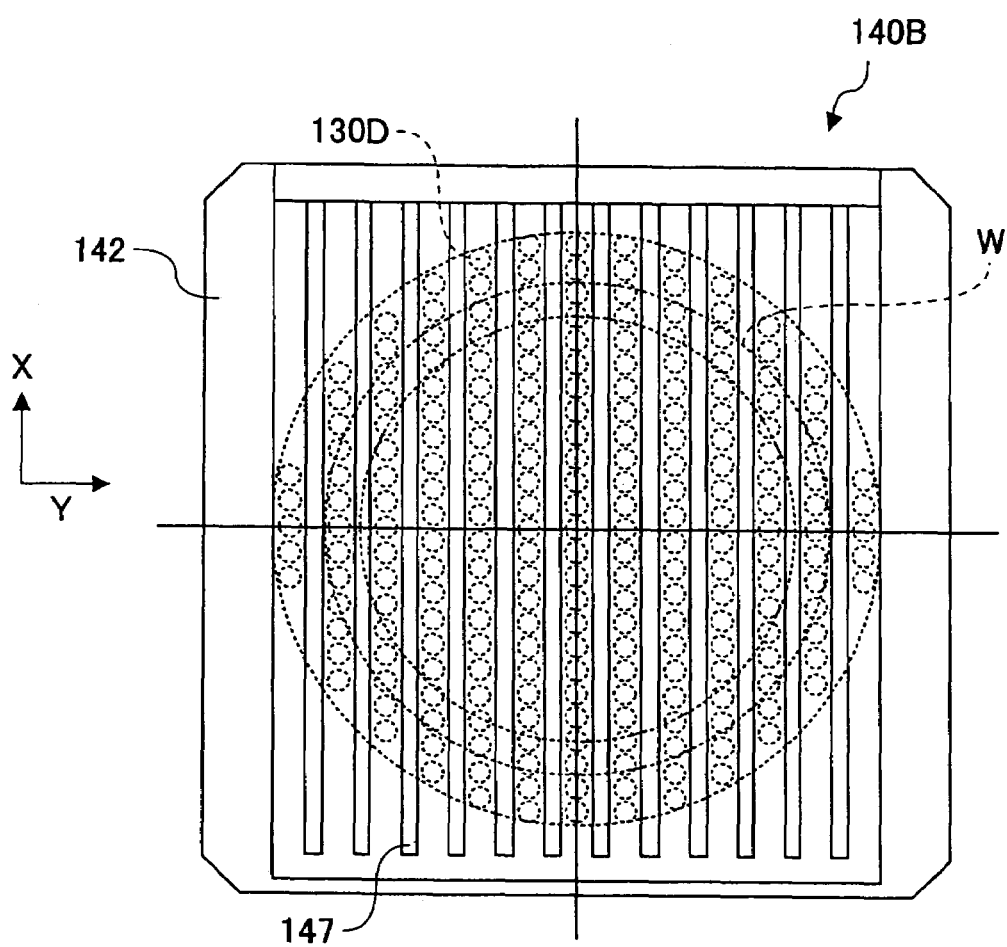
FIG. 39 is an illustrative bottom view of a heating unit provided in a heat treatment apparatus according to a third embodiment of the present invention.
Figure 40:
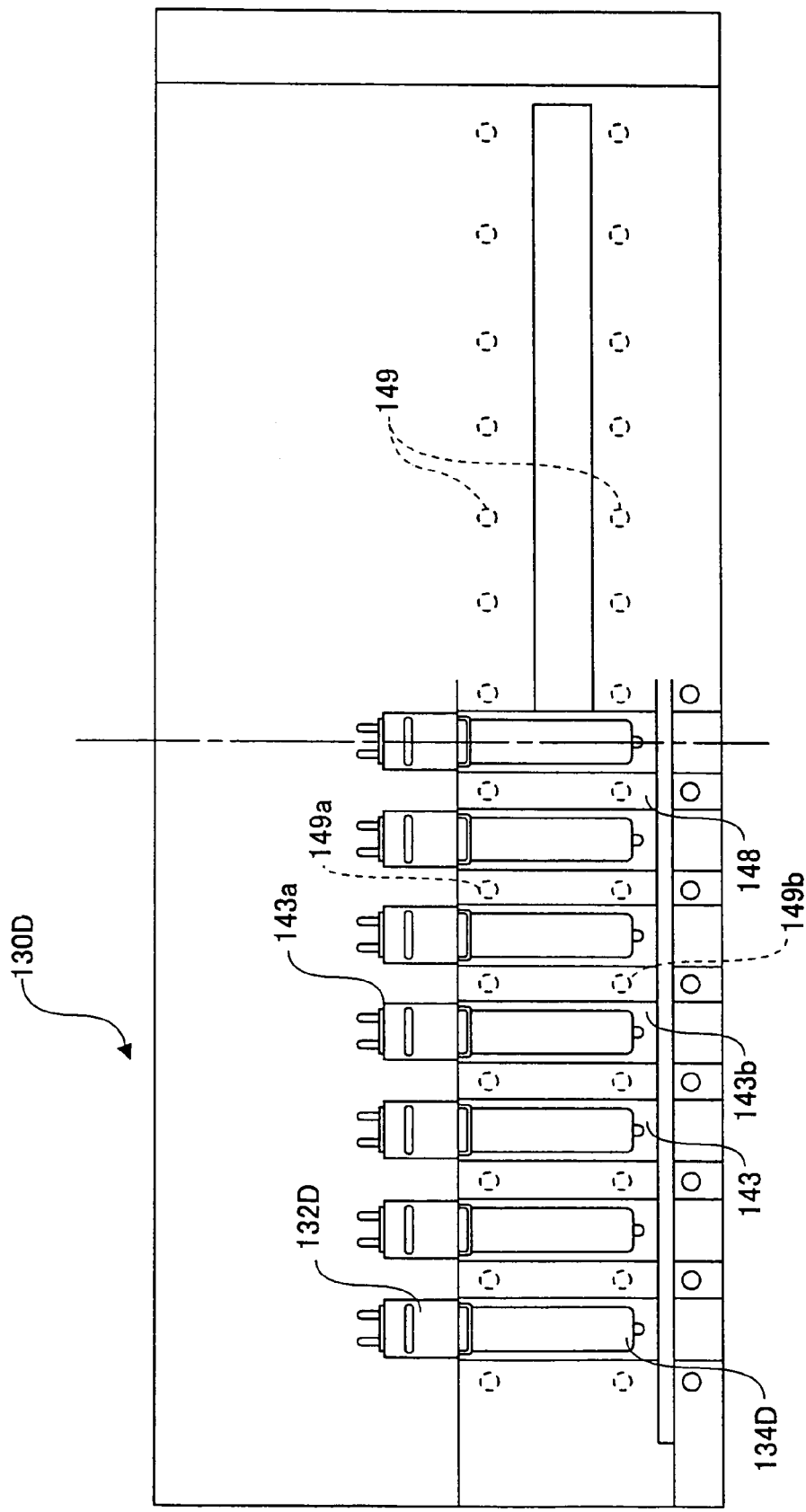
FIG. 40 is an enlarged cross-sectional view of a part of the heating unit show in FIG. 39.
Figure 41:
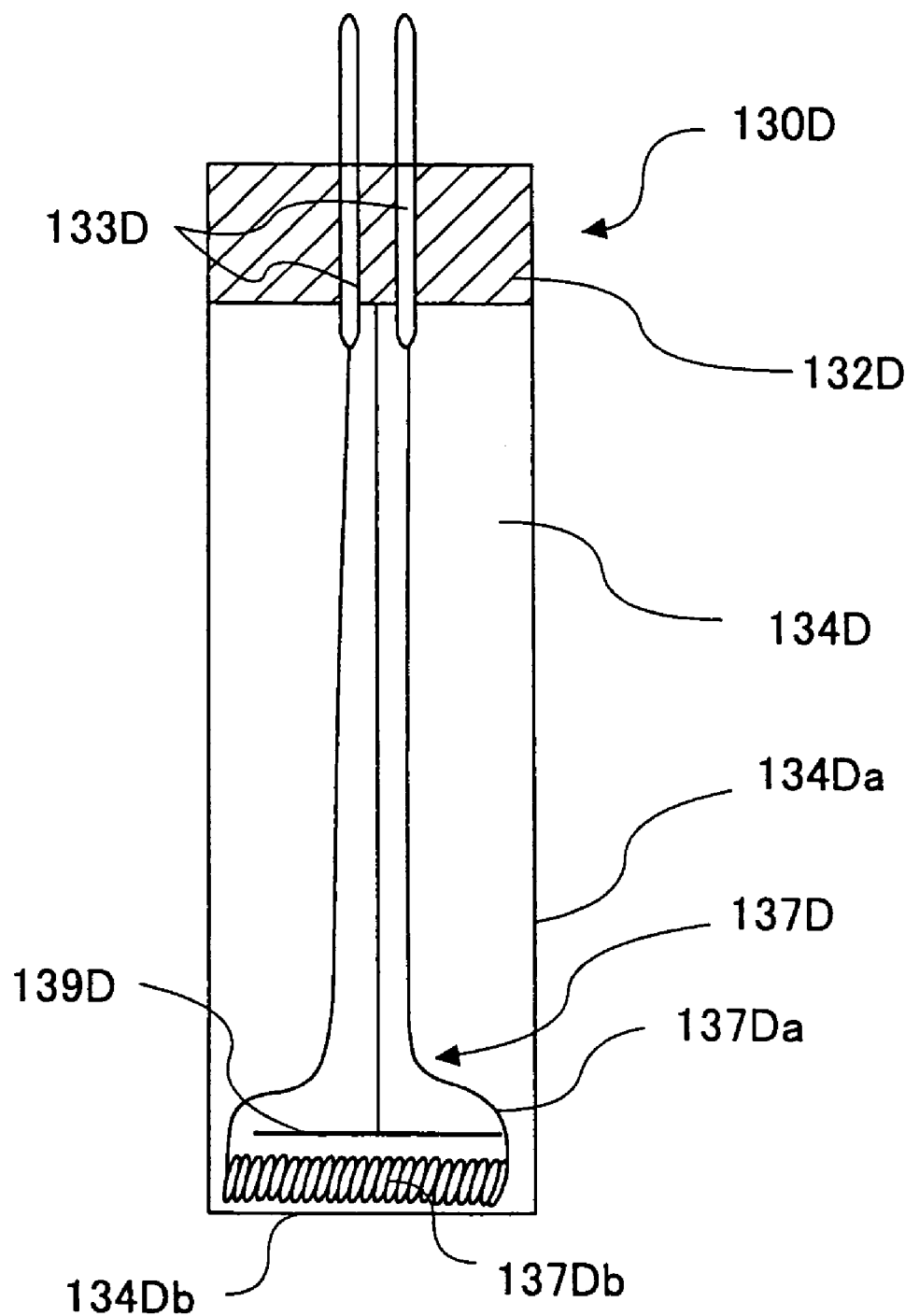
FIG. 41 is an illustrative cross-sectional view of a lamp shown in FIG. 40.
Figure 42:
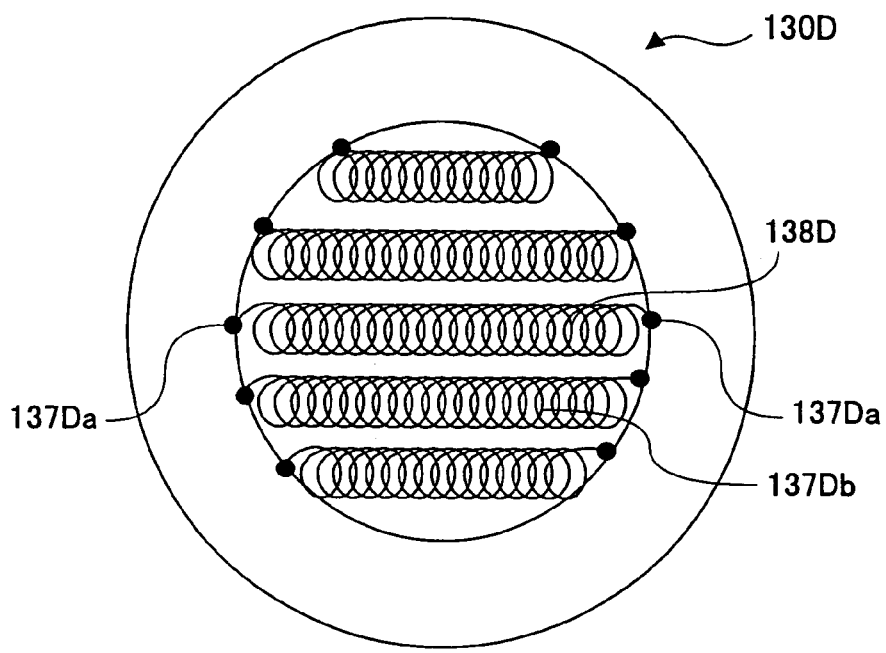
FIG. 42 is an illustrative bottom view of the lamp shown in FIG. 41.
Figure 43:
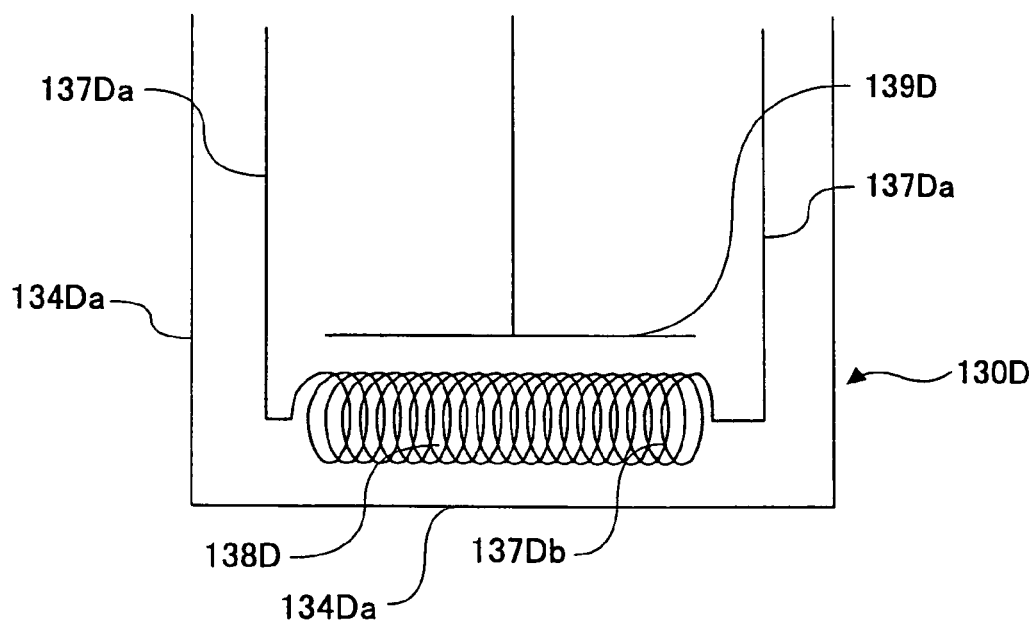
FIG. 43 is a an illustrative side view of a lower part of the lamp shown in FIG. 41.
Figure 44:
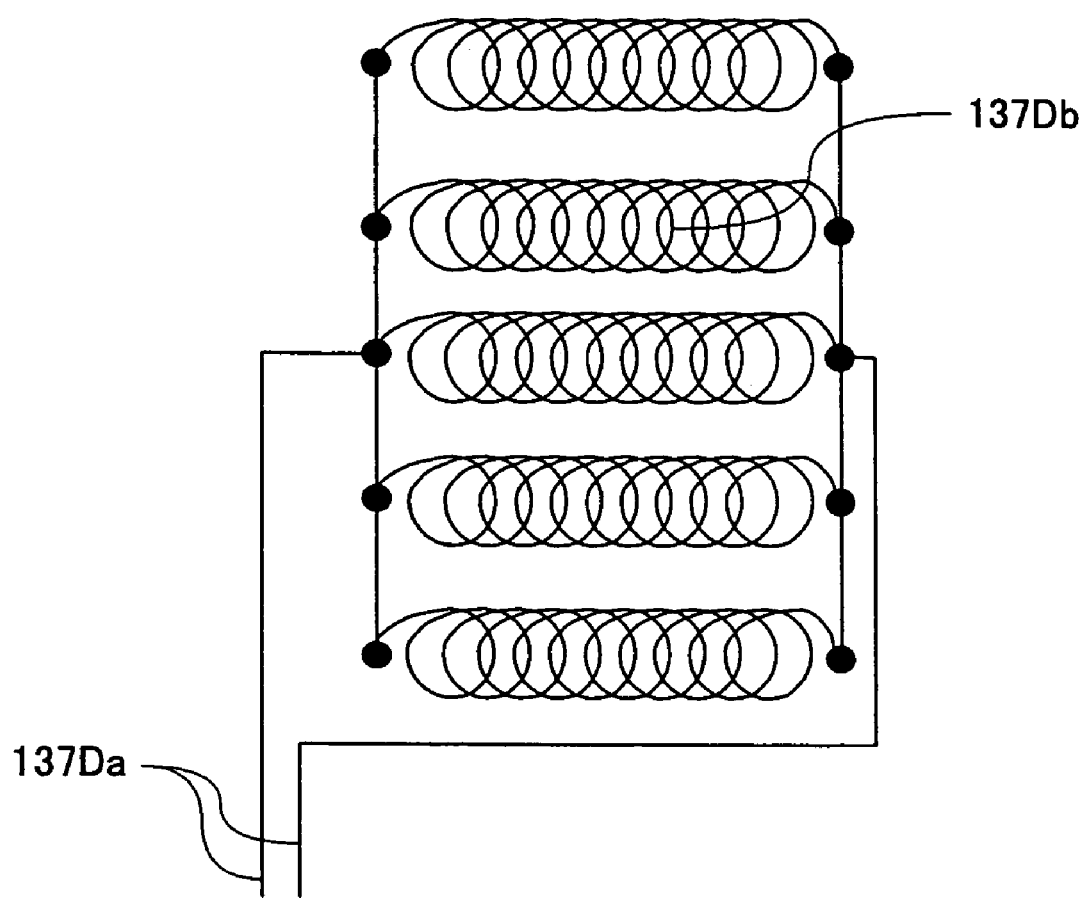
FIG. 44 is a circuit diagram of filament coils shown in FIG. 41.

FIG. 39 is a bottom plan view of the heating unit 140B provided in the heat treatment apparatus according to the third embodiment of the present invention. FIG. 40 is a cross-sectional view of the heating unit 140A shown in FIG. 39. FIG. 41 is an illustrative cross-sectional view of a lamp 130D provided in the heating unit 140B shown in FIG. 39. FIG. 42 is an illustrative bottom view of the lamp 130D shown in FIG. 41. FIG. 43 is an enlarged side view of a part of the lamp 130D shown in FIG. 41. FIG. 44 is a circuit diagram of a coil part 138D of a filament 137D shown in FIG. 41.

The heating unit 140B is provided with a plurality of lamps 130D that are supported by the lamp support part 142 so as to serve as a heat source for heating the object W to be processed.

Although the lamp 130 is a single-end type in the present embodiment, other energy source such as an electric wire heater may be used. Here, the single-end type refers to a kind of lamp which has a single electrode part 132D as shown in FIG. 41. Although the lamp 130D has the function to heat the object W to be processed and is a halogen lamp in the present embodiment, a lamp applicable to the heating unit 140B is not limited to a halogen lamp. Moreover, although an output of the lamp 130D is determined by the lamp driver 310, the lamp driver 310 is controlled by the control part 300 and supplies an electric power to the lamp 130D. As shown in FIG. 39, in the present embodiment, the lamps 130D are arranged so as to correspond to the almost circular object W to be processed.

Typically, the lamp 130D has a single electrode part 132D, a light-emitting part 134D, a filament 137D connected to the electrode part 132D and forming a luminescent part and a shield part 139D. It should be noted that the configuration of the light-emitting part 134D is not limited to a cylindrical shape, and other shape may be used.

The electrode part 132D has a pair of electrodes 133D and is connected with the lamp driver 310 electrically through the lamp support part 142. The electrodes 133D are electrically connected to the filament 137D. The electric power supplied to the electrode part 132D is determined by the lamp driver 310, and the lamp driver 310 is controlled by the control part 300. Similar to the first embodiment, the seal part 143c connects between the electrode part 132D and the lamp driver 310.

The light-emitting part 134D has a cylindrical shape and is connected airtight with the light-emitting part 134D. Nitrogen, argon or halogen gas is enclosed within the interior of the light-emitting part 134D. The light emitting part 134D includes a cylindrical side surface 134Da and a projecting surface 134Db facing the object W to be processed. It should be noted that the projecting surface 134Db is a flat surface, and is positioned so as to be parallel to the object W to be processed. The light-emitting part 134D accommodates the filament 137D and the shield part 139D.

With reference to FIG. 41 through FIG. 44, an end of the filament 137D is connected to one of the electrodes 133D of the electrode part 132D, and the other end is connected to the other electrode 133D. A middle part of the filament 137D forms a coil part in the lower part of the light-emitting-part 134D. The filament 137D is a cathode, which emits thermions (a light) by being electrically heated. In the present embodiment, the filament 137D is formed of a thin wire of tungsten. However, the filament 137D is not limited to tungsten, and may be formed of other materials.

Hereafter, a part of the filament 137D from the electrode 133 to the coil part is referred to as a first filament 137Da, and a part of the filament 137D, which forms the coil part, is referred to as a second filament 137Db. It should be noted that, unless it is stated especially, the filament 137D generically represents the first filament 137Da and the second filament 137Db. The first filament 137Da is a thin wire, and is extended almost linearly from the electrode 133 of the electrode part 132 to the second filament 137Db.

Figure 45:
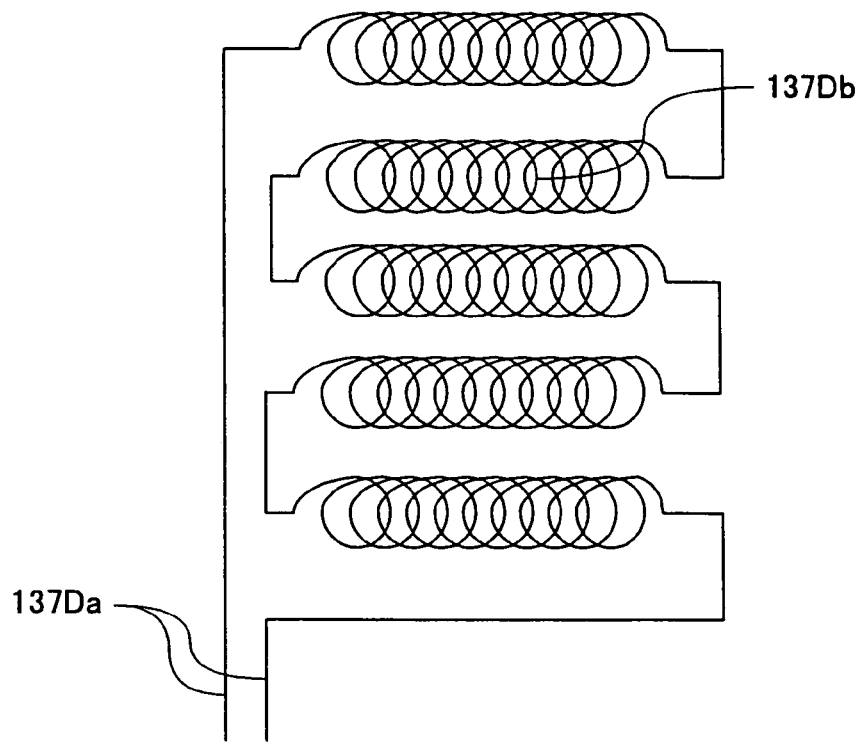
FIG. 45 is a circuit diagram of the filament coils in different arrangement.

On the other hand, the second filament 137Db is made of a thin wire, which forms the coil part. It should be noted that the coils which the second filament 137Db forms can be any configuration such as a single coil or a double coil, and the present invention does not limit a method of forming the coil. In the present embodiment, the wire forming the second filament 137Db is thinner than the wire forming the first filament 137Da. Furthermore, as shown in FIGS. 42 and 44, in the present embodiment, the second filament 137Db includes a plurality of coils connected parallel to each other. However, the arrangement of the coils is not limited to the parallel connection, and a plurality of coils may be connected in series as shown in FIG. 45. FIG. 45 is a schematic diagram showing series-connected coils of the filament 137D.

The plurality of coils form a plane 138D parallel to the projecting surface 134D. When viewing the lamp 130D from the object W to be processed side, an outer configuration of the plane 138D is a circle or a polygon. Although it is preferable that the plane 138D has a size substantially equal to the size of the projecting surface 134D, it is sufficient if the plane 138D can be regarded as a surface illuminant when the lamp 130D emits a light.

As mentioned above, since the second filament 137Db is thinner than the first filament 137Da, a resistance per unit length of the second filament 137Db is greater than that of the first filament 137Da. Similarly, the resistance of the second filament 137Db is greater than the first filament 137Da since the second filament 137Db forms a coil. When a voltage is supplied to the filament 137D from the electrode part 132D, an amount of heat generated in the second filament 137Db is larger than the first filament 137D. Therefore, the second filament 137Db emits a light earlier than the first filament 137Da. Moreover, an amount of heat generated by a unit length of the first filament 137Da is different from that of the second filament 137Db, and only the second filament can emits a light. Therefore, the above-mentioned structure of the first and second filaments 137Da and 137Db is capable of emitting a light with smaller power consumption than a structure in which the first filament 137Da and the second filament 137Db have the same thickness.

Furthermore, the second filament 137Db occupies a large area since the second filament 137Db is constituted by a plurality of coils. When the lamp 130D is seen from the projecting surface 134Db at the time of luminescence of lamp 130D, the lamp 130D can be regarded as a surface illuminant. Similarly, the heating unit 140*b* provided with the lamps 130D can also be regarded closer to a surface illuminant than a heating unit provided with conventional lamps. Therefore, the lamp 130D having the filament 137D and the heating unit 140B having the lamps 130D can increase the irradiation energy more than the conventional heat treatment apparatus.

Furthermore, as mentioned above, the plane 138 where a plurality of coils of the second filament 137Db are arranged is formed parallel to the object W to be processed. Thus, an axis of each of the coils is positioned parallel to the object W to be processed, and the light emitted from each coil travels in normal directions of the coil (a direction perpendicular to the axis of the coil). Therefore, at least a light projected from the side of the plane 138D, which faces the object W to be processed, is directly irradiated onto the object W to be processed.

Moreover, since a plurality of coils are present, the energy projected from the light is increased due to a light emitted by one coil overlapping with a light emitted by adjacent coils, which also provides a sufficient directivity to the light projected from the plane 138D. Therefore, when using the lamp 130D having the filament 137D, reflective means such as a reflector for obtaining the directivity is not needed. There is no multiple reflection by reflector in the lamp 130D, and there is no reflection loss. Therefore, the light from the lamp 130D is irradiated onto the object W to be processed while maintaining a high energy.

Figure 46:
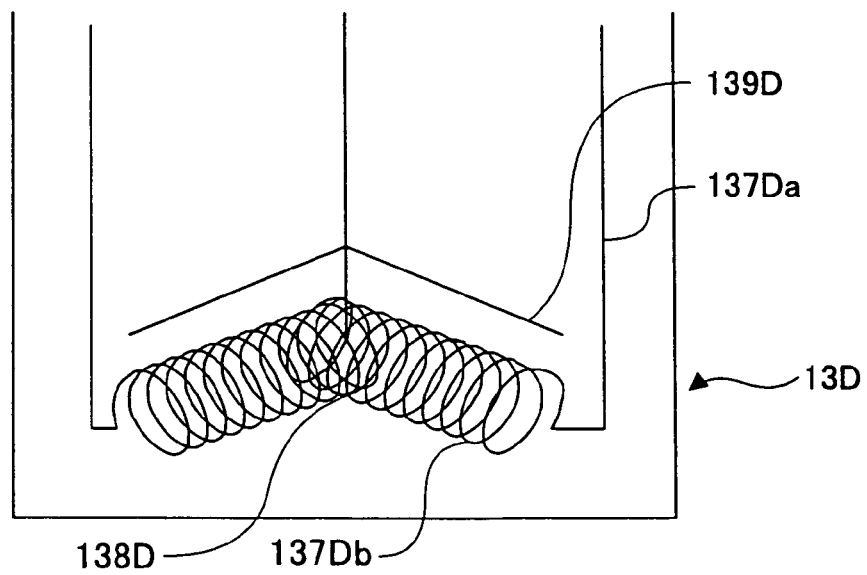
FIG. 46 is an illustration of a variation of the filament coils shown in FIG. 43.

It should be noted that although the directivity of the lamp 130D is related to a side facing the object to be processed via the plane 138D, such a light is shielded by the shield part 139D mentioned later. It should be noted that the plane 138D may have a curve configuration like a convex protruding in a direction away from the projection surface 134Db of the light-emitting part 134Db. FIG. 46 is an illustrative cross-sectional view of the plane 138D of the lamp 130D shown in FIG. 40 and a part in the vicinity of the plane 138D. This configuration of the plane 138D has an action to converge the light projected from the plane 138D. Therefore, the directivity of the lamp 130D having the plane 138D shown in FIG. 46 is improved.

The shield part 139D has almost the same configuration as the plane formed by the second filament 137Db. The shield part 139D is provided on the side opposite to the projection surface 134Db of the light-emitting part 134D via the second filament 137Db. The shield part 139D is located to overlap with the plane 138 with a gap of several millimeters, for example, 3 mm to 5 mm. It should be noted that any known method may be used to separately locate the shield part 139D.

The shield part 139D may be fixed to a rod-like member non-electrically connected to the electrode part 132D so that the position of the shield part 139D is fixed by the rod-like member. The shield part 139D has a function to shield a light projected from the filament 137Db in a direction opposite to the projection surface 134Db. According to such as shielding function, the lamp 130D can provide the following actions and effects.

The shield part 139 is heated by the light emitted by the second filament 137Db. Thereby, the shield part 139D it self has a radiation action. According to such a radiation action, the heat-radiation light projected from the shield part 139D further heats the second filament 137Db. Therefore, such heat may cause luminescence energy of the second filament 137Db. That is, the light projected in the direction opposite to the projection surface 134Da of the light-emitting part 134D via the plane 138D is converted into a light-emitting energy of the second filament 137Db. Therefore, by providing the shield part 139D, the heat-radiation light projected from the second filament 137Db can be efficiently used. It should be noted that the shield part 139D according to the present embodiment is formed of the same material as the filament 137, i.e., tungsten. However, any material can be used for the shield part 139D if it has the same action as mentioned above.

The above-mentioned action is obtained by making the diameter of the second filament 137Db smaller than the diameter of the first filament 137Da and forming the plane 138D by a plurality of coils. When a heat treatment is carried out using the lamp 130D according to the present embodiment, an irradiation efficiency to the object W to be processed can be improved and a rapid temperature rise can be achieved at a low power consumption. Moreover, the lamp 130D can heat the object W to be processed more uniformly than the conventional lamp. That is, a high-quality processed object can be provided by applying a heat treatment using the lamp 130. Moreover, since the heating unit 140B does not need the reflective means for obtaining directivity, such as a reflector, a number of pats of the heat treatment apparatus according to the present embodiment can be reduced.

Figure 47:
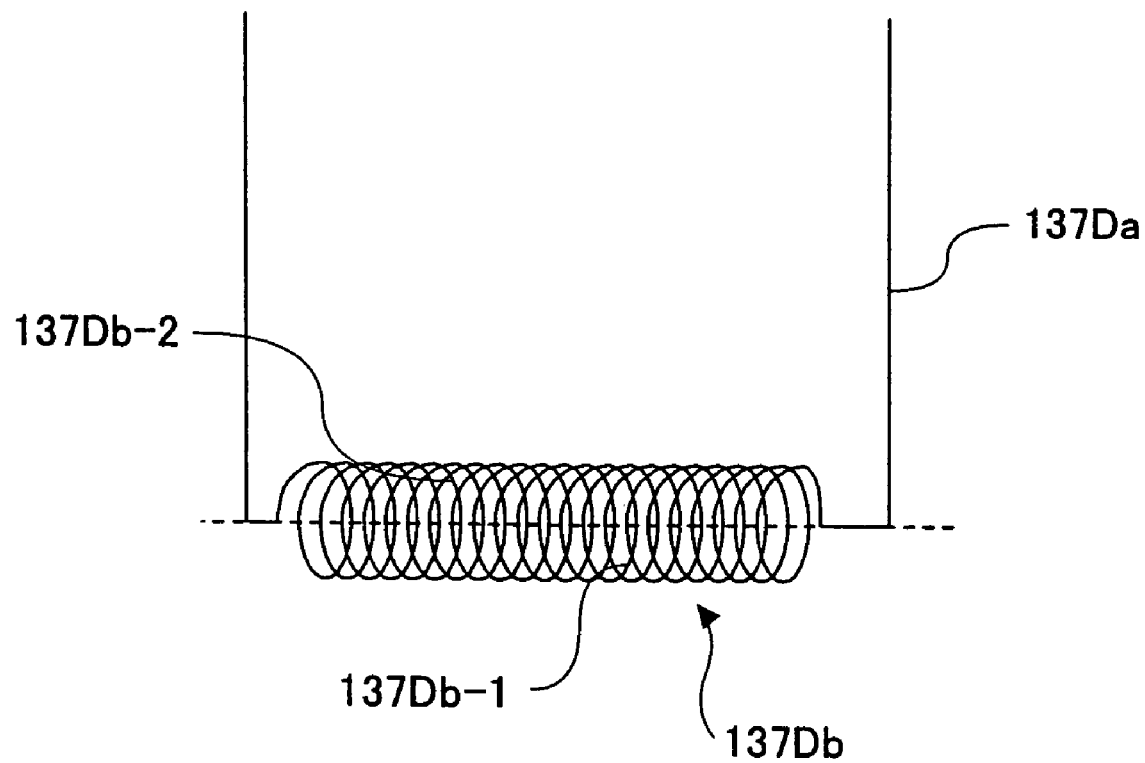
FIG. 47 is an illustration of another variation of the filament coils shown in FIG. 43.

A description will now be given, with reference to FIG. 47, of a variation of the lamp 130D according to the present embodiment. FIG. 47 is an enlarged cross-sectional view of a part of a lamp, which is a variation of the lamp 130D shown in FIG. 41.

The lamp shown in FIG. 47 has basically the same structure as the above-mentioned lamp 130 except for the plane 138D. Bordering on a dotted line (corresponding to the plane 138D) shown in FIG. 47, a part of the filament 137Db on the side which faces the projection surface 134Db is referred to as a first part 137Db-1, and a part of the filament 137Db on the side which faces the shield 139D is referred to as a second part 137Db-2. In this case, the first part 137Db-1 is formed so as to have a smaller work function than the second part 137Db-2. Here, the work function represents the minimum energy for taking out electrons from inside of a solid in a vacuum through a surface. That is, in the lamp shown in FIG. 47, the first part 137Db-1 emits a light easier than the second partial 137Db-2.

More specifically, when the filament 137 is made of a thin wire of tungsten, such a structure can be achieved by covering the first part 137Db-1 by a thorium film. The work function of tungsten is 4.52 eV and the work function of thorium is 2.6 eV. Accordingly, when a voltage is applied to the filament 137, only the first part 137Db-1, which is covered by the thorium film having a low work function, can emit a light. Therefore, the supplied energy contributes only to luminescence of the first part 137Db-1. Thus, 100% of supplied energy can be projected only from the first part 137Db-1 as luminescence energy. Therefore, it becomes possible to irradiate the high-energy light onto the object W to be processed as compared with the conventional lamp. Consequently, since the irradiation efficiency to the object W to be processed can be improved when a heat treatment is carried out with the lamp shown in FIG. 47, a rapid temperature rise can be attained with a low power consumption. Moreover, it becomes possible to provide an object, which was subjected to a high-quality process.

In the present embodiment, although thorium is coated on the first part 137Db-1, the present invention is not limited to the thorium coating. For example, an oxide film of, for example, barium (Ba), strontium (Sr) or calcium (Ca) may be provided on the first part. Here, the work functions of barium oxide (BaO), strontium oxide (SrO) and calcium oxide (CaO) are 1.6 eV, 1.25 eV and 1.6 eV, respectively. Such an oxide film has a lower work function than that of tungsten, and an effect the same as the effect of the thorium film can be provided. Moreover, when applying such an oxide film, the filament 137D may be formed of platinum, connel alloy, nickel, etc. Namely, the lamp 130D of the present embodiment is not limited to the above-mentioned structure, and may be structured so that the work function of the first part 137Db-1 of the filament 137D is lower than that of the second part 137Db-2. Therefore, the lamp 130D of the present embodiment is not limited to these members, but any structure ma be applicable.

With reference to FIGS. 39 and 40, the lamp support part 140B has a generally rectangular parallelepiped configuration, and has a plurality of cylindrical grooves 143 each of which accommodates the lamp 130D and separation wall 148 between the grooves 143.

Each of the grooves 143 comprises a part 143a, which accommodates the electrode part 132D of the lamp 130D, and a part 143b, which accommodates the light-emitting part 134D. The part 143a connects the electrode part 132D to the lamp driver 310, and serves to provide a seal between the electrode part 132D and the lamp driver 310. The part 143b has a diameter greater than a diameter of the part 143a.

As shown in FIG. 39 the isolation wall 148 is arranged between the adjacent grooves 143 which are arranged along a plurality lines extending in a direction indicated by X in FIG. 39. Within the isolation wall 148, a pair of cooling pipes 149a and 149b are arranged in the direction of X. It should be noted that the cooling pipe 149 generically represents the cooling pipes 149a and 149b. More specifically, the cooling pipe 149a is located in the vicinity of the electrode part 132D of the lamp 130D, and the cooling pipe 149b is located in a position corresponding to the light-emitting part 134D of the lamp 130D.

The cooling pipe 149 is connected to the temperature-control device which is not shown in the figure. The temperature-control device comprises the control part 300, a temperature sensor or thermometer and a heater. A cooling water is supplied to the temperature-control device from a water source such as a water line. Instead of the cooling water, other coolants such as alcohol, gurden, chlorofluorocarbon, etc. may be used. As for the temperature sensor, a well-known sensor such as, for example, a PTC thermistor, an infrared sensor or a thermocouple may be used. A temperature sensor or thermometer measures a temperature of the inner wall of the electrode part 132D and the light-emitting part 134D of the lamp 130D. A heater is constituted by a wire heater wound on an outer surface of the cooling pipe 116. By controlling the magnitude of the current, which flows through the wire heater, the temperature of the water flowing through the cooling pipe 149 can be adjusted.

When the electrodes 133D are made of molybdenum, in order to prevent destruction of the electrodes 133D and the seal part 143c due to oxidization of molybdenum, the cooling pipe 149a maintains the temperature of the seal part 143c at 350° C. or less. Moreover, the cooling pipe 149b maintains the temperature of the light-emitting part 134D at 250° C. to 900° C. so that the light-emitting part 134D maintains a halogen cycle. In the halogen cycle, the tungsten which constitutes the filament 137D evaporates and reacts with halogen gas, a tungsten-halogen compound is generated which floats inside the lamp 130D. When the lamp 130D is maintained at 250° C. to 900° C., the tungsten-halogen compound maintains the floating state.

However, when the tungsten-halogen compound is carried to the vicinity of the filament 137D by convection, the tungsten-halogen compound is decomposed into tungsten and halogen gas due to the high-temperature of the filament 137D. Then, the tungsten is deposited on the filament 137D and the halogen gas repeats the same reaction. It should be noted that, generally, if the temperature exceeds 900° C., devitrification (a phenomenon in which the light-emitting part 134D becomes white) may occur. On the other hand, if the temperature is below 250° C., blackening (phenomenon in which the tungsten-halogen compound adheres to the wall of the lamp 130, and becomes black) may occur.

In the present embodiment, the cooling pipe 149a is maintained at a temperature within the range of halogen cycle and which can prevent oxidization of molybdenum. Such a temperature preferably ranges from 250° C. to 350° C. Additionally, the cooling pipe 149b is maintained at a temperature within the range of halogen cycle, preferably at a temperature ranging from 800° C. to 900° C. Although the cooling temperature for the light-emitting part 134D can be in the range of 250° C. to 900° C., when the cooling efficiency is taken into consideration, the cooling temperature is preferably set to an upper limit temperature of the halogen cycle since cooling can be carried out with a less electric power.

The cooling pipe 149a is at the common temperature for halogen cycle and oxidization-prevention of molybdenum, and the light-emitting part 134D is maintained by the cooling pipe 149b within the halogen cycle temperature range. Moreover, a temperature slope arises in the lamp 130D due to the separate cooling pipes 149a and 149b in accordance with the length of the light-emitting part 134D of the lamp 130D. The temperature slope (250° C. to 950° C.)

maintains the entire lamp 130 within the halogen cycle temperature range. That is, although there is a possibility that the temperature (800° C. or 950° C.) of the light-emitting part 136 may influence the temperature (250° C. to 350° C.) of the seal part 143c if the light-emitting part 134D and the seal part 143c are close to each other, such a problem is solved by providing the light-emitting part 134 in the lamp 130D according to the present embodiment.

According to the present embodiment, devitrification and blackening of the lamp 130D can be suppressed. Moreover, the electrode part 132D and the seal part 143c are prevented form being damaged due to oxidization of the molybdenum of the electrodes 133D. Furthermore, the lamp 130D is cooled so as to be at a temperature within the halogen cycle temperature range. A conventional cooling system of the lamp 130D merely cools the seal part 143c, and the cooling in accordance with the halogen cycle is not carried out. Therefore, the cooling pipe 149 according the present invention has an advantage of elongating the service life of the lamp 130D. It should be noted that the contact area between the groove 30, 143 and the lamp 130D is larger than that of the conventional structure as mentioned above, and it is possible to acquire a sufficient cooling effect.

It should be noted that instead of providing the isolation wall 148 between parts corresponding to the light-emitting parts 134D of the lamps 130D, the space provided with the isolation wall 148 may be empty so as to carry out air cooling for the light-emitting part 134D. The seal part 143c shall be cooled by the above-mentioned cooling pipe 149a. Since the light-emitting part 136 is to be cooled at a relatively high temperature of 800° C. to 900° C., the light-emitting part 134D can be cooled by air cooling so as to obtain the same action and effect as mentioned above. The air cooling may be carried out by a known cooling system such as a blower, which carries out forced air cooling. Furthermore, another cooling method in which a common cooling pipe is provided so as to cool both the isolation wall 148 and the light-emitting part 134D may be used. In such a method, the cooling pipe may be cooled at a temperature of 250° C. to 350° C., which is a temperature common to both the oxidization prevention of molybdenum and the halogen cycle range. Even with the above-mentioned structure, the same effect as the above-mentioned cooling pipe 149 can be acquired.

A description will now be given of the radiation thermometer 200. The radiation thermometer 200 is provided on the opposite side of the lamp 130D with respect to the object W to be processed. Although the present invention does not exclude a structure in which the radiation thermometer 200 is provided on the same side with the lamp 130D, it is preferable that a light from the lamp 130D is prevented from being incident on the radiation thermometer 200.

The radiation thermometer 200 is attached to a bottom part 114 of the process chamber 110. A surface of the bottom part 114 that faces inside the process chamber 110 serves as a reflective plate (high-reflectance surface) by being provided with gold plating. This is for the reason that is the surface of the bottom part 114 is a low-reflectance surface such as a black surface, the surface absorbs the heat emitted from the object W to be processed, which uneconomically requires an increase in the irradiation output of the lamp 130D. The bottom part 114 has a cylindrical through hole 115. The radiation thermometer 200 comprises a quartz or sapphire rod, a casing, a chopper or sector, a motor, a lens, an optical fiber and a radiation detector.

The rod according to the present embodiment is made of quartz or sapphire. Sapphire or Quartz is used because of its good heat resistance and good optical characteristic as described later. However, the rod is not limited to the sapphire or quartz. Since the rod has a good heat resistance, there is no need to provide a cooling arrangement to cool the rod, which contributes miniaturization of the apparatus.

The rod can contain the heat radiation light incident thereon, and guides the heat radiation light to the casing with less attenuation. Accordingly, the rod has a superior light gathering efficiency. Additionally, the rod 210 enables a multiple reflection of the radiation light between a high-reflectance surface of the chopper and the target object W. The temperature of the target object W can be accurately measured by positioning the rod close to the object W to be processed.

The rod enables separation of the casing from the object W to be processed. Thus, the rod can omit a cooling arrangement to cool the casing, and contributes to miniaturization of the heat treatment apparatus. If the cooling arrangement to cool the casing is provided, the rod can minimize a power supplied to the cooling arrangement of the rod.

The rod according to the present embodiment can be made of quartz or sapphire with a multi-core optical fiber. In such a case, the multi-core optical fiber is provided between the quartz or sapphire rod and the chopper. Thereby, the rod is provided with flexibility, which increases a freedom in positioning the radiation thermometer 200. Additionally, since a main body or the casing 220 of the radiation thermometer 200 can be separated from the object W to be processed, each part of the radiation thermometer 200 is prevented from being deformed sue to influence of the temperature of the object W to be processed, thereby maintaining an accurate measurement of the temperature of the object W to be processed.

The casing has a substantially cylindrical shape, and is provided on the bottom part 114 so as to cover the through hole 115.

The chopper has a disk-like shape, and is positioned vertically so that a part of the chopper 230 is positioned under the through hole within the casing. The chopper is connected to a rotation axis of the motor at the center thereof so as to be rotated by the motor. The surface of the chopper is divided into four equal parts including two high-reflectance surfaces and two low-reflectance surfaces. The surfaces are alternatively arranged, and each of the surfaces has a slit. The high-reflectance surfaces are formed, for example, by aluminum or gold plating. The low-reflectance surfaces are formed, for example, by black painting. Each of the high-reflectance surfaces has a measurement area corresponding to the slit and a measurement area other than the slit. Similarly, each of the low-reflectance surfaces has a measurement area corresponding to the slit and a measurement area 234b other than the slit.

For example, the chopper may have a semicircular high-reflectance surface with the slit. Alternatively, the chopper may be divided into four or six equal parts with the high-reflectance surface with the slits and notch portions arranged alternately. The slit may be provided only to the high-reflectance surfaces.

When the chopper is rotated by the motor, the high-reflectance surface and the low-reflectance surface alternately appear under the rod. When the high-reflectance surface is positioned under the rod, a large par of the light propagated through the rod is reflected by the high-reflectance surface, and propagates again through the rod and projected onto the object W to be processed. On the other hand, when the low-reflectance surface is positioned under the rod, a large part of the light propagates through the rod is absorbed by the low-reflectance surface. Thus, a very small amount of light is reflected by the low-reflectance surface. The slits guide the radiation light from the object W to be processed or multi-reflected light to the detector.

The detector comprises an image forming lens (not shown in the figure), Si-photocell and amplification circuit. The radiation light incident on the image forming lens is supplied to the control unit 300 after converting into an electric signal representing radiation intensities $E_1(T)$ and $E_2(T)$ as described later. The control unit 300 has a CPU and a memory so as to calculate the emissivity $\epsilon$ and the temperature T of the target object W in accordance with the radiation intensities $E_1(T)$ and $E_2(T)$. It should be noted that the calculation can be performed by an arithmetic unit (not shown in the figure) of the radiation thermometer 200.

More specifically, the light passed through the slit is gathered by the lens, and is transmitted to the detector by the optical fiber. The radiation intensities at the high-reflectance surface and the low-reflectance surface are represented by the following equations (5) and (6), respectively.

$$E_1(T) = \epsilon E_{BB}(T)/[1-R(1-\epsilon)] \quad (5)$$

Where, $E_1(T)$ is a radiation intensity of the high-reflectance surface at the temperature T obtained by the detector; R is an effective reflectance of the high-reflectance surface; $\epsilon$ is a reflectance of the object W to be processed; and $E_{BB}(T)$ is a radiation intensity of a black body at the temperature T. The equation (5) is obtained by the following equation (6). It is assumed that the object W to be processed had no heat radiation.

$$E_1(T) = \epsilon E_{BB}(T) + \epsilon R(1-\epsilon) E_{BB}(T) + \epsilon [R(1-\epsilon)]2 + \ldots$$
$$\infty = E_{BB}(T)/[1-R(1-\epsilon)] \quad (6)$$

$$E_2(T) = \epsilon E_{BB}(T) \quad (7)$$

Where, $E_2(T)$ is a radiation intensity of the low-reflectance surface at the temperature T obtained by the detector. The equation (7) is obtained from the prank Planck's law. The emissivity $\epsilon$ is represented by the following equation (8).

$$\epsilon = [E_2(T)/E_1(T) + R - 1]/R \quad (8)$$

Generally, spectral concentration of a radiant emittance of an electromagnetic wave radiated by a black body can be given by the prank Planck's law. When the radiation thermometer 200 measures a temperature of a black body, the relationship between the temperature T of the black body and the radiation intensity $E_{BB}(T)$ can be represented by the following equation (9) and (10) by using constants A, B and C which are determined by an optical system of the radiation thermometer 200.

$$E_{BB}(T) = C \exp[-C_2/(AT+B)] \quad (9)$$

$$T = C_2/A [\ln C - \ln E_{BB}(T)] - B/A \quad (10)$$

Where, $C_2$ is a second constant of radiation.

The detector or the control unit 300 can obtain the radiation intensity $E_{BB}(T)$, and thereby the temperature T can be obtained by entering the radiation intensity $E_{BB}(T)$ in the equation (7). Thus, the control unit 300 can obtain the temperature T of the object W to be processed.

The operation of the entire heat treatment apparatus according to the present embodiment is the same as the heat treatment apparatuses according the above-mentioned first and second embodiments, and descriptions thereof will be omitted.

The present invention is not limited to the specifically disclosed embodiments, and variations and modifications may be made without departing from the scope of the present invention.

The present application is base on Japanese priority applications No. 2001-08266 filed on Mar. 2, 2001, No. 2001-059296 filed on Mar. 2, 2001, No. 2001-071548 filed on Mar. 14, 2001 and No. 2001-072317 filed on Mar. 14, 2001, the entire contents of which are hereby incorporated by reference.

What is claimed is:

1. A lamp applicable to a heat source for heating an object to be processed, the lamp comprising:
   an electrode part to which an electric power is supplied;
   a pair of first filaments connected to said electrode part; and
   a second filament connected to said first filaments and having a diameter smaller than a diameter of each of said first filaments,
   wherein said second filament is configured and arranged to serve as a surface illuminant with respect to the object to be processed, and
   wherein said surface illuminant has a convex shape protruding in a direction away from the object to be processed.

2. A lamp applicable to a heat source for heating an object to be processed, the lamp comprising:
   an electrode part to which an electric power is supplied;
   a pair of first filaments connected to said electrode part;
   a second filament connected to said first filaments and having a diameter smaller than a diameter of each of said first filaments; and
   a shield part that reflects a light emitted by said second filament, the shield part being located on a side opposite to the object to be processed with respect to said second filament,
   wherein said second filament is configured and arranged to serve as a surface illuminant with respect to the object to be processed.

3. The lamp as claimed in claim 2, wherein said surface illuminant is parallel to the object to be processed.

4. The lamp as claimed in claim 2, wherein said surface illuminant has a polygonal shape or a circular shape when viewed from the object to be processed.

5. A lamp applicable to a heat source for heating an object to be processed, the lamp comprising:
   an electrode part to which an electric power is supplied;
   a pair of first filaments connected to said electrode part; and
   a second filament connected to said first filaments and having a diameter smaller than a diameter of each of said first filaments,
   wherein said second filament is configured and arranged to serve as a surface illuminant with respect to the object to be processed, and
   wherein said second filament includes a first part facing the object to be processed and a second part farther from the object to be processed than said first part, and said first part has a work function lower than a work function of said second part.

6. The lamp as claimed in claim 5, wherein said first part has a cover film formed on a material the same as a material of said second part, the cover film made of a material having a work function lower than a work function of the material of said second part.

7. The lamp as claimed in claim 6, wherein said second part is made of tungsten, and said cover film is made of thorium.

8. The lamp as claimed in claim 6, wherein said second part is made of a material selected from a group consisting of platinum, connel alloy, tungsten and nickel, and said cover film is made of a material selected from a group consisting of barium oxide, strontium oxide and calcium oxide.

9. A heat treatment apparatus for applying a heat treatment to an object to be processed, the heat treatment apparatus comprising:
   a support member on which the object to be processed is placed; and
   a plurality of lamps located above said support member for heating the object to be processed, each of said lamps comprising:
   an electrode part to which an electric power is supplied;
   a pair of first filaments connected to said electrode part;
   a second filament connected to said first filaments and having a diameter smaller than a diameter of each of said first; and
   a shield part that reflects a light emitted by said second filament, the shield part being located on a side opposite to the object to be processed with respect to said second filament,
   wherein said second filament is configured and arranged to serve as a surface illuminant with respect to the object to be processed.

* * * * *

UNITED STATES PATENT AND TRADEMARK OFFICE
CERTIFICATE OF CORRECTION

PATENT NO. : 7,323,661 B2 Page 1 of 1
APPLICATION NO. : 11/313759
DATED : January 29, 2008
INVENTOR(S) : Masahiro Shimizu It is certified that error appears in the above-identified patent and that said Letters Patent is hereby corrected as shown below:

In claim 9, column 56, line 5, "first; and" should read --first filaments; and--.

Signed and Sealed this

Tenth Day of June, 2008

JON W. DUDAS
*Director of the United States Patent and Trademark Office*